United States Patent
Yanagidaira et al.

(10) Patent No.: US 11,527,284 B2
(45) Date of Patent: Dec. 13, 2022

(54) SEMICONDUCTOR MEMORY DEVICE

(71) Applicant: Kioxia Corporation, Tokyo (JP)

(72) Inventors: Kosuke Yanagidaira, Fujisawa (JP);
Hiroshi Tsubouchi, Yokohama (JP);
Takeshi Hioka, Machida (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/198,375

(22) Filed: Mar. 11, 2021

(65) Prior Publication Data
US 2021/0335418 A1 Oct. 28, 2021

(30) Foreign Application Priority Data
Apr. 28, 2020 (JP) .............................. JP2020-079421

(51) Int. Cl.
| | |
|---|---|
| *G11C 11/00* | (2006.01) |
| *G11C 11/56* | (2006.01) |
| *G11C 16/04* | (2006.01) |
| *G11C 16/26* | (2006.01) |
| *G11C 16/08* | (2006.01) |
| *H01L 27/11582* | (2017.01) |
| *H01L 27/11556* | (2017.01) |

(52) U.S. Cl.
CPC ...... *G11C 11/5642* (2013.01); *G11C 11/5671* (2013.01); *G11C 16/0483* (2013.01); *G11C 16/08* (2013.01); *G11C 16/26* (2013.01); *H01L 27/11556* (2013.01); *H01L 27/11582* (2013.01)

(58) Field of Classification Search
CPC . G11C 16/0483; G11C 16/10; G11C 16/3459; G11C 11/5628; G11C 16/3418; G11C 16/3427; G11C 2211/5622; G11C 11/5642; G11C 2211/5621; G11C 16/26; G11C 11/5671; G11C 16/04; G11C 16/24; G11C 11/5635; G11C 16/0433; G11C 16/12; G11C 16/0466; G11C 16/08; G11C 16/3454; G11C 2211/565; G11C 16/02; G11C 16/34
USPC .... 365/185.02, 185.03, 185.19, 184, 185.05, 365/185.17, 185.18, 185.28
See application file for complete search history.

(56) References Cited

U.S. PATENT DOCUMENTS 10,049,760 B2 * 8/2018 Shiino .................... G11C 16/10
10,515,703 B2 12/2019 Yanagidaira
(Continued)

FOREIGN PATENT DOCUMENTS

| JP | 2019-053797 A | 4/2019 |
|---|---|---|
| JP | 2020-04466 A | 1/2020 |

*Primary Examiner* — Thong Q Le
(74) *Attorney, Agent, or Firm* — Oblon, McClelland, Maier & Neustadt, L.L.P.

(57) ABSTRACT

According to one embodiment, a semiconductor memory device includes a memory cell, a word line, a bit line, a first transistor, a second transistor and a driver. The word line is electrically coupled to a gate of the memory cell. The bit line is electrically coupled to one end of the memory cell. The first transistor includes a first gate electrically coupled to the bit line. The second transistor is coupled to a first end of the first transistor. The driver is configured to apply a voltage to the first gate of the first transistor. In a read operation, the driver varies a voltage to be applied to the first gate of the first transistor based on a read voltage applied to the word line.

23 Claims, 25 Drawing Sheets

(56) References Cited

U.S. PATENT DOCUMENTS

2018/0068739 A1\* 3/2018 Shiino .................... G11C 16/10
2019/0392905 A1 12/2019 Hioka et al.

\* cited by examiner

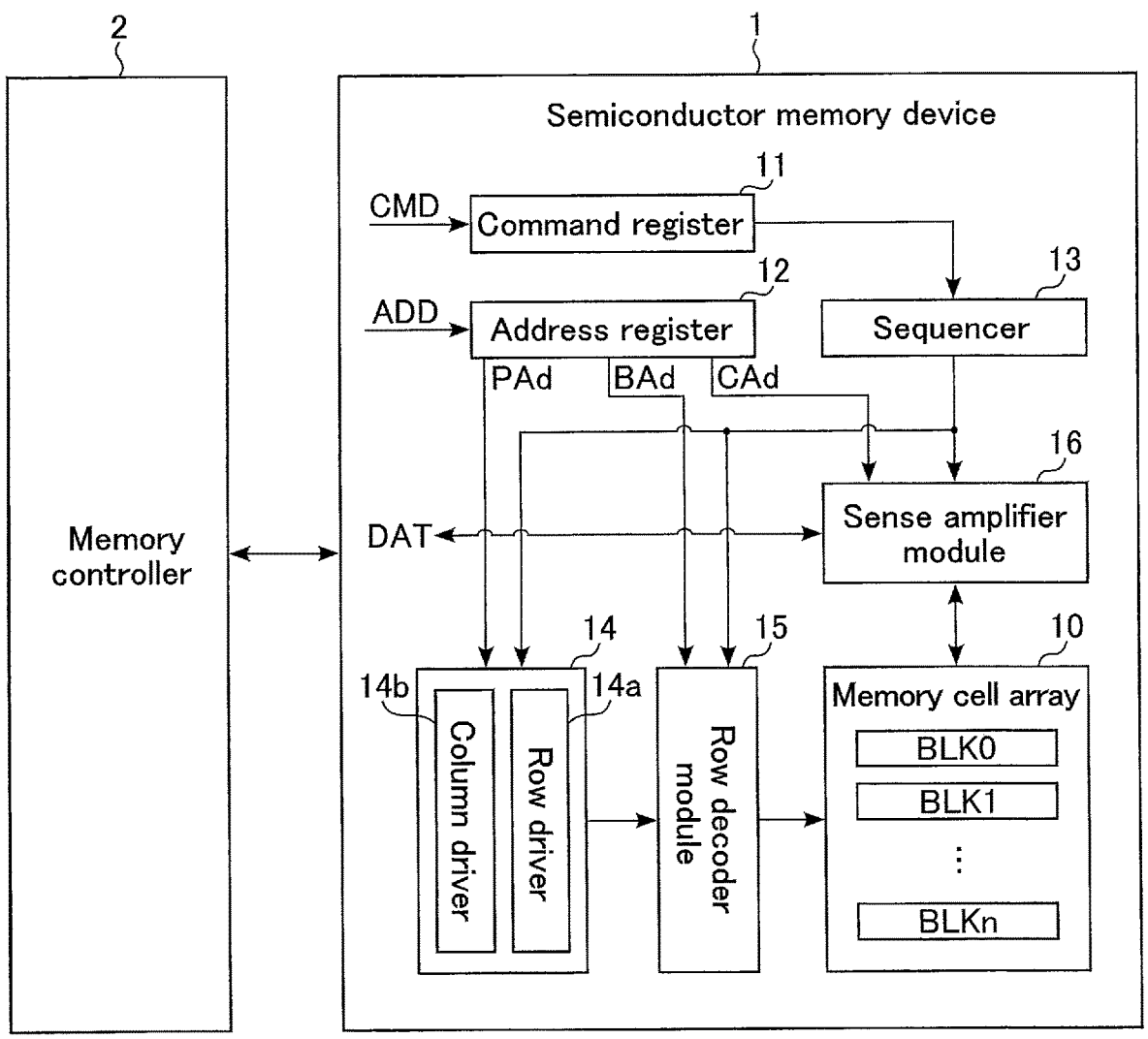
F I G. 1

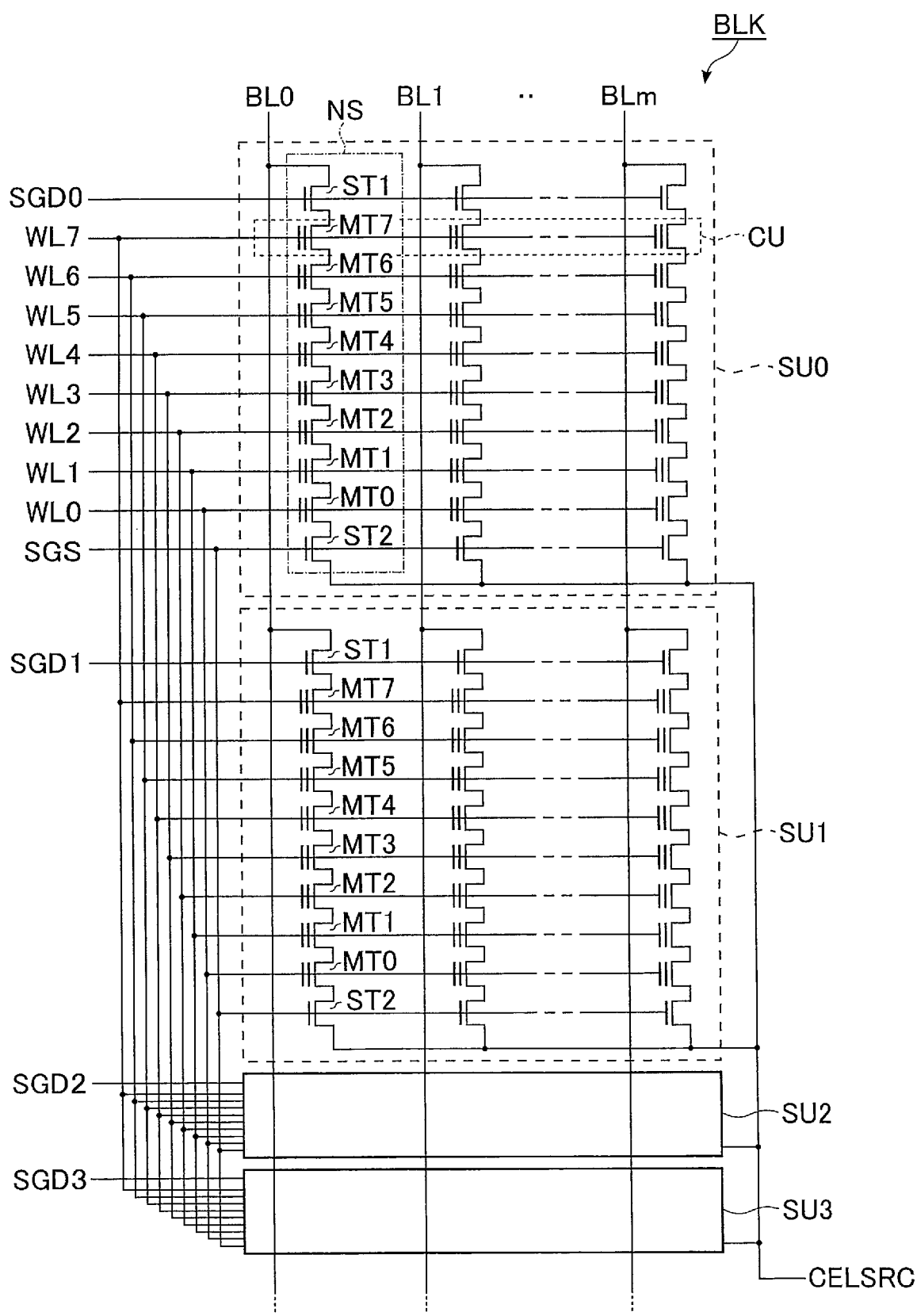
F I G. 2

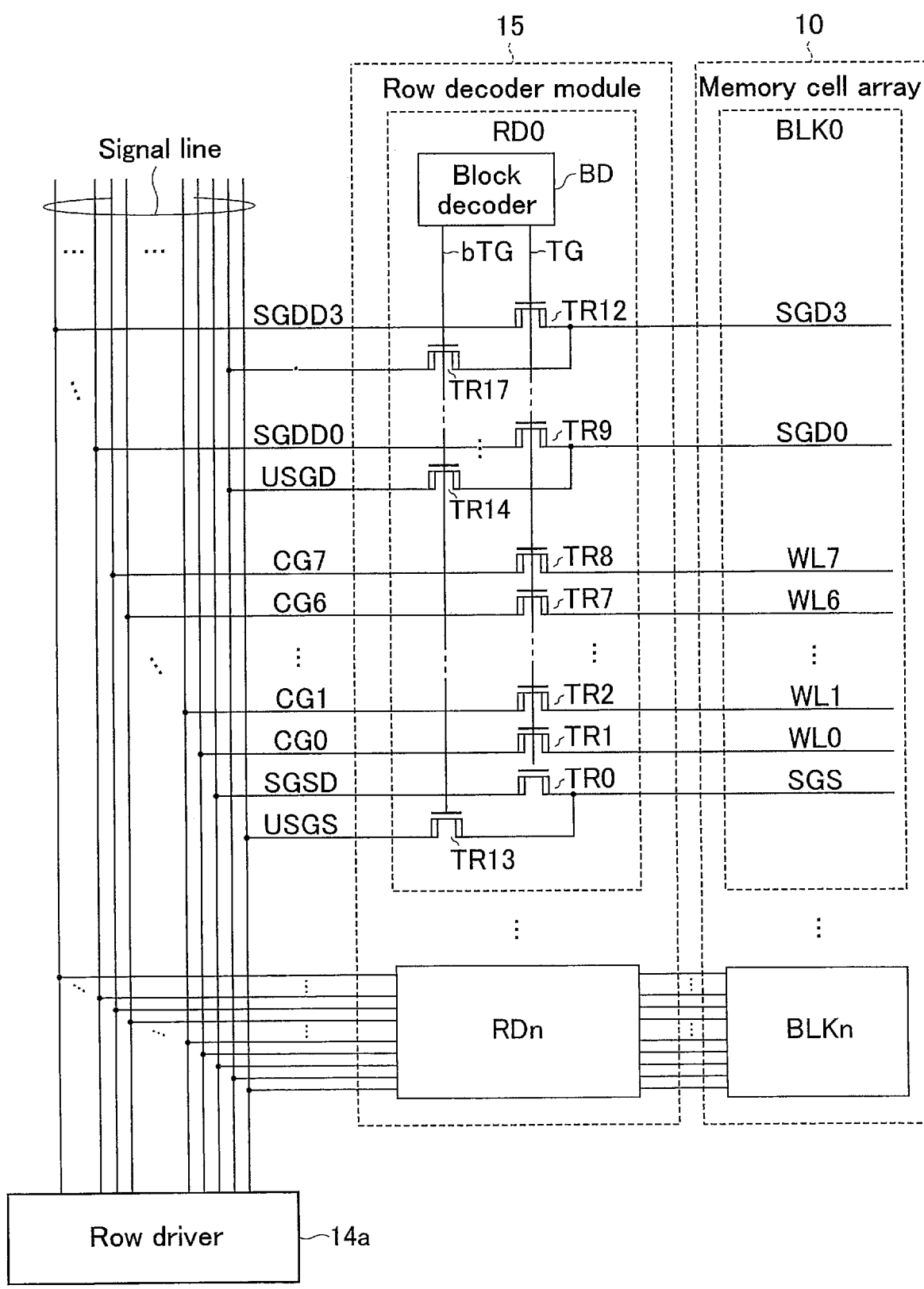
F I G. 3

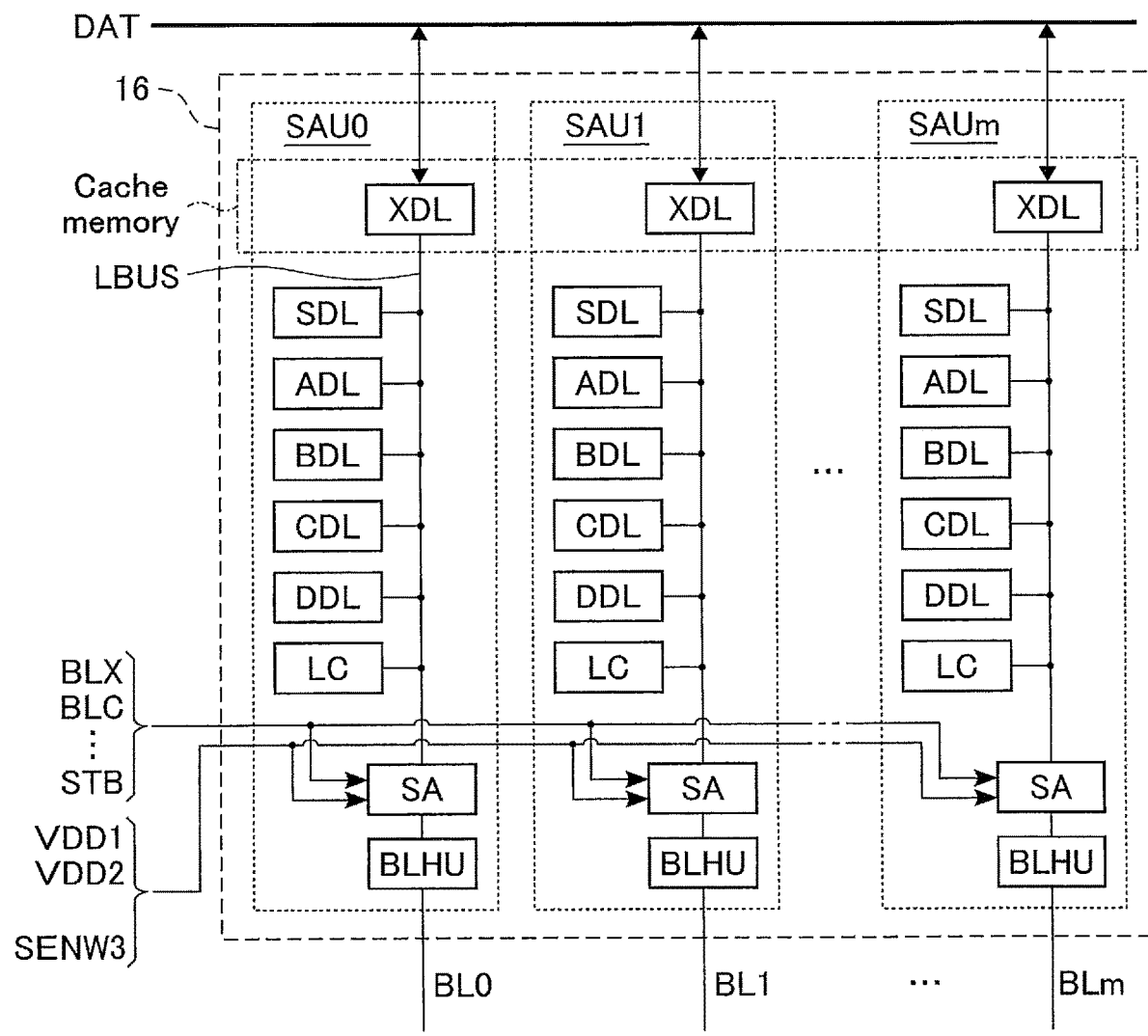
F I G. 4

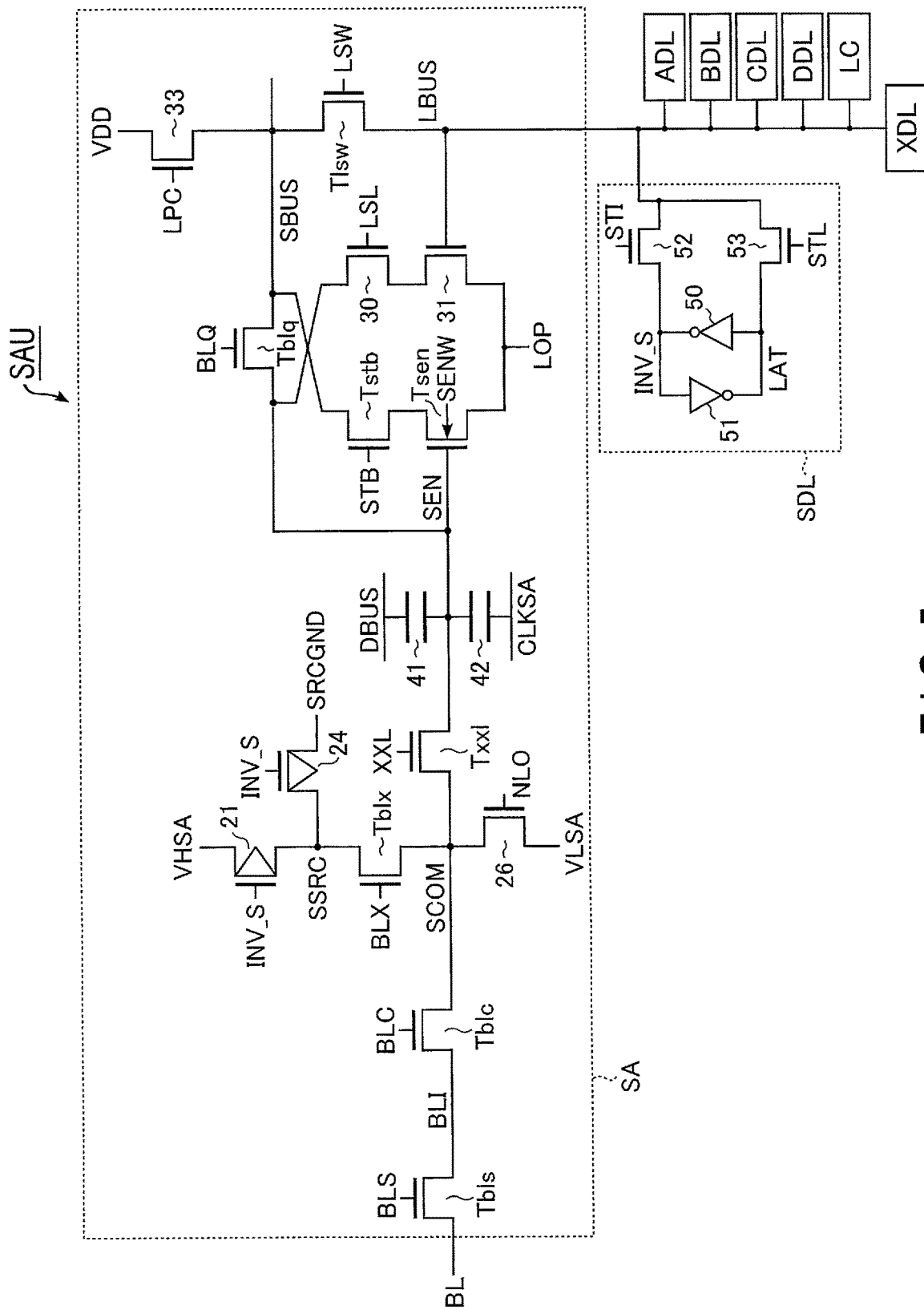
F I G. 5

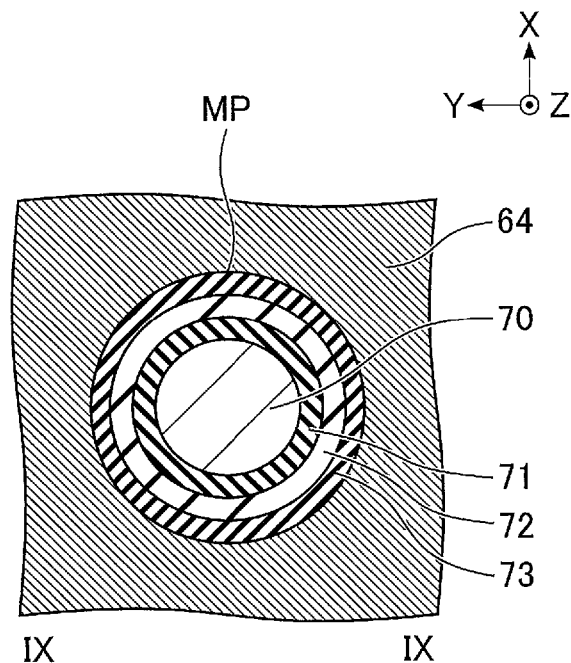
F I G. 9
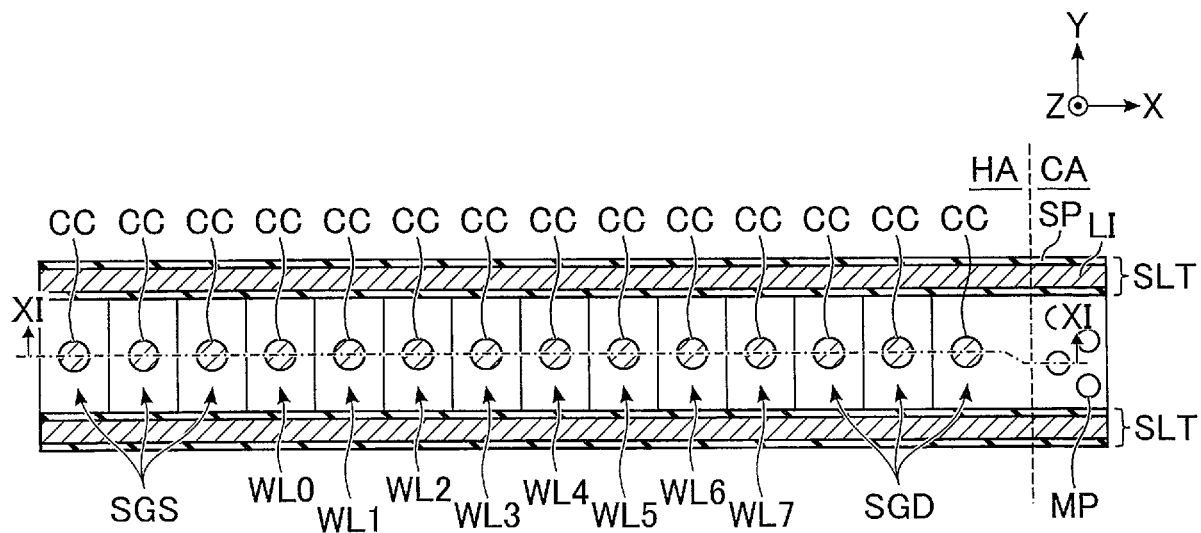
F I G. 10

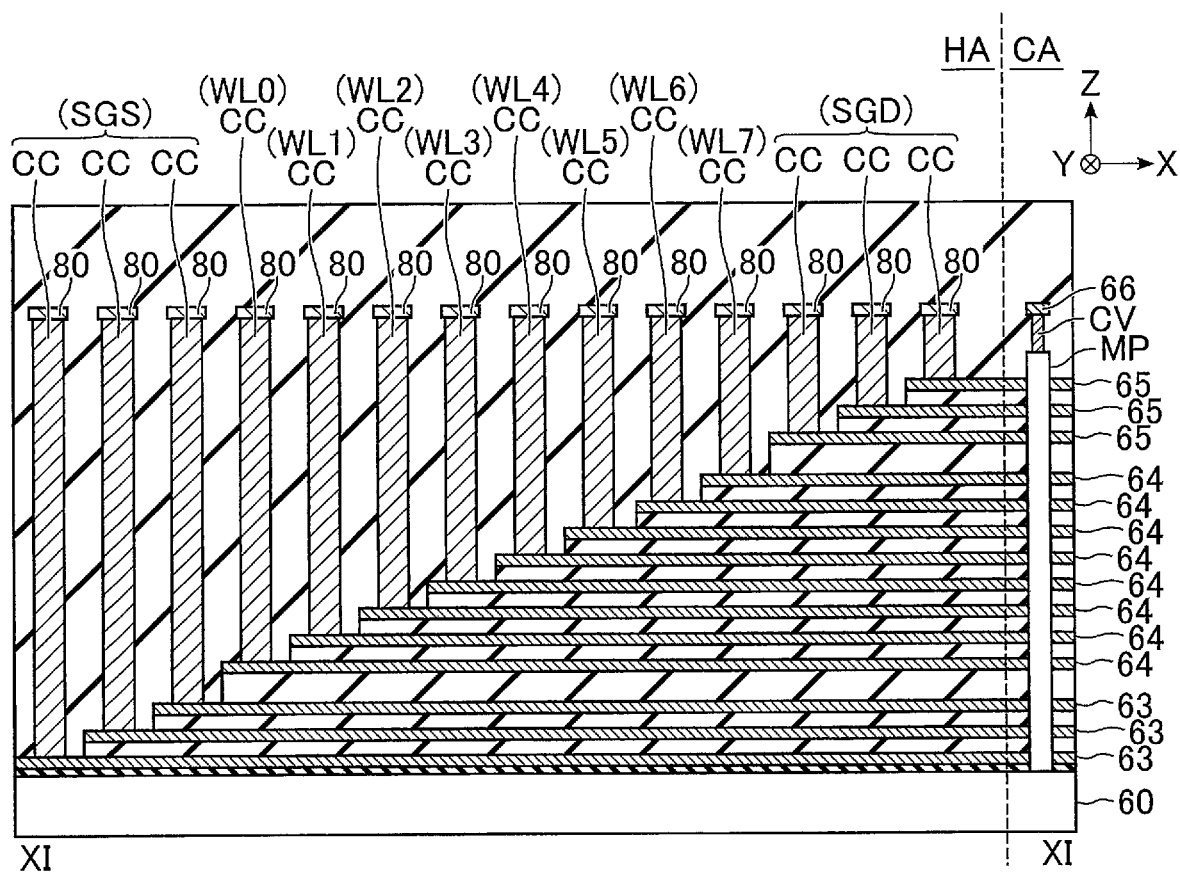
F I G. 11

Setting example of initial voltage VSENP of sense node SEN

| State | Er | A~D | E~I | J~M | N, O |
|---|---|---|---|---|---|
| Read voltage | AR | BR~ER | FR~JR | KR~NR | OR |
| Group | G1 | G2 | G3 | G2 | G1 |
| VSENP | VDD1 | VDD2 | VDD3 | VDD2 | VDD1 |

(VDD1 < VDD2 < VDD3)

F I G. 13

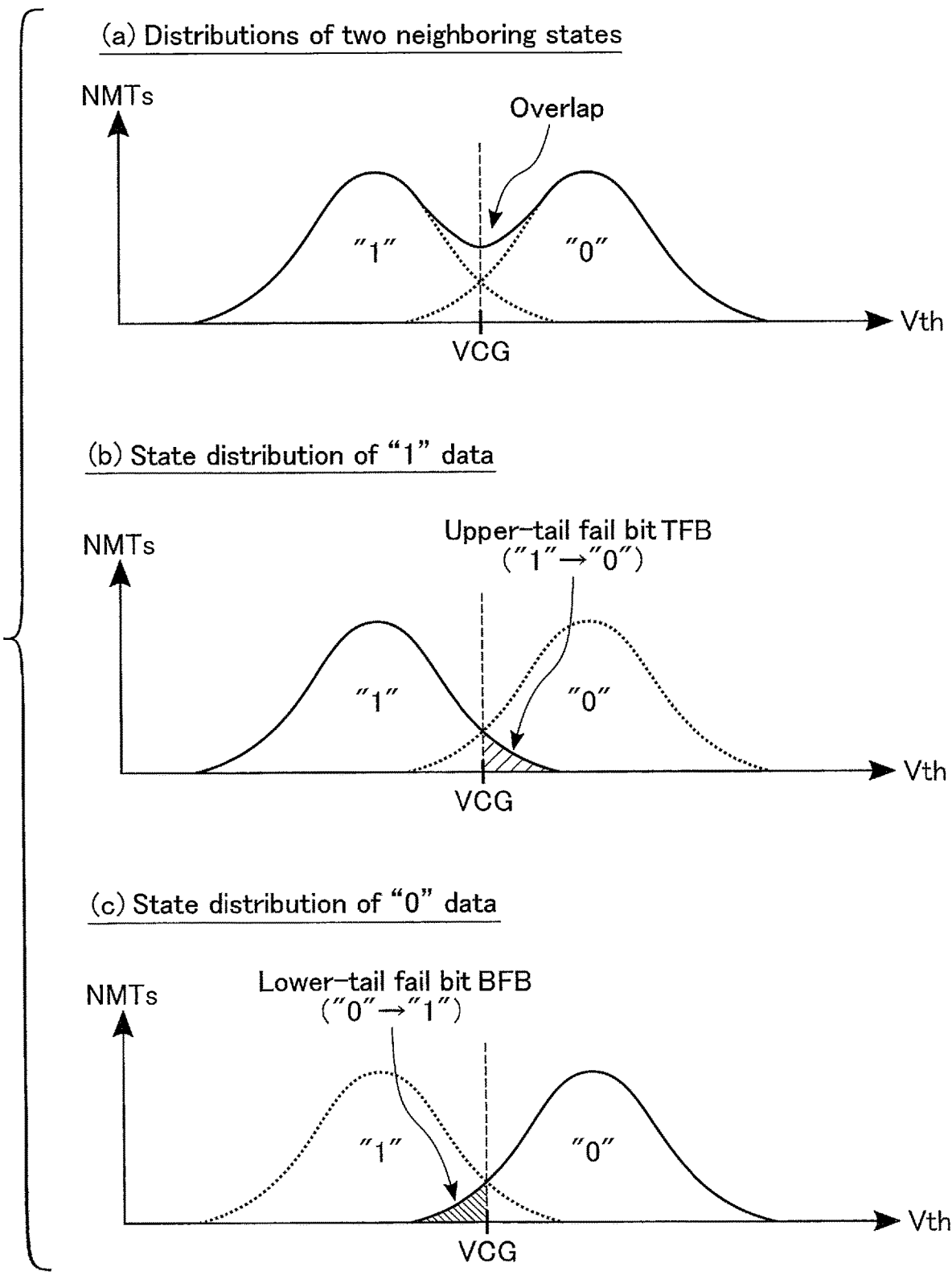
F I G. 16

Setting example of discharge time tSEN of sense node SEN

| State | Er | A~D | E~I | J~M | N, O |
|---|---|---|---|---|---|
| Read voltage | AR | BR~ER | FR~JR | KR~NR | OR |
| Group | G1 | G2 | G3 | G2 | G1 |
| tSEN | tSEN1 | tSEN2 | tSEN3 | tSEN2 | tSEN1 |

(tSEN1 > tSEN2 > tSEN3)

Setting example of source voltage LOP of sense transistor Tsen

| State | Er | A~D | E~I | J~M | N, O |
|---|---|---|---|---|---|
| Read voltage | AR | BR~ER | FR~JR | KR~NR | OR |
| Group | G1 | G2 | G3 | G2 | G1 |
| LOP | LOP1 | LOP2 | LOP3 | LOP2 | LOP1 |

(LOP1 > LOP2 > LOP3)

FIG. 21

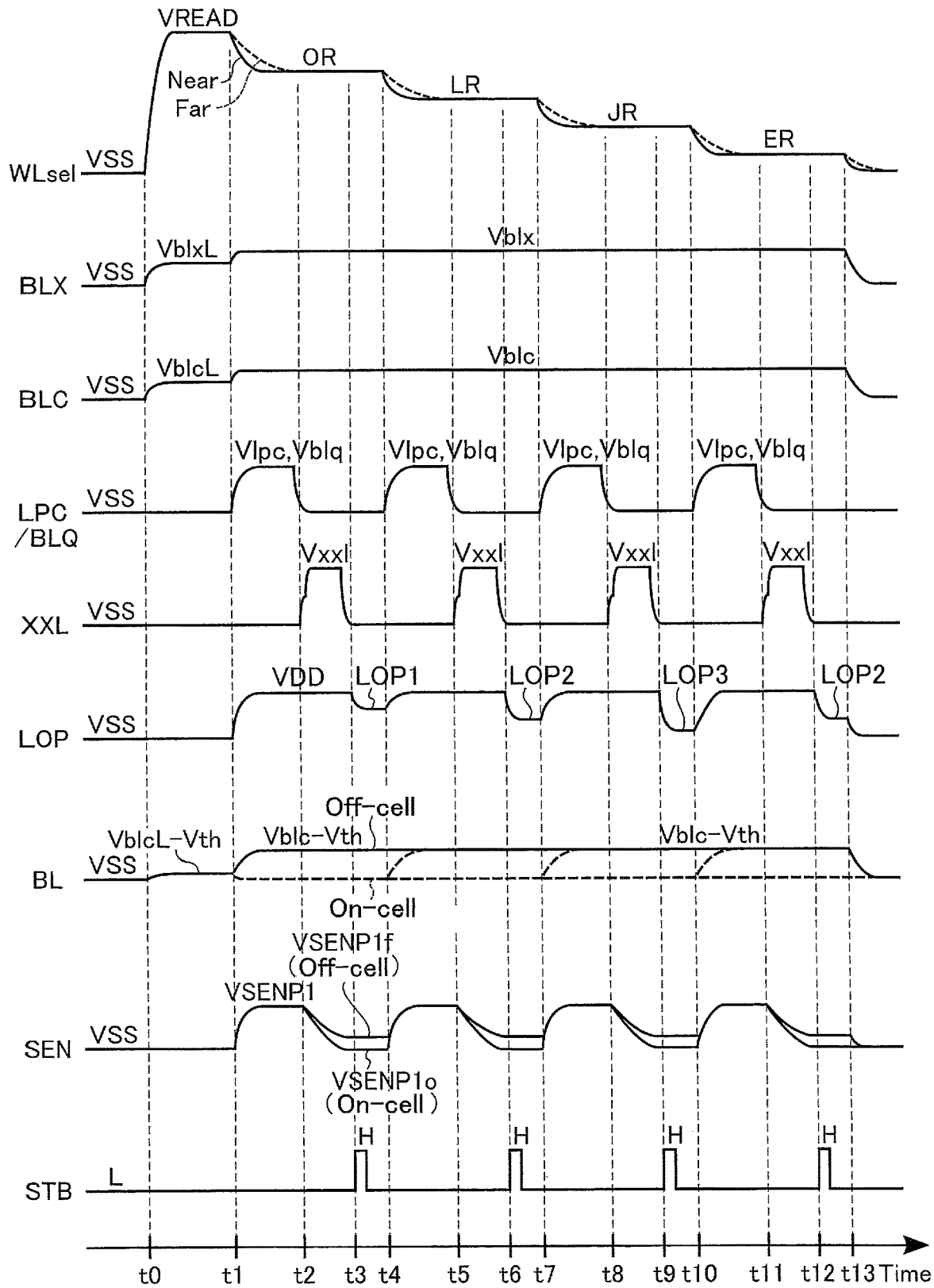
F I G. 23

Setting example of well voltage SENW of sense transistor Tsen

| State | Er | A~D | E~I | J~M | N, O |
|---|---|---|---|---|---|
| Read voltage | AR | BR~ER | FR~JR | KR~NR | OR |
| Group | G1 | G2 | G3 | G2 | G1 |
| SENW | SENW1 | SENW2 | SENW3 | SENW2 | SENW1 |

(SENW3 > SENW2 > SENW1)

F I G. 24

SEMICONDUCTOR MEMORY DEVICE

CROSS-REFERENCE TO RELATED APPLICATIONS

This application is based upon and claims the benefit of priority from Japanese Patent Application No. 2020-079421, filed Apr. 28, 2020, the entire contents of which are incorporated herein by reference.

FIELD

Embodiments described herein relate generally to a semiconductor memory device.

BACKGROUND

A semiconductor memory device including three-dimensionally arranged memory cells is known.

BRIEF DESCRIPTION OF THE DRAWINGS

FIG. 1 is a block diagram showing a configuration example of a semiconductor memory device according to a first embodiment.

FIG. 2 is a circuit diagram of a block in a memory cell array according to the first embodiment.

FIG. 3 is a diagram showing an example of a circuit configuration of a row decoder module according to the first embodiment.

FIG. 4 is a diagram showing an example of a circuit configuration of a sense amplifier module according to the first embodiment.

FIG. 5 is a diagram showing an example of a circuit configuration of a sense amplifier unit in the sense amplifier module according to the first embodiment.

FIG. 9 is a cross-sectional view taken along line IX-IX of FIG. 8.

FIG. 10 is a diagram showing an example of a planar layout of a hookup area of the memory cell array according to the first embodiment.

FIG. 11 is a cross-sectional view taken along line XI-XI of FIG. 10.

FIG. 13 is a diagram showing a setting example of an initial voltage of a sense node in a read operation of the first embodiment.

FIG. 16 is a diagram showing an example of failed bits between two neighboring states according to the first embodiment.

FIG. 21 is a diagram showing a setting example of a source voltage of a sense transistor in a read operation according to a third embodiment.

FIG. 23 is a diagram showing an example of a timing chart in a read operation of uppermost-page data according to the third embodiment.

FIG. 24 is a diagram showing a setting example of a well voltage of a sense transistor in a read operation according to a fourth embodiment.

DETAILED DESCRIPTION

Figure 6:
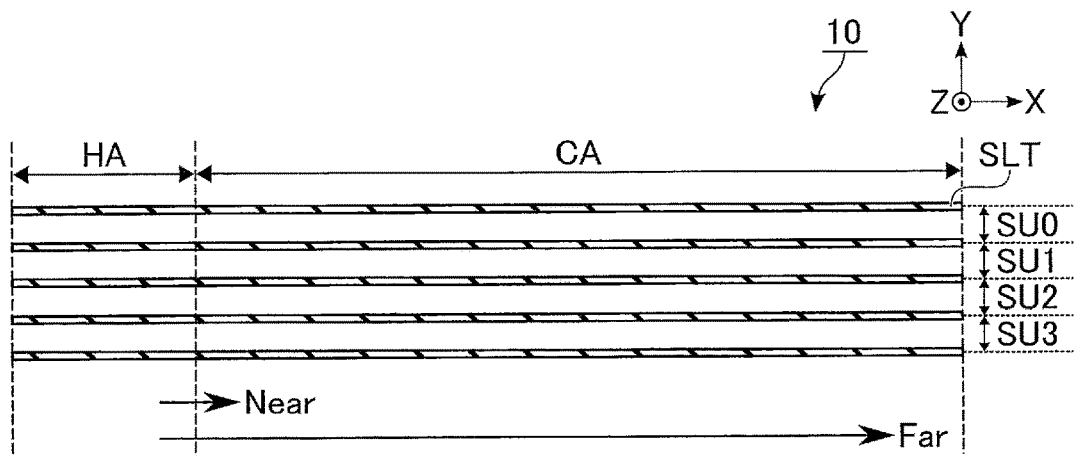
FIG. 6 is a diagram showing an example of a planar layout of the memory cell array according to the first embodiment.

In general, according to one embodiment, a semiconductor memory device includes a memory cell, a word line, a bit line, a first transistor, a second transistor and a driver. The word line is electrically coupled to a gate of the memory cell. The bit line is electrically coupled to one end of the memory cell. The first transistor includes a first gate electrically coupled to the bit line. The second transistor is coupled to a first end of the first transistor. The driver is configured to apply a voltage to the first gate of the first transistor. In a read operation, the driver varies a voltage to be applied to the first gate of the first transistor based on a read voltage applied to the word line.

Hereinafter, embodiments will be described with reference to the accompanying drawings. In the description that follows, components having the same function and configuration will be assigned a common reference numeral. The embodiments to be described below are shown as an example of a device or a method for embodying the technical idea of the embodiments, and are not intended to limit the material, shape, structure, arrangement, etc. of components to those described below.

Each functional block can be implemented in the form of hardware, computer software, or a combination thereof. The functional blocks are not necessarily separated as in the following example. For example, some of the functions may be executed by a functional block different from the functional block to be described as an example. In addition, the functional blocks to be described as an example may be divided into smaller functional subblocks. In the description that follows, a three-dimensional NAND flash memory including memory cell transistors stacked above a semiconductor substrate will be taken as an example of the semiconductor memory device. Herein, a memory cell transistor may also be referred to as a "memory cell".

1. FIRST EMBODIMENT

A semiconductor memory device according to a first embodiment will be described below.

1. 1 Configuration of Semiconductor Memory Device 1

1. 1. 1 Overall Configuration of Semiconductor Memory Device 1

FIG. 1 is a block diagram showing a configuration example of a semiconductor memory device 1 according to a first embodiment. The semiconductor memory device 1 is a NAND flash memory capable of storing data in a non-volatile manner, and is controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0, BLK1, BLK2, ..., and BLKn (where n is an integer equal to or greater than 0). Hereinafter, one or more of the blocks BLK0 to BLKn will be referred to as "block(s) BLK", unless specified.

The block BLK is a set of a plurality of memory cells capable of storing data in a non-volatile manner, and is used as, for example, a unit of data erasure. A plurality of bit lines and a plurality of word lines are provided in the memory cell array 10. Each memory cell is associated with, for example, a single bit line and a single word line. A detailed configuration of the memory cell array 10 will be described later.

The command register 11 stores a command CMD received by the semiconductor memory device 1 from the memory controller 2. The command CMD includes, for example, an instruction to cause the sequencer 13 to perform a read operation, a write operation, an erase operation, etc.

The address register 12 stores address information ADD received by the semiconductor memory device 1 from the memory controller 2. The address information ADD contains, for example, a block address BAd, a page address PAd, and a column address CAd. The block address BAd, the page address PAd, and the column address CAd are used to respectively select, for example, a block BLK, a word line, and a bit line.

The sequencer (or the control circuit) 13 controls the operation of the semiconductor memory device 1. For example, the sequencer 13 controls the row driver 14a, the column driver 14b, the row decoder module 15, and the sense amplifier module 16, etc., based on the command CMD stored in the command register 11, to perform a read operation, a write operation, an erase operation, etc.

The driver module 14 includes the row driver 14a and the column driver 14b. The row driver 14a and the column driver 14b generate voltages used in a read operation, a write operation, an erase operation, etc. Based on, for example, the page address PAd stored in the address register 12, the row driver 14a applies the generated voltage to a signal line corresponding to a selected word line. Based on, for example, the column address CAd stored in the address register 12, the column driver 14b applies the generated voltage to a signal line corresponding to a selected bit line.

Also, the column driver 14b generates various voltages necessary for a read operation, for example, and supplies the generated voltages to a sense amplifier unit in the sense amplifier module 16.

Based on the block address BAd stored in the address register 12, the row decoder module 15 selects a corresponding block BLK in the memory cell array 10. Thereafter, the row decoder module 15 transfers, for example, the voltage applied to the signal line corresponding to the selected word line to the selected word line in the selected block BLK.

In a write operation, the sense amplifier module 16 applies a desired voltage to each bit line in accordance with write data DAT received from the memory controller 2. In a read operation, the sense amplifier module 16 determines data stored in a memory cell based on the voltage of the corresponding bit line, and transfers the determination result to the memory controller 2 as read data DAT.

The above-described semiconductor memory device 1 and the memory controller 2 in combination may constitute a single semiconductor memory device. Examples of such semiconductor devices include a memory card such as an SD™ card, a solid state drive (SSD), etc.

1. 1. 2 Circuit Configuration of Semiconductor Memory Device 1

A circuit configuration of the memory cell array 10, the row decoder module 15, and the sense amplifier module 16 will be described in order below as a circuit configuration of the semiconductor memory device 1 according to the first embodiment.

1. 1. 2. 1 Circuit Configuration of Memory Cell Array 10

The memory cell array 10 includes a plurality of blocks BLK0 to BLKn, as described above. Herein, only one of a plurality of blocks BLK included in the memory cell array 10 is extracted as an example; however, the other blocks BLK have a similar circuit configuration.

FIG. 2 is a circuit diagram of a block BLK in the memory cell array 10 according to the first embodiment. A block BLK includes, for example, four string units SU0 to SU3. Hereinafter, one or more of the string units SU0 to SU3 will be referred to as "string unit(s) SU", unless specified.

Each string unit SU includes a plurality of NAND strings NS that are respectively associated with bit lines BL0 to BLm (where m is an integer equal to or greater than 0). Each NAND string NS includes, for example, memory cell transistors MT0 to MT7 and select transistors ST1 and ST2. Each of the memory cell transistors MT0 to MT7 includes a control gate and a charge storage layer, and stores data in a non-volatile manner. The select transistors ST1 and ST2 are used to select a string unit SU in various operations. Hereinafter, one or more of the memory cell transistors MT0 to MT7 will be referred to as "memory cell transistor(s) MT", unless specified.

In each NAND string NS, memory cell transistors MT0 to MT7 are coupled in series. A drain of the select transistor ST1 is coupled to a corresponding bit line BL, and a source of the select transistor ST1 is coupled to one end of a set of memory cell transistors MT0 to MT7 coupled in series. A drain of the select transistor ST2 is coupled to the other end of the set of memory cell transistors MT0 to MT7 coupled in series. A source of the select transistor ST2 is coupled to a source line CELSRC.

Control gates of sets of memory cell transistors MT0 to MT7 in the same block BLK are respectively coupled to the word lines WL0 to WL7. Gates of the select transistors ST1 in the string units SU0 to SU3 are respectively coupled to the select gate lines SGD0 to SGD3. Gates of select transistors ST2 in the same block BLK are coupled to a select gate line SGS.

In the above-described circuit configuration of the memory cell array 10, the bit line BL is shared among a plurality of NAND strings NS in each string unit SU to which the same column address is assigned. The source line CELSRC is, for example, shared among a plurality of blocks BLK.

A set of memory cell transistors MT coupled to a word line WL in a single string unit SU is referred to as, for example, a cell unit CU. For example, the storage capacity of a cell unit CU including memory cell transistors MT, which individually store 1-bit data, is defined as "1-page data". A cell unit CU may have a storage capacity of 2 or more pages of data, according to the number of bits of data stored in the memory cell transistor MT.

The circuit configuration of the memory cell array 10 included in the semiconductor memory device 1 according to the first embodiment is not limited to the above-described one. The number of string units SU included in each block BLK and the number of each of the memory cell transistors MT and the select transistors ST1 and ST2 included in each NAND string NS may be set to be any number.

1. 1. 2. 2 Circuit Configuration of Row Decoder Module 15

FIG. 3 is a diagram showing an example of a circuit configuration of the row decoder module 15 included in the semiconductor memory device 1 according to the first embodiment. As shown in FIG. 3, the row decoder module 15 includes row decoders RD0 to RDn, respectively corresponding to blocks BLK0 to BLKn. Each of the row decoders RD0 to RDn is coupled to, for example, the row driver 14a via signal lines CG0 to CG7, SGDD0 to SGDD3, SGSD, USGD, and USGS. Hereinafter, one or more of the row decoders RD0 to RDn will be referred to as "row decoder(s) RD", unless specified.

A detailed circuit configuration of the row decoder RD will be described below, focusing on the row decoder RD0 corresponding to the block BLK0. The row decoder RD includes, for example, a block decoder BD, transfer gate lines TG and bTG, and transistors TR0 to TR17. Hereinafter, one or more of the transistors TR0 to TR17 will be referred to as "transistor(s) TR", unless specified.

The block decoder BD decodes a block address BAd. The block decoder BD applies a predetermined voltage to transfer gate lines TG and bTG based on a result of the decoding of the block address BAd. The voltage applied to the transfer gate line TG is complementary to the voltage applied to the transfer gate line bTG. In other words, an inversion signal of the transfer gate line TG is input to the transfer gate line bTG.

Each of the transistors TR0 to TR17 is an n-channel MOS field-effect transistor (metal oxide semiconductor field-effect transistor) with a high withstand voltage. The gates of the transistors TR0 to TR12 are coupled to the transfer gate line TG. The gates of the transistors TR13 to TR17 are coupled to the transfer gate line bTG. Each transistor TR is coupled between a signal line extending from the row driver 14a and an interconnect provided in the corresponding block BLK.

Specifically, a drain of the transistor TR0 is coupled to the signal line SGSD. A source of the transistor TR0 is coupled to the select gate line SGS. Drains of the transistors TR1 to TR8 are respectively coupled to the signal lines CG0 to CG7. Sources of the transistors TR1 to TR8 are respectively coupled to the word lines WL0 to WL7. Drains of the transistors TR9 to TR12 are respectively coupled to the signal lines SGDD0 to SGDD3. Sources of the transistors TR9 to TR12 are respectively coupled to the select gate lines SGD0 to SGD3. A drain of the transistor TR13 is coupled to the signal line USGS. A source of the transistor TR13 is coupled to the select gate line SGS. Drains of the transistors TR14 to TR17 are coupled to the signal line USGD. Sources of the transistors TR14 to TR17 are respectively coupled to the select gate lines SGD0 to SGD3.

The signal lines CG0 to CG7 function as global word lines, and the word lines WL0 to WL7 function as local word lines. The signal lines SGDD0 to SGDD3 and SGSD function as global transfer gate lines, and the select gate lines SGD0 to SGD3 and SGS function as local transfer gate lines.

With the above-described configuration, the row decoder module 15 can select a block BLK. Specifically, in various operations, the block decoder BD corresponding to the selected block BLK applies an "H" level voltage and an "L" level voltage to the transfer gate lines TG and bTG, respectively, and the block decoders BD corresponding to the non-selected blocks BLK apply an "L" level voltage and an "H" level voltage to the transfer gate lines TG and bTG, respectively.

The above-described circuit configuration of the row decoder module 15 is merely an example, and may be suitably varied. For example, the number of transistors TR included in the row decoder module 15 may be designed based on the number of interconnects provided in each block BLK.

1. 1. 2. 3 Circuit Configuration of Sense Amplifier Module 16

FIG. 4 is a diagram showing an example of a circuit configuration of the sense amplifier module 16 included in the semiconductor memory device 1 according to the first embodiment. As shown in FIG. 4, the sense amplifier module 16 includes, for example, sense amplifier units SAU0 to SAUm respectively corresponding to the bit lines BL0 to BLm.

Each of the sense amplifier units SAU0 to SAUm includes, for example, a bit line coupling section BLHU, a sense amplifier SA, a logic circuit LC, and latch circuits SDL, ADL, BDL, CDL, DDL, and XDL. Hereinafter, one or more of the sense amplifier units SAU0 to SAUm will be referred to as "sense amplifier unit SAU", unless specified.

The bit line coupling section BLHU includes a high breakdown voltage transistor coupled between the bit line BL and the sense amplifier SA that are associated with each other.

The sense amplifier SA, the logic circuit LC, and the latch circuits SDL, ADL, BDL, CDL, DDL, and XDL are coupled to a bus LBUS. The latch circuits SDL, ADL, BDL, CDL, DDL, and XDL are capable of transmitting and receiving data therebetween.

Control signals BLX, BLC, LPC, BLQ, XXL, STB, etc. provided by the sequencer 13, for example, are input to each sense amplifier SA. Voltages VDD1, VDD2, VDD3, LOP1, LOP2, LOPS, SENW1, SENW2, SENW3, etc. supplied from the column driver 14b are input to each sense amplifier SA.

The sense amplifier SA determines whether data read to the corresponding bit line BL is "0" or "1", based on the timing of assertion of the control signal STB. That is, the sense amplifier SA determines data stored in the selected memory cell based on the voltage of the bit line BL.

The logic circuit LC executes various logical operations using data stored in latch circuits SDL, ADL, BDL, CDL, DDL, and XDL coupled to a common bus LBUS. Specifically, the logic circuit LC is capable of executing an AND operation, an OR operation, a NAND operation, a NOR operation, an EXNOR operation, etc. based on data stored in two latch circuits.

Each of the latch circuits SDL, ADL, BDL, CDL, DDL, and XDL temporarily stores the data. The latch circuit XDL is used for input/output of data DAT between an input/output circuit of the semiconductor memory device 1 and the sense amplifier unit SAU. The latch circuit XDL may also be used as, for example, a cache memory of the semiconductor memory device 1. The semiconductor memory device 1 can be in a ready state when at least the latch circuit XDL is unoccupied.

A detailed configuration of the sense amplifier unit SAU will be described below. FIG. 5 shows an example of a detailed circuit configuration of one of the sense amplifier units SAU in the sense amplifier module 16. As shown in FIG. 5, each sense amplifier unit SAU includes a sense amplifier SA and latch circuits SDL, ADL, BDL, CDL, DDL, and XDL, which are coupled to one another in such a manner that data can be transmitted and received therebetween.

Each sense amplifier unit SAU includes p-channel MOS field-effect transistors 21 and 24, n-channel MOS field-effect transistors Tbls, Tblc, Tblx, 26, Txxl, Tstb, Tsen, 30, 31, Tblq, 33, and Tlsw, and capacitors 41 and 42.

A single bit line BL is coupled to a node SCOM via transistors Tbls and Tblc that are coupled in series. The transistors Tbls and Tblc receive, at their gates, signals BLS and BLC from the sequencer 13, for example. The node SCOM is coupled to a node of the voltage VHSA via the transistors Tblx and 21 that are coupled in series. The transistor 21 is, at its gate, coupled to a node INV_S in the latch circuit SDL. The transistor Tblx receives, at its gate, a signal BLX from the sequencer 13.

Anode SSRC to which the transistor 21 and the transistor Tblx are coupled is coupled to the node SRCGND via the transistor 24. The transistor 24 is, at its gate, coupled to a node INV_S.

The node SCOM is also coupled to a node of the voltage VLSA via the transistor 26. The transistor 26 receives, at its gate, a signal NLO from the sequencer 13, for example.

The node SCOM is further coupled to the sense node SEN via the transistor Txxl. The transistor Txxl receives, at its gate, a signal XXL from the sequencer 13, for example. The sense node SEN receives a signal CLKSA via the capacitor 42. The signal CLKSA is controlled by, for example, the sequencer 13. The sense node SEN is capacitive-coupled by a bus DBUS (to be described later) and the capacitor 41.

The sense node SEN is coupled to the bus SBUS via the transistor Tblq. The transistor Tblq receives, at its gate, a signal BLQ from the sequencer 13, for example. The sense node SEN is coupled to a node of the voltage LOP via the transistors 30 and 31 that are coupled in series. A node of the voltage LOP is controlled by a voltage supplied from the column driver 14b. The node of the voltage LOP may be grounded if the voltage level of the voltage LOP is not varied. The transistor 30 receives, at its gate, a signal LSL from the sequencer 13, for example.

The bus SBUS is coupled to a node of the voltage LOP via the transistors Tstb and Tsen that are coupled in series. The transistor Tstb receives, at its gate, a signal STB from the sequencer 13, for example. The sense transistor Tsen is, at its gate, coupled to the sense node SEN.

The bus SBUS is coupled to anode of a power-supply voltage VDD (VDD1, VDD2, or VDD3) via the transistor 33. The transistor 33 receives, at its gate, a signal LPC from the sequencer 13, for example, and transfers the power-supply voltage VDD to the bus SBUS. That is, the power-supply voltage VDD is supplied to the sense node SEN via the transistor Tblq and the transistor 33.

The latch circuits SDL, ADL, BDL, CDL, DDL, and XDL temporarily store read data.

The latch circuit SDL includes, for example, inverters 50 and 51, and n-channel MOS field-effect transistors 52 and 53. An input node of the inverter 50 is coupled to a node LAT, and an output node of the inverter 50 is coupled to a node INV_S. An input node of the inverter 51 is coupled to the node INV_S, and an output node of the inverter 51 is coupled to the node LAT. One end of the transistor 52 is coupled to the node INV_S, and another end of the transistor 52 is coupled to a bus LBUS. A control signal ST1 is input to a gate of the transistor 52. One end of the transistor 53 is coupled to the node LAT, and another end of the transistor 53 is coupled to the bus LBUS. A control signal STL is input to a gate of the transistor 53.

For example, the data stored in the node LAT corresponds to data stored in the latch circuit SDL, and the data stored in the node INV_S corresponds to inverted data of the data stored in the node LAT. The circuit configurations of the latch circuits ADL, BDL, CDL, DDL, and XDL are similar to, for example, the circuit configuration of the latch circuit SDL, and a description thereof will be omitted.

The above-described various control signals are generated by, for example, the sequencer 13.

The configuration of the sense amplifier module 16 in the first embodiment is not limited thereto. For example, the number of latch circuits included in the sense amplifier unit SAU may be freely designed. In this case, the number of latch circuits is designed based on, for example, the number of bits of data stored in a single memory cell transistor MT. A case has been described above where the sense amplifier unit SAU is in one-to-one correspondence with the bit line BL; however, the configuration is not limited thereto. For example, a plurality of bit lines BL may be coupled to a single sense amplifier unit SAU via a selector. The logic circuit LC in the sense amplifier unit SAU may be omitted if logical operations can be executed only by the latch circuits in the sense amplifier unit SAU.

1. 1. 3 Structure of Semiconductor Memory Device 1

An example of a structure of the semiconductor memory device 1 according to the first embodiment will be described below.

In the drawings that will be referred to below, an "X direction" corresponds to the direction in which the word lines WL extend, a "Y direction" corresponds to the direction in which the bit lines BL extend, and a "Z direction" corresponds to the direction vertical to the surface of the semiconductor substrate which is used as a semiconductor layer on which the semiconductor memory device 1 is formed. In planar views, hatching is applied, where necessary, for improved visibility. The hatching applied in the planar views does not necessarily relate to the material or characteristics of the hatched components. In the drawings, structural components such as interconnects, contacts, etc. are suitably omitted for improved visibility.

1. 1. 3. 1 Planar Layout of Memory Cell Array 10

FIG. 6 is a diagram showing an example of a planar layout of the memory cell array 10 included in the semiconductor memory device 1 according to the first embodiment. In FIG. 6, a region corresponding to a single block BLK (i.e., string units SU0 to SU3) is extracted. As shown in FIG. 6, the memory cell array 10 includes a plurality of slits SLT. In the planar layout, the memory cell array 10 is divided into, for example, a cell area CA and a hookup area HA as viewed in the X direction.

The slits SLT are provided so as to extend in the X direction, and to intersect the region of the memory cell array 10 as viewed in the X direction. The slits SLT are aligned in the Y direction. Each of the slits SLT has a structure in which an insulating member and a conductive member are embedded inside, and splits conductive layers provided in the same interconnect layer so as to be adjacent to each other, with the slit SLT interposed therebetween. Specifically, each slit SLT splits each of a plurality of interconnect layers respectively corresponding to, for example, the word lines WL0 to WL7 and the select gate lines SGD and SGS.

The cell area CA is an area in which NAND strings NS are formed. The hookup area HA is an area in which contacts are formed to electrically couple the row decoder module 15 with the select gate lines SGS and SGD and the word lines WL coupled to the NAND strings NS. The hookup area HA is arranged on one side of the memory cell array 10 as viewed in the X direction, and is adjacent to the cell area CA. In the description that follows, a portion of the cell area CA which is close to the hookup area HA will be referred to as "near end (Near)", and a portion of the cell area CA which is far from the hookup area HA will be referred to as "far end (Far)".

In the above-described planar layout of the memory cell array 10 according to the embodiment, each of the areas separated by the slits SLT corresponds to a single string unit SU. That is, string units SU0 to SU3, each extending in the X direction, are aligned in the Y direction. In the memory cell array 10, the layout shown in FIG. 6, for example, is repeatedly arranged in the Y direction.

1. 1. 3. 2 Structure of Cell Area CA

Figure 7:
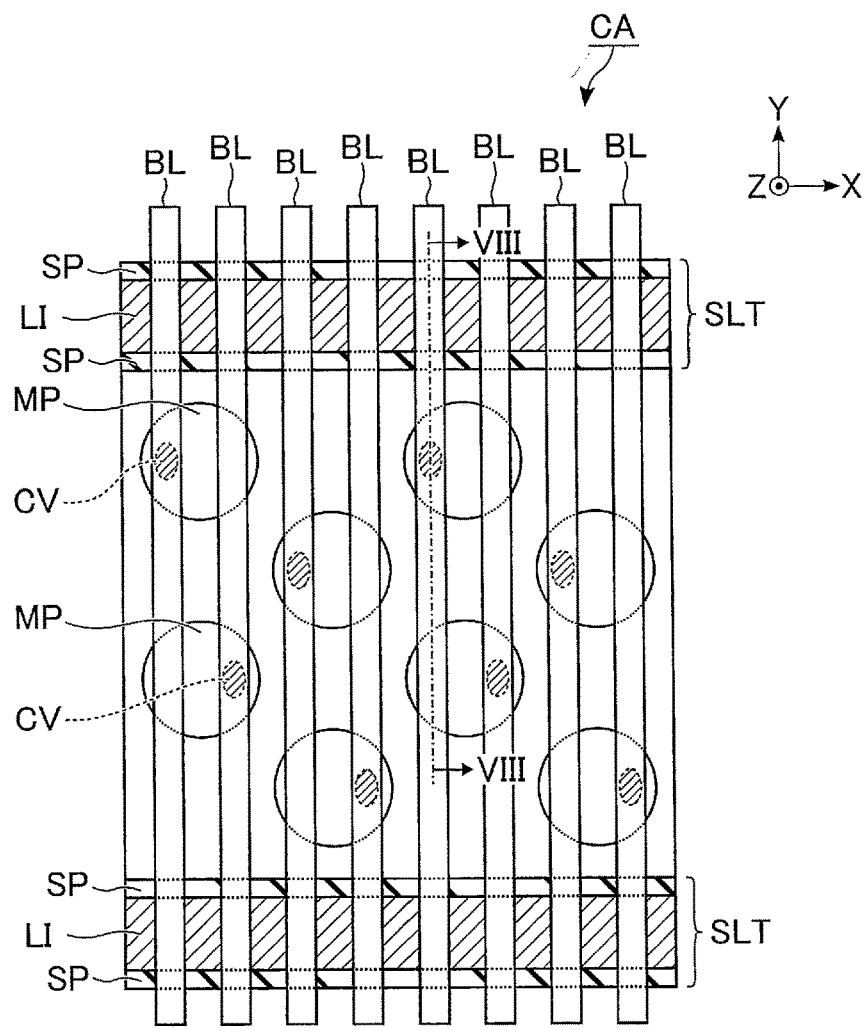
FIG. 7 is a diagram showing an example of a planar layout of a cell area of the memory cell array according to the first embodiment.

FIG. 7 is a diagram showing an example of a detailed planar layout of a cell area CA of the memory cell array 10 in the semiconductor memory device 1 according to the first embodiment. In FIG. 7, a portion of an area corresponding to a single string unit SU is extracted. As shown in FIG. 7, the memory cell array 10 in the cell area CA includes, for example, a plurality of memory pillars MP, a plurality of contacts CV, and a plurality of bit lines BL. A slit SLT includes, for example, a contact LI and a spacer SP.

Each of the memory pillars MP functions as, for example, a single NAND string NS. The memory pillars MP are in, for example, a 4-row staggered arrangement in an area between two adjacent slits SLT. However, the number and arrangement of the memory pillars MP between two adjacent slits SLT are not limited thereto, and may be suitably varied.

Each of the bit lines BL extends in the Y direction at least partially, and is aligned in the X direction. Each bit line BL is arranged so as to overlap at least one memory pillar MP in each string unit SU. In the present example, two bit lines BL overlap each memory pillar MP.

A contact CV is provided between a memory pillar MP and one of the bit lines BL that overlap the memory pillar MP. Each memory pillar MP is electrically coupled to the corresponding bit line BL via a contact CV. For example, a single contact CV is coupled to a corresponding bit line BL in each of the spaces separated by the slits SLT.

In each slit SLT, the contact LI is provided so as to extend in the X direction at least partially. The spacer SP is provided on a side surface of the contact LI. The spacer SP provides insulation between the contact LI and the interconnect layers adjacent to the slit SLT. The contact LI is used as a source line CELSRC. The contact LI may be either a semiconductor or a metal. The spacer SP is provided using an insulator such as silicon oxide ($SiO_2$) and silicon nitride (SiN).

Figure 8:
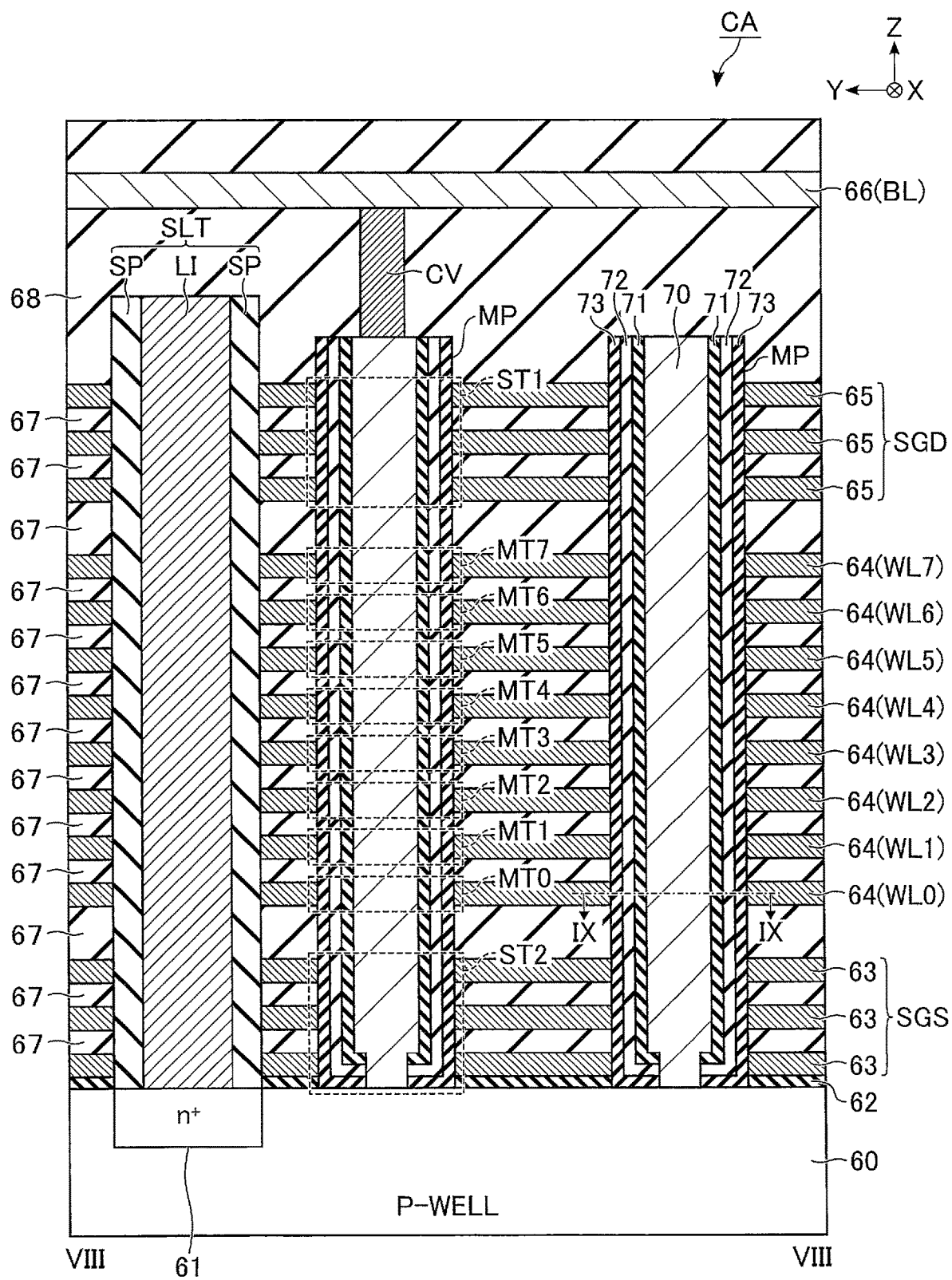
FIG. 8 is a cross-sectional view taken along line VIII-VIII of FIG. 7.

FIG. 8 is a cross-sectional view taken along line VIII-VIII of FIG. 7, showing an example of a cross-sectional structure of a cell area CA of the memory cell array 10 included in the semiconductor memory device 1 according to the first embodiment. As shown in FIG. 8, the memory cell array 10 includes a p-well region 60, insulating layers 62, 67 and 68, and conductive layers 63 to 66.

The p-well region 60 is provided in the vicinity of a surface of the semiconductor substrate, and includes an n-type semiconductor region 61. The n-type semiconductor region 61 is an n-type impurity diffusion region provided in the vicinity of a surface of the p-well region 60. The n-type semiconductor region 61 is doped with, for example, phosphorous (P).

An insulating layer 62 is provided on the p-well region 60. Conductive layers 63 and insulating layers 67 are stacked in an alternating manner on the insulating layer 62. The conductive layer 63 is formed, for example, in a plate shape extending along the XY plane. The stacked conductive layers 63 are used as select gate lines SGS. The conductive layers 63 contain, for example, tungsten (W).

Conductive layers 64 and insulating layers 67 are stacked in an alternating manner above the topmost conductive layer 63. Each of the conductive layers 64 is formed, for example, in a plate shape extending along the XY plane. The stacked conductive layers 64 are respectively used as, in order from the side of the p-well region 60, word lines WL0 to WL7. The conductive layers 64 contain, for example, tungsten (W).

Conductive layers 65 and insulating layers 67 are stacked in an alternating manner above the topmost conductive layer 64. Each of the conductive layers 65 is formed, for example, in a plate shape extending along the XY plane. The stacked conductive layers 65 are used as select gate lines SGD. The conductive layers 65 contain, for example, tungsten (W).

A conductive layer 66 is provided above the topmost conductive layer 65, with an insulating layer 68 interposed therebetween. Each of the conductive layers 66 is formed in, for example, a linear shape extending in the Y direction, and is used as a bit line BL. That is, the conductive layers 66 are aligned along the X direction in an unillustrated region. The conductive layers 66 contain, for example, copper (Cu).

Each of the memory pillars MP is provided so as to extend along the Z direction and penetrates the insulating layers 62 and 67 and the conductive layers 63 to 65. A bottom portion of the memory pillar MP is in contact with the p-well region 60. Each of the memory pillars MP includes, for example, a semiconductor layer 70, a tunnel insulating film 71, an insulating film 72, and a block insulating film 73.

The semiconductor layer 70 is provided so as to extend along the Z direction. For example, an upper end of the semiconductor layer 70 is located in a layer above the topmost conductive layer 65, and a lower end of the semiconductor layer 70 is in contact with the p-well region 60. The tunnel insulating film 71 covers a side surface of the semiconductor layer 70. The insulating film 72 covers a side surface of the tunnel insulating film 71. The block insulating film 73 covers a side surface of the insulating film 72. Both of the tunnel insulating film 71 and the block insulating film 73 contain, for example, a silicon oxide ($SiO_2$). The insulating film 72 contains, for example, silicon nitride (SiN).

A pillar-shaped contact CV is provided on top of the semiconductor layer 70 in the memory pillar MP. In the illustrated region, only a contact CV corresponding to one of two memory pillars MP is shown. A contact CV is coupled, in an unillustrated region, to the other memory pillar MP to which a contact CV is not coupled in the illustrated region.

A top surface of the contact CV is in contact with one of the conductive layers 66, namely, one of the bit lines BL. As described above, a single contact CV is coupled to one of the conductive layers 66 (one of the bit lines BL) in each of the spaces separated by the slits SLT. That is, a single memory pillar MP between two adjacent slits SLT is electrically coupled to each of the conductive layers 66.

Each slit SLT is formed, for example, in a shape that extends along the XZ plane, and splits the insulating layers 62 and 67 and the conductive layers 63 to 65. An upper end of the slit SLT is included in a layer between the topmost conductive layer 65 and the conductive layers 66. A lower end of the slit SLT is in contact with the n-type semiconductor region 61 in the p-well region 60. Specifically, the contact LI in the slit SLT is formed in a plate shape extending along the XZ plane. A bottom portion of the contact LI is electrically coupled to the n-type semiconductor region 61. The spacer SP in the slit SLT covers a side surface of the contact LI. The contact LI is distanced from the conductive layers 63-65 by the spacer SP.

FIG. 9 is a cross-sectional view taken along line IX-IX of FIG. 8, showing an example of a cross-sectional structure of a memory pillar MP in the semiconductor memory device 1 according to the first embodiment. In FIG. 9, a cross section of a memory pillar MP in a layer that is parallel to the surface of the semiconductor substrate and that includes the conductive layer 64 is extracted. As shown in FIG. 9, in the layer including the conductive layer 64, the semiconductor layer 70 is provided at, for example, the center of the memory pillar MP. The tunnel insulating film 71 surrounds a side surface of the semiconductor layer 70. The insulating film 72 surrounds a side surface of the tunnel insulating film 71. The block insulating film 73 surrounds a side surface of the insulating film 72. The conductive layer 64 surrounds a side surface of the block insulating film 73.

In the above-described structure of the memory pillar MP, a portion at which the memory pillar MP and the conductive layer 63 intersect each other functions as a select transistor ST2. A portion at which the memory pillar MP intersects each conductive layer 64 functions as a memory cell transistor MT. A portion at which the memory pillar MP intersects each conductive layer 65 functions as a select transistor ST1. That is, the semiconductor layer 70 functions as a channel of each of the memory cell transistors MT0 to MT7 and the select transistors ST1 and ST2. The insulating film 72 functions as a charge storage layer of the memory cell transistor MT.

1. 1. 3. 3 Structure of Hookup Area HA

FIG. 10 is a diagram showing an example of a detailed planar layout of the hookup area HA of the memory cell array 10 in the semiconductor memory device 1 according to the first embodiment. In FIG. 10, a region corresponding to a single string unit SU is extracted. In FIG. 10, an end portion of the cell area CA located in the vicinity of the hookup area HA is also shown. As shown in FIG. 10, in the hookup area HA, each of the select gate lines SGS, the word lines WL0 to WL7, and the select gate lines SGD includes, at its end portion, a terrace portion that does not overlap a conductive layer provided there above.

The terrace portion is, for example, in a shape similar to the shape of a staircase, a terrace, rimstone, etc. Specifically, steps are individually provided between the select gate line SGS and the word line WL0, between the word line WL0 and the word line WL1, ..., between the word line WL6 and the word line WL7, and between the word line WL7 and the select gate line SGD. End portions of the select gate lines SGS, the word lines WL0 to WL7, and the select gate lines SGD are arranged between two adjacent slits SLT. The structure of the slit SLT in the hookup area HA is similar to that in the cell area CA.

In the hookup area HA, the memory cell array 10 includes a plurality of contacts CC. The contacts CC are arranged in the respective terrace portions of the select gate lines SGS, the word lines WL0 to WL7, and the select gate lines SGD. That is, the contacts CC are electrically coupled to the word lines WL0 to WL7 and the select gate lines SGD and SGS. Each of the word lines WL0 to WL7 and the select gate lines SGD and SGS is electrically coupled to the row decoder module 15 via the corresponding contact CC.

FIG. 11 is a cross-sectional view taken along line XI-XI of FIG. 10, showing an example of a cross-sectional structure of the hookup area HA of the memory cell array 10 included in the semiconductor memory device 1 according to the first embodiment. As shown in FIG. 11, in the hookup area HA, end portions of the conductive layers respectively corresponding to the word lines WL and the select gate lines SGD and SGS are provided in a staircase shape. In the hookup area HA, the memory cell array 10 further includes a plurality of conductive layers 80.

Specifically, a single contact CC is provided on a terrace portion of each of the conductive layers 63 corresponding to the select gate lines SGS, the conductive layers 64 respectively corresponding to the word lines WL0 to WL7, and the conductive layers 65 corresponding to the select gate lines SGD. A single conductive layer 80 is provided on each of the contacts CC, in such a manner that the contact CC and the conductive layer 80 are electrically coupled to each other.

The configuration of the memory cell array 10 in the hookup area HA is not limited to the above-described one. For example, a step may be formed in the Y direction at each of the end portions of the word lines WL and the select gate lines SGD and SGS which are stacked on one another. End portions of the word lines WL and the select gate lines SGD and SGS which are stacked on one another in the hookup area HA may be formed in a staircase shape of a given number of steps. The staircase structure to be formed may vary among the select gate lines SGS, the word lines WL, and the select gate lines SGD.

1. 1. 4 Storage System of Memory Cell Transistors MT

Figure 12:
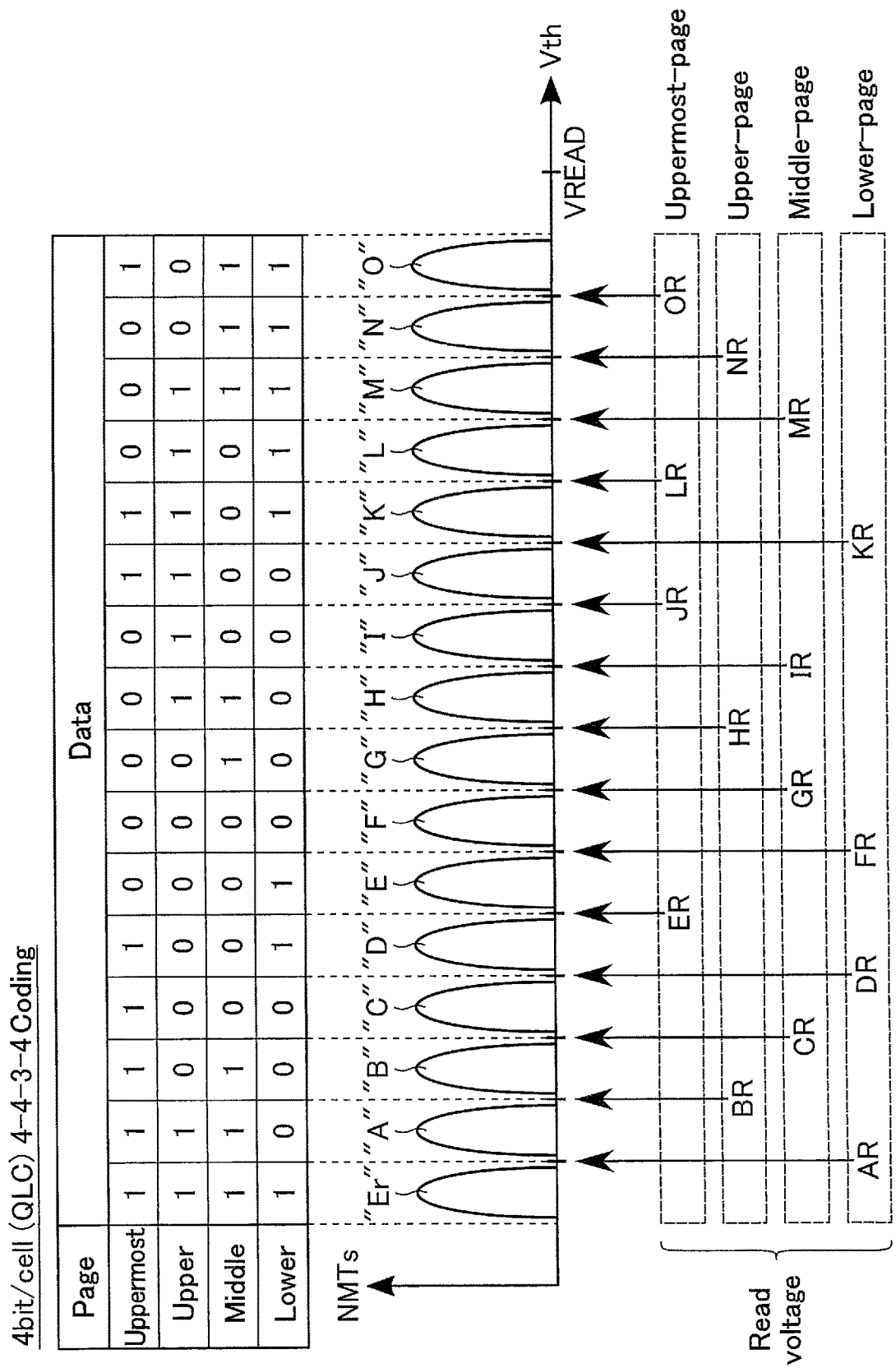
FIG. 12 is a diagram showing an example of data allocation to threshold voltage distributions of memory cell transistors according to the first embodiment.

FIG. 12 is a diagram showing an example of distributions of threshold voltages of memory cell transistors MT (hereinafter, "threshold voltage distributions") and data allocation in the case where the quad-level cell (QLC), with each memory cell transistor MT storing 4-bit data, is applied. In the threshold voltage distributions shown in FIG. 12, the vertical axis represents the number NMTs of the memory cell transistors MT, and the horizontal axis represents the threshold voltage Vth of the memory cell transistors MT.

As shown in FIG. 12, the threshold voltage distributions of the memory cell transistors MT to which the QLC is applied are categorized into 16 states. In the QLC, the sixteen threshold voltage distributions will be referred to as, in the ascending order of threshold voltage, "Er-state", "A-state", "B-state", "C-state", "D-state", "E-state", "F-state", "G-state", "H-state", "I-state", "J-state", "K-state", "L-state", "M-state", "N-state", and "O-state" distributions. The 4-bit data detailed below, for example, is assigned to each of the 16 states of threshold voltage distributions.

(Example) State distribution name: "(lower bit/middle bit/upper bit/uppermost bit)" data Er-state distribution: "1111" data A-state distribution: "0111" data
B-state distribution: "0101" data
C-state distribution: "0001" data
D-state distribution: "1001" data
E-state distribution: "1000" data
F-state distribution: "0000" data
G-state distribution: "0100" data
H-state distribution: "0110" data
I-state distribution: "0010" data
J-state distribution: "0011" data
K-state distribution: "1011" data
L-state distribution: "1010" data
M-state distribution: "1110" data
N-state distribution: "1100" data
O-state distribution: "1101" data A read voltage is set between neighboring threshold voltage distributions. For example, a read voltage AR is set between the Er-state and A-state distributions. A read voltage BR is set between the A-state and B-state distributions. A read voltage CR is set between the B-state and C-state distributions. Similarly, read voltages DR, ER, FR, GR, HR, IR, JR, KR, LR, MR, NR, and OR are set between the distributions of two neighboring states. A read pass voltage VREAD is set to be higher than the O-state distribution. When the read pass voltage VREAD is applied to a control gate of a memory cell transistor MT, the memory cell transistor MT is turned on, regardless of the data stored therein.

When the above-described data allocation is applied, one-page data constituted by the lower bits (hereinafter, "lower-page data") is confirmed by a read operation using each of the read voltages AR, DR, FR and KR. One-page data constituted by the middle bits (hereinafter, "middle-page data") is confirmed by a read operation using the read voltages CR, GR, IR, and MR. One-page data constituted by the upper bits (hereinafter, "upper-page data") is confirmed by a read operation using the read voltages BR, HR, and NR. One-page data constituted by the uppermost bits (hereinafter, "uppermost-page data") is confirmed by a read operation using the read voltages ER, JR, LR, and OR.

Since the lower-page data, the middle-page data, the upper-page data, and the uppermost-page data are confirmed by four read operations, four read operations, three read operations, and four read operations, respectively, such data allocation is referred to as "4-4-3-4 coding". Herein, a case will be described, for example, where the 4-4-3-4 coding is applied to data allocation to memory cell transistors MT.

1. 2 Operation of Semiconductor Memory Device 1

In a read operation, the semiconductor memory device 1 according to the first embodiment varies an initial voltage VSENP of a sense node SEN in the sense amplifier unit SAU based on the read voltage or the state of a read target. The initial voltage VSENP refers to a voltage level at which the sense node SEN finally arrives after being charged in a read operation. In other words, the initial voltage VSENP refers to a voltage level of the sense node SEN immediately before the signal XXL is asserted in a read operation. For example, the read voltages AR, BR, CR, DR, ER, FR, GR, HR, IR, JR, KR, LR, MR, NR, and OR are classified into a plurality of groups, and the initial voltage VSENP of the sense node SEN is set for each group.

FIG. 13 is a diagram showing a setting example of the initial voltage VSENP of the sense node SEN in a read operation of the first embodiment. As shown in FIG. 13, the read voltages are categorized into, for example, three groups: a first group G1; a second group G2; and a third group G3, and the initial voltage VSENP of the sense node SEN is set for each group. For the read voltages AR and OR belonging to the first group G1, the initial voltage VSENP of the sense node SEN is set to the voltage VDD1. For the read voltages BR to ER and KR to NR belonging to the second group G2, the initial voltage VSENP of the sense node SEN is set to a voltage VDD2. For the read voltages FR to JR belonging to the third group G3, the initial voltage VSENP of the sense node SEN is set to the voltage VDD3.

The voltage VDD2 is higher than the voltage VDD1, and the voltage VDD3 is higher than the voltage VDD2. That is, the voltages VDD1, VDD2, and VDD3 have the following magnitude relationship: VDD1<VDD2<VDD3.

Figure 14:
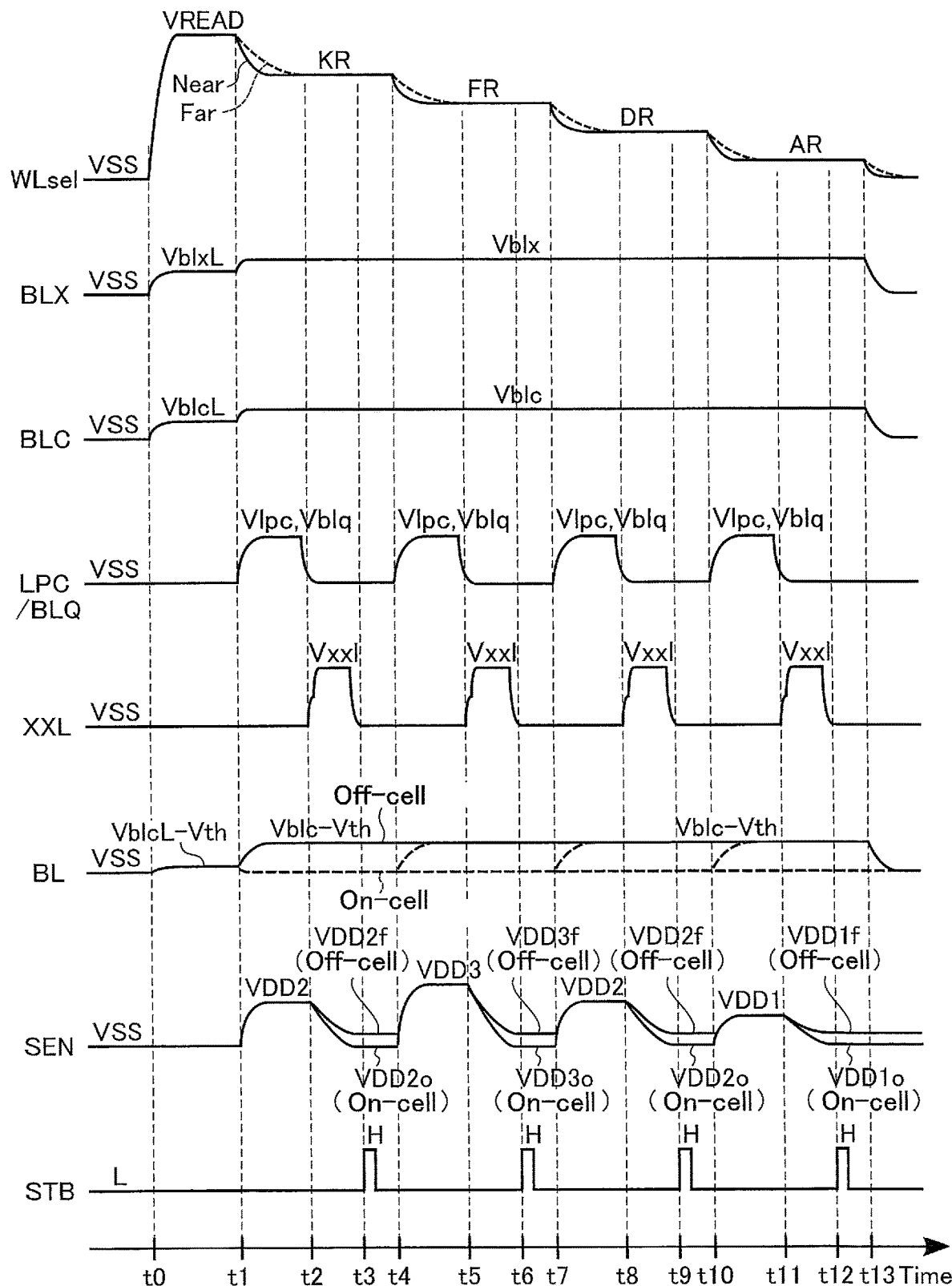
FIG. 14 is a diagram showing an example of a timing chart in a read operation of lower-page data according to the first embodiment.

Hereinafter, a concrete example of a read operation according to the first embodiment will be described by taking a read operation of the lower-page data and the uppermost-page data as an example. A read operation of the lower-page data will be described. FIG. 14 is a diagram showing an example of a timing chart in a read operation of the lower-page data according to the first embodiment.

In the description that follows, voltages that are applied to the various interconnects will be suitably referred to only by the reference numerals. Memory cell transistors MT included in the cell unit CU to be a read target will be referred to as selected memory cells. The word line WL coupled to the selected memory cell will be referred to as a selected word line WLsel. In a read operation, voltages generated by the row driver 14a are applied to the selected word line WLsel via the row decoder module 15. A voltage generated by the column driver 14b is applied to a node of the power-supply voltage VDD. Let us assume that the sense node SEN is suitably charged during the period in which the read voltages are applied.

Voltage that has been clamped by the transistors Tblx and Tblc, for example, is applied to the bit line BL. Let us assume that the voltage of the node INV_S in the sense amplifier unit SAU for which the read data has not been confirmed is set to the "L" level. That is, in the sense amplifier unit SAU for which the read data has not been confirmed, the transistor 21 is turned on, and the transistor 26 is turned off.

In this example, the read voltages AR, DR, FR, and KR are used in a read operation of the lower-page data, and the read voltages are applied to the selected word line in the order of KR, FR, DR, and AR.

The read voltages KR and DR correspond to the second group G2. Accordingly, in a read operation using the read voltages KR and DR, the initial voltage VSENP of the sense node SEN is set to the voltage VDD2. The read voltage FR corresponds to the third group G3. Accordingly, in a read operation using the read voltage FR, the initial voltage VSENP of the sense node SEN is set to the voltage VDD3. Similarly, since the read voltage AR corresponds to the first group G1, the initial voltage VSENP of the sense node SEN is set to the voltage VDD1 in a read operation using the read voltage AR. As described above, VDD1<VDD2<VDD3 is satisfied.

As shown in FIG. 14, in a read operation, the sequencer 13 performs, for example, an operation of removing residual electrons in the channel during the period from time t0 to time t1. Moreover, the sequencer 13 performs a read process using the read voltage KR during the period from time t1 to time t4, performs a read process using the read voltage FR during the period from time t4 to time t7, performs a read process using the read voltage DR during the period from time t7 to time t10, and performs a read process using the read voltage AR during the period from time t10 to time t13. Hereinafter, details of these operations will be described below.

In an initial state prior to time t0, the voltages of the selected word line WLsel, the control signals BLX, BLC, LPC, BLQ, and XXL, and the bit lines BL, as well as the unillustrated source line CELSRC and the non-selected word lines WL are set to, for example, a ground voltage VSS. The voltage of the control signal STB is set to, for example, the "L" level.

At time t0, the row decoder module 15 applies the read pass voltage VREAD to the selected word line WLsel. When VREAD is applied to the selected word line WLsel, for example, the voltage at the near end of the selected word line WLsel ("Near" in FIG. 14) increases to VREAD, and the voltage at the far end of the selected word line WLsel ("Far" in FIG. 14) increases to VREAD with a delay from the voltage at the near end of the selected word line WLsel. Although the illustration is omitted, VREAD is applied to the non-selected word line WL at time t0, and the non-selected word line WL increases to VREAD, similarly to the selected word line WLsel. Moreover, at time t0, a voltage higher than the voltage VSS is applied to the source line CELSRC.

Furthermore, at time t0, the sequencer 13 increases the voltage of the control signal BLX from VSS to VblxL, and increases the voltage of the control signal BLC from VSS to VblcL, for example. The voltage value of VblcL is lower than, for example, VblxL. This causes the voltage of the bit line BL to increase from VSS to VblcL-Vth based on, for example, the voltage of the control signal BLC and the threshold voltage Vth of the transistor Tblc. Herein, the voltage drop, etc., caused by the transistor Tbls is disregarded in the voltage of the bit line BL in a read operation. The actual voltage of the bit line BL becomes a lower voltage than VblcL-Vth.

When the voltages of the selected and non-selected word lines WL increase to VREAD and the voltage of the control signal BLC increases to VblcL, all the transistors in the NAND string NS are turned on, and the residual electrons of the channel of the NAND string NS are removed.

Subsequently, at time t1, the row decoder module 15 applies the read voltage KR to the selected word line WLsel. This causes the voltage at the near end of the selected word line WLsel to drop to the read voltage KR, and causes the voltage at the far end of the selected word line WLsel to drop to the read voltage KR with a delay from the voltage at the near end of the selected word line WLsel.

At time t1, the sequencer 13 sets the voltage of the control signal BLX to Vblx, and sets the voltage of the control signal BLC to Vblc. The voltage value of Vblc is lower than, for example, Vblx. This causes the voltage of the bit line BL to vary according to the state of the selected memory cell while the read voltage KR is applied to the selected word line WLsel. Specifically, when the selected memory cell is in an on state, the voltage of the bit line BL coupled to the memory cell drops (on-cell of the bit line BL in FIG. 14). When the selected memory cell is in an off state, the voltage of the bit line BL coupled to the memory cell is maintained at the voltage based on Vblc-Vth (off-cell of the bit line BL in FIG. 14).

At time t1, the sequencer 13 sets the voltages of the control signals LPC and BLQ to Vlpc and Vblq, respectively. Also, the sequencer 13 supplies a voltage VDD2 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2o. When the voltage of the bit line BL is in an off-cell state, the voltage of the sense node SEN coupled to the bit line BL drops to VDD2f, which is higher than VDD2o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether the threshold voltage of the selected memory cell is equal to or greater than the read voltage KR, and stores the determination result in a latch circuit provided inside. This is the end of the read process using the read voltage KR.

Subsequently, at time t4, the row decoder module 15 applies the read voltage FR to the selected word line WLsel. This causes the voltage at the near end of the selected word line WLsel to drop to the read voltage FR, and causes the voltage at the far end of the selected word line WLsel to drop to the read voltage FR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage FR is applied to the selected word line WLsel. Specifically, when the selected memory cell is in an on state, the voltage of the bit line BL coupled to the memory cell drops (on-cell in FIG. 14). When the selected memory cell is in an off state, the voltage of the bit line BL coupled to the memory cell is maintained at the voltage based on Vblc-Vth (off-cell in FIG. 14).

At time t4, the sequencer 13 sets the voltages of the control signals LPC and BLQ to Vlpc and Vblq, respectively. Also, the sequencer 13 supplies a voltage VDD3 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD3. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD3o. When the voltage of the bit line BL is in an off-cell state, the voltage of the sense node SEN coupled to the bit line BL drops to VDD3$f$, which is higher than VDD3$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether the threshold voltage of the selected memory cell is equal to or greater than the read voltage FR, and stores the determination result in a latch circuit provided inside. This is the end of the read process using the read voltage FR.

Subsequently, at time t7, the row decoder module 15 applies the read voltage DR to the selected word line WLsel. This causes the voltage at the near end of the selected word line WLsel to drop to the read voltage DR, and causes the voltage at the far end of the selected word line WLsel to drop to the read voltage DR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage DR is applied to the selected word line WLsel. Specifically, when the selected memory cell is in an on state, the voltage of the bit line BL coupled to the memory cell drops (on-cell in FIG. 14). When the selected memory cell is in an off state, the voltage of the bit line BL coupled to the memory cell is maintained at the voltage based on Vblc-Vth (off-cell in FIG. 14).

At time t7, the sequencer 13 sets the voltages of the control signals LPC and BLQ to Vlpc and Vblq, respectively. Also, the sequencer 13 supplies a voltage VDD2 generated by the column driver 14$b$ to a node of the power-supply voltage VDD. When the voltages of the control signals LPC and BLQ reach Vlpc and Vblq, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2$o$. When the voltage of the bit line BL is in an off-cell state, the voltage of the sense node SEN coupled to the bit line BL drops to VDD2$f$, which is higher than VDD2$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether the threshold voltage of the selected memory cell is equal to or greater than the read voltage DR, and stores the determination result in a latch circuit provided inside. This is the end of the read process using the read voltage DR.

Subsequently, at time t10, the row decoder module 15 applies the read voltage AR to the selected word line WLsel. This causes the voltage at the near end of the selected word line WLsel to drop to the read voltage AR, and causes the voltage at the far end of the selected word line WLsel to drop to the read voltage AR with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage AR is applied to the selected word line WLsel. Specifically, when the selected memory cell is in an on state, the voltage of the bit line BL coupled to the memory cell drops (on-cell in FIG. 14). When the selected memory cell is in an off state, the voltage of the bit line BL coupled to the memory cell is maintained at the voltage based on Vblc-Vth (off-cell in FIG. 14).

At time t10, the sequencer 13 sets the voltages of the control signals LPC and BLQ to Vlpc and Vblq, respectively. Also, the sequencer 13 supplies a voltage VDD1 generated by the column driver 14$b$ to a node of the power-supply voltage VDD. When the voltages of the control signals LPC and BLQ reach Vlpc and Vblq, respectively, the transistors 33 and Tblq are turned on, and the sense node SEN is charged to the voltage VDD1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD1$o$. When the voltage of the bit line BL is in an off-cell state, the voltage of the sense node SEN coupled to the bit line BL drops to VDD1$f$, which is higher than VDD1$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether the threshold voltage of the selected memory cell is equal to or greater than the read voltage AR, and stores the determination result in a latch circuit provided inside. This is the end of the read process using the read voltage AR.

Subsequently, at time t13, the sequencer 13 confirms the lower-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

Figure 15:
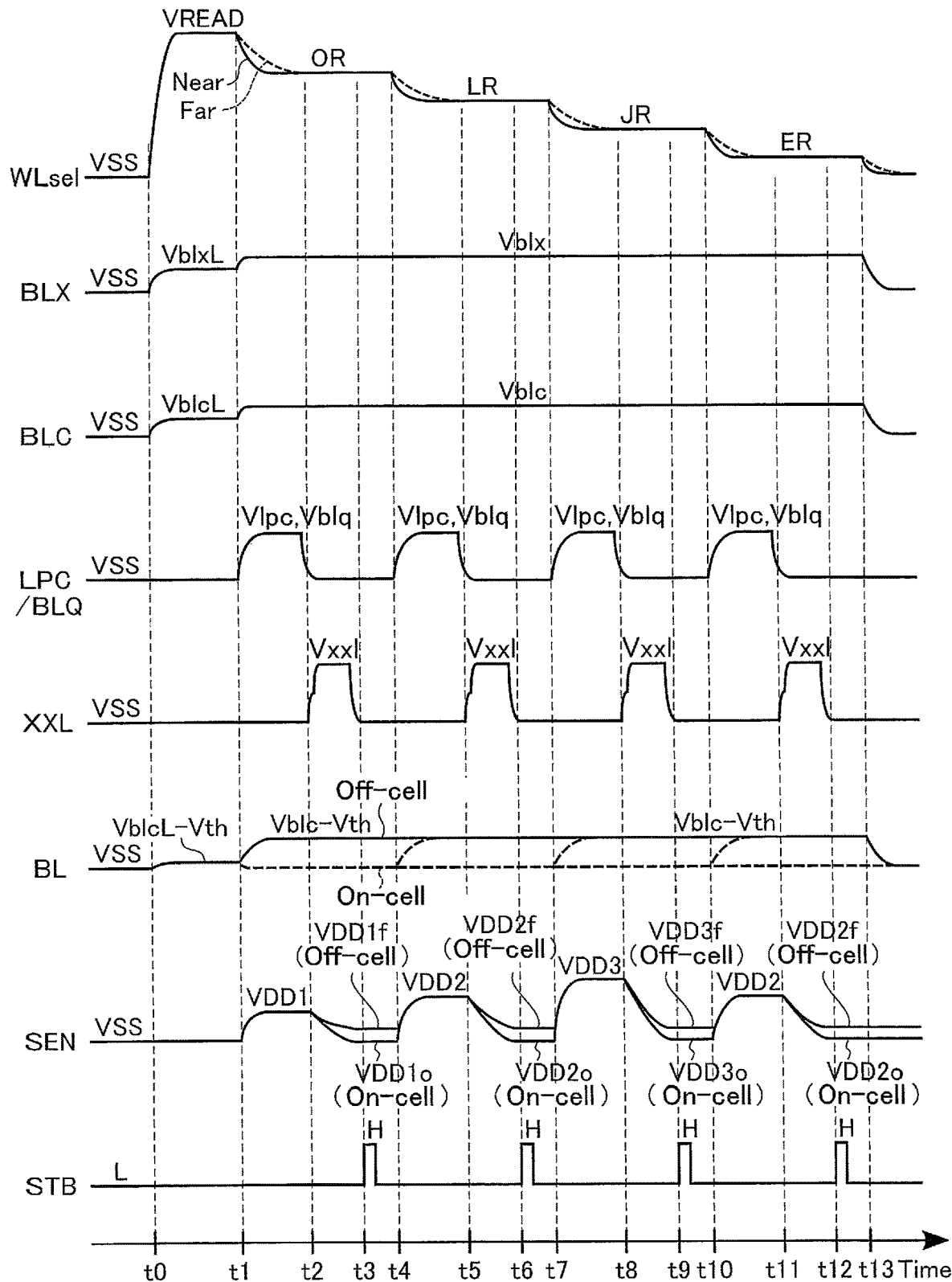
FIG. 15 is a diagram showing an example of a timing chart in a read operation of uppermost-page data according to the first embodiment.

Next, a read operation of the uppermost-page data will be described. FIG. 15 is a diagram showing an example of a timing chart in a read operation of the uppermost-page data according to the first embodiment.

In this example, the read voltages ER, JR, LR, and OR are used in a read operation of the uppermost-page data, and the read voltages are applied to the selected word line in the order of OR, LR, JR, and ER.

The read voltage OR corresponds to the first group G1. Accordingly, in a read operation using the read voltage OR, the initial voltage VSENP of the sense node SEN is set to the voltage VDD1. The read voltages LR and ER correspond to the second group G2. Accordingly, in a read operation using the read voltages LR and ER, the initial voltage VSENP of the sense node SEN is set to the voltage VDD2. Similarly, since the read voltage JR corresponds to the third group G3, the initial voltage VSENP of the sense node SEN is set to the voltage VDD3 in a read operation using the read voltage JR.

As shown in FIG. 15, in a read operation, the sequencer 13 performs, for example, an operation of removing residual electrons in the channel during the period from time t0 to time t1. Moreover, the sequencer 13 performs a read process using the read voltage OR during the period from time t1 to time t4, performs a read process using the read voltage LR during the period from time t4 to time t7, performs a read process using the read voltage JR during the period from time t7 to time t10, and performs a read process using the read voltage ER during the period from time t10 to time t13. Hereinafter, details of these operations will be described below Since the operation from the initial state prior to time t0 to time t1 is similar to the operation of the above-described lower-page data, the description thereof will be omitted, and the description will be given of the operation from time t1.

At time t1, the row decoder module 15 applies a read voltage OR to the selected word line WLsel. This causes the voltage at the near end of the selected word line WLsel to drop to the read voltage OR, and causes the voltage at the far end of the selected word line WLsel to drop to the read voltage OR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage OR is applied to the selected word line WLsel. Specifically, when the selected memory cell is in an on state, the voltage of the bit line BL coupled to the memory cell drops (on-cell of the bit line BL in FIG. 15). When the selected memory cell is in an off state, the voltage of the bit line BL coupled to the memory cell is maintained at the voltage based on Vblc-Vth (off-cell of the bit line BL in FIG. 15).

At time t1, the sequencer 13 sets the voltages of the control signals LPC and BLQ to Vlpc and Vblq, respectively. Also, the sequencer 13 supplies a voltage VDD1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD1o. When the voltage of the bit line BL is in an off-cell state, the voltage of the sense node SEN coupled to the bit line BL drops to VDD1f, which is higher than VDD1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether the threshold voltage of the selected memory cell is equal to or greater than the read voltage OR, and stores the determination result in a latch circuit provided inside. This is the end of the read process using the read voltage OR.

Subsequently, at time t4, the row decoder module 15 applies the read voltage LR to the selected word line WLsel. This causes the voltage at the near end of the selected word line WLsel to drop to the read voltage LR, and causes the voltage at the far end of the selected word line WLsel to drop to the read voltage LR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage LR is applied to the selected word line WLsel. Specifically, when the selected memory cell is in an on state, the voltage of the bit line BL coupled to the memory cell drops (on-cell in FIG. 15). When the selected memory cell is in an off state, the voltage of the bit line BL coupled to the memory cell is maintained at the voltage based on Vblc-Vth (off-cell in FIG. 15).

At time t4, the sequencer 13 sets the voltages of the control signals LPC and BLQ to Vlpc and Vblq, respectively. Also, the sequencer 13 supplies a voltage VDD2 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2o. When the voltage of the bit line BL is in an off-cell state, the voltage of the sense node SEN coupled to the bit line BL drops to VDD2f, which is higher than VDD2o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether the threshold voltage of the selected memory cell is equal to or greater than the read voltage LR, and stores the determination result in a latch circuit provided inside. This is the end of the read process using the read voltage LR.

Subsequently, at time t7, the row decoder module 15 applies the read voltage JR to the selected word line WLsel. This causes the voltage at the near end of the selected word line WLsel to drop to the read voltage JR, and causes the voltage at the far end of the selected word line WLsel to drop to the read voltage JR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage JR is applied to the selected word line WLsel. Specifically, when the selected memory cell is in an on state, the voltage of the bit line BL coupled to the memory cell drops (on-cell in FIG. 15). When the selected memory cell is in an off state, the voltage of the bit line BL coupled to the memory cell is maintained at the voltage based on Vblc-Vth (off-cell in FIG. 15).

At time t7, the sequencer 13 sets the voltages of the control signals LPC and BLQ to Vlpc and Vblq, respectively. Also, the sequencer 13 supplies a voltage VDD3 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD3. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD3o. When the voltage of the bit line BL is in an off-cell state, the voltage of the sense node SEN coupled to the bit line BL drops to VDD3f, which is higher than VDD3o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether the threshold voltage of the selected memory cell is equal to or greater than the read voltage JR, and stores the determination result in a latch circuit provided inside. This is the end of the read process using the read voltage JR.

Subsequently, at time t10, the row decoder module 15 applies the read voltage ER to the selected word line WLsel. This causes the voltage at the near end of the selected word line WLsel to drop to the read voltage ER, and causes the voltage at the far end of the selected word line WLsel to drop to the read voltage ER with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage ER is applied to the selected word line WLsel. Specifically, when the selected memory cell is in an on state, the voltage of the bit line BL coupled to the memory cell drops (on-cell in FIG. 15). When the selected memory cell is in an off state, the voltage of the bit line BL coupled to the memory cell is maintained at the voltage based on Vblc-Vth (off-cell in FIG. 15).

At time t10, the sequencer 13 sets the voltages of the control signals LPC and BLQ to Vlpc and Vblq, respectively. Also, the sequencer 13 supplies a voltage VDD2 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2o. When the voltage of the bit line BL is in an off-cell state, the voltage of the sense node SEN coupled to the bit line BL drops to VDD2f, which is higher than VDD2o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether the threshold voltage of the selected memory cell is equal to or greater than the read voltage ER, and stores the determination result in a latch circuit provided inside. This is the end of the read process using the read voltage ER.

Subsequently, at time t13, the sequencer 13 confirms the uppermost-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

As described above, the semiconductor memory device 1 of the first embodiment is capable of performing a read operation of the lower-page data and the uppermost-page data. In a read operation of each of the middle-page data and the upper-page data, the semiconductor memory device 1 of the first embodiment is capable of performing a read operation by varying the initial voltage VSENP of the sense node SEN according to the grouping shown in FIG. 13, similarly to the read operation of the lower-page data and the uppermost-page data.

1. 3 Advantageous Effects of First Embodiment

The semiconductor memory device 1 according to the first embodiment is capable of improving reliability of the semiconductor memory device 1 in a read operation. Hereinafter, a description will be given of the semiconductor memory device 1 according to the first embodiment.

To achieve increased capacity of semiconductor memory devices at a low cost, it is effective to store a larger number of bits in a single memory cell transistor MT, namely, to employ multi-level cell. For this reason, storage system such as quad-level cells (QLCs), which use threshold voltage distributions of 16 states, and penta-level cells (PLCs), which use threshold voltage distributions of 32 states, for example, is employed. When the QLC or PLC is employed, however, the amount of overlap between the threshold voltage distributions of neighboring states may increase. As the amount of overlap between the threshold voltage distributions increases, high reading precision is required for the sense amplifier unit SAU, which reads data from the memory cell transistors MT.

A description will be given of the type of failed bits (erroneously read data) in the semiconductor memory device 1, with reference to FIG. 16. FIG. 16 is a diagram showing an example of failed bits between two neighboring states in the semiconductor memory device 1 according to the first embodiment. In the threshold voltage distributions shown in FIG. 16, the vertical axis represents the number NMTs of the memory cell transistors MT, and the horizontal axis represents the threshold voltage Vth of the memory cell transistors MT. One of the two states corresponds to "1" data, and the other state corresponds to "0" data. VCG refers to a read voltage set between the state distribution of "1" data and the state distribution of "0" data.

As shown in FIG. 16(a), an overlapping region may be formed between two neighboring states' distributions. In FIG. 16(a), the amounts of overlap between the two neighboring states' distributions are added. In FIGS. 16(b) and 16(c), the overlapping region between the two neighboring states' distributions is shown, with the state corresponding to "1" data and "0" data, respectively, shown by the solid line and the other state shown by the dashed line.

As shown in FIG. 16(b), in the state distribution corresponding to "1" data, the data of memory cell transistors MT with a threshold voltage equal to or greater than the read voltage VCG becomes failed bits. Upon detecting a change from "1" data to "0" data in an error correction process, the failed bits are corrected to "1" data.

As shown in FIG. 16(c), in the state distribution corresponding to "0" data, the data of memory cell transistors MT with a threshold voltage less than the read voltage VCG becomes failed bits. Upon detecting a change from "0" data to "1" data in an error correction process, the failed bits are corrected to "0" data.

The definitions of data in the two neighboring states' distributions shown in FIG. 16 may be interchanged. Of the two neighboring states' distributions, failed bits generated at the upper tail of the lower-voltage state will be referred to as upper-tail failed bits TFB, and failed bits generated at the lower tail of the higher-voltage state will be referred to as lower-tail failed bits BFB. The number of upper-tail failed bits TFB will be referred to as upper-tail failed bit count TFBC, and the number of lower-tail failed bits BFB will be referred to as lower-tail failed bit count BFBC.

Figures 17, 18:
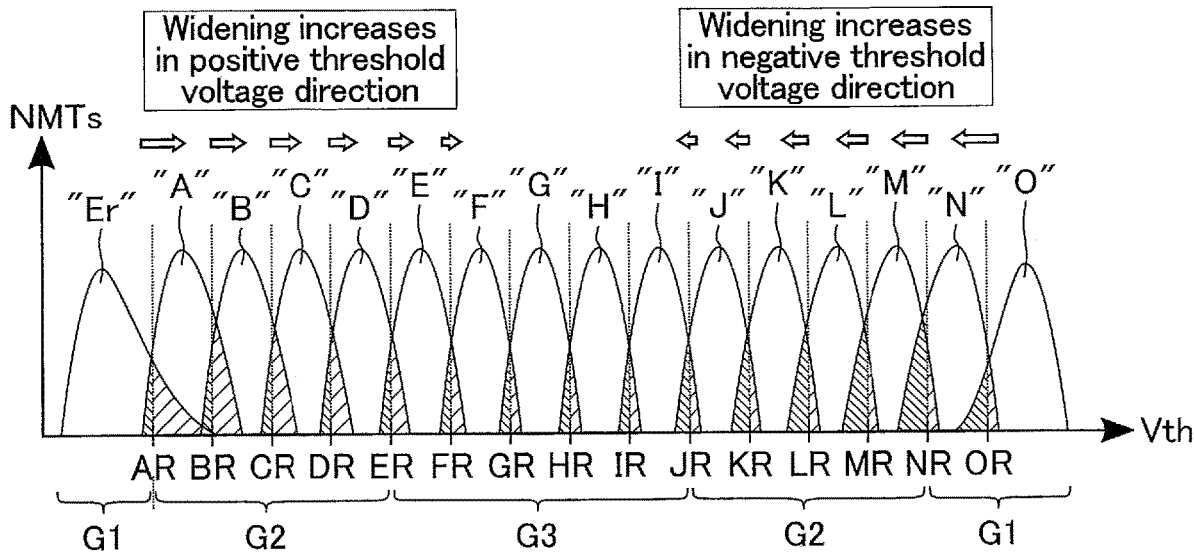
FIG. 17 is a diagram showing an example of threshold voltage distributions of memory cell transistors according to the first embodiment.
FIG. 18 is a diagram showing a setting example of a discharge time of a sense node in a read operation according to a second embodiment.

FIG. 17 is a diagram showing an example of threshold voltage distributions of memory cell transistors MT in the case of QLC-based data storage. As shown in FIG. 17, in the threshold voltage distributions of the 16 states in the QLC, the threshold voltage distribution of a lower-voltage state and the threshold voltage distribution of a higher-voltage state have different voltage window shapes. Specifically, the threshold voltage distribution of a lower-voltage state, for example, tends to widen in the positive direction of the threshold voltage, namely, tends to have a larger upper tail. The threshold voltage distribution of a higher-voltage state tends to widen in the negative direction of the threshold voltage, namely, tends to have a larger lower tail. The amounts of widening of the lower tails and the upper tails tends to decrease in the threshold voltage distribution of a state corresponding to a threshold voltage closer to an intermediate threshold voltage.

In the QLC, the threshold voltage distributions of the 16 states are categorized into, for example, the following three groups: a first group G1 including Er-state, N-state, and O-state distributions with a wide upper or lower tail; a third group G3 including E-state to I-state distributions with a narrow upper or lower tail; and a second group G2 including A-state to D-state and J-state to M-state distributions with a upper or lower tail of a width that is intermediate between those of the first group G1 and the second group G2, as shown in FIG. 13.

The upper-tail failed bit count TFBC or the lower-tail failed bit count BFBC of the first group G1 tends to be greater than those of the second group G2 and the third group G3. The upper-tail failed bit count TFBC or the lower-tail failed bit count BFBC of the second group G2 tends to be smaller than that of the first group G1 and greater than that of the third group G3. The upper-tail failed bit count TFBC or the lower-tail failed bit count BFBC of the third group G3 tends to be smaller than those of the first group G1 and the second group G2.

In a read operation, the semiconductor memory device 1 according to the first embodiment varies the initial voltage VSENP of the sense node SEN in the sense amplifier unit SAU according to the group with which the read voltage is associated or the group to which the state distribution belongs. In other words, the initial voltage VSENP of the sense node SEN is optimized according to the state of overlap of the threshold voltage distributions of two neighboring states, namely, the magnitude of the failed bit count.

Specifically, in the semiconductor memory device 1 according to the first embodiment, when, for example, a read voltage corresponding to a state distribution belonging to the first group G1 is used, the initial voltage VSENP of the sense node SEN is set to VDD1. When a read voltage corresponding to a state distribution belonging to the second group G2 is used, the initial voltage VSENP of the sense node SEN is set to VDD2. When a read voltage corresponding to a state distribution belonging to the third group G3 is used, the initial voltage VSENP of the sense node SEN is set to VDD3.

It is thereby possible to suppress the upper-tail failed bit count TFBC or the lower-tail failed bit count BFBC in a read operation. Consequently, the semiconductor memory device 1 according to the first embodiment is capable of improving reliability in a read operation.

In the above-described first embodiment, the threshold voltage distributions of the states that the memory cell transistors MT are in are divided into three groups: first, second, and third groups; however, the configuration is not limited thereto, and the threshold voltage distributions may be divided into two groups or four or more groups, allowing the initial voltage VSENP of the sense node SEN to be varied according to the group. For example, the initial voltage VSENP of the sense node SEN may be varied according to the group by dividing the threshold voltage distributions into five groups, with the J-state to M-state distributions belonging to a fourth group instead of the second group G2, and the O-state and N-state distributions belonging to a fifth group instead of the first group G1.

In the above description, the voltage to be supplied to the node of the voltage VDD is changed to one of the voltages VDD1, VDD2, and VDD3 to change the initial voltage VSENP of the sense node SEN; however, the configuration is not limited thereto, and the initial voltage VSENP of the sense node SEN may be varied by adjusting the voltages of the control signals LPC and BLQ or by adjusting the period during which the control signals LPC and BLQ are asserted.

A memory cell transistor MT included in the semiconductor memory device 1 may take either a fresh state in which neither a write operation nor an erase operation is performed, or a run state in which a write operation and an erase operation are performed multiple times. The memory cell transistor MT may be configured in such a manner, for example, that, in the fresh state, the initial voltage VSENP of the sense node SEN is set to the voltage VDD1, and, in the run state, the initial voltage VSENP of the sense node SEN is set to a voltage different from the voltage VDD1. The memory cell transistor MT may be configured in such a manner, for example, that, in the fresh state, the initial voltage VSENP of the sense node SEN is set to the voltage VDD1, and, in the run state, the initial voltage VSENP of the sense node SEN is set to a higher or lower voltage than the voltage VDD1. The fresh state may include not only the state in which a write operation and an erase operation are not performed, but also the state in which the number of times of performing a write operation and an erase operation is equal to or smaller than a first number, and the run state may include the case where the number of times of performing a write operation and an erase operation is greater than the first number.

2. SECOND EMBODIMENT

Next, a semiconductor memory device according to the second embodiment will be described. In a read operation, the semiconductor memory device 1 according to the second embodiment varies a discharge time tSEN (sense time) of a sense node SEN based on the read voltage or the state of a read target. The discharge time tSEN of the sense node SEN refers to a period of time during which a control signal XXL is asserted, and refers to a period of time during which the initial voltage of the sense node SEN is discharged according to the voltage of the bit line BL (or the state of the selected memory cell).

In the second embodiment, the description will focus mainly on features that are different from those of the first embodiment. Configurations that will not be described below, such as the overall configuration, the circuit configuration, and the structure of the semiconductor memory device 1 are the same as those of the first embodiment.

2. 1 Operation of Semiconductor Memory Device 1

The read voltages AR, BR, CR, DR, ER, FR, GR, HR, IR, JR, KR, LR, MR, NR, and OR, which are used in a read operation, are classified into a plurality of groups, and a discharge time tSEN of the sense node SEN is set for each group.

FIG. 18 is a diagram showing a setting example of the discharge time tSEN of the sense node SEN in a read operation of the second embodiment. As shown in FIG. 18, the read voltages are categorized into, for example, three groups: a first group G1; a second group G2; and a third group G3, and the discharge time tSEN of the sense node SEN is set for each group. For the read voltages AR and OR belonging to the first group G1, the discharge time tSEN of the sense node SEN is set to a time TSEN1. For the read voltages BR to ER and KR to NR belonging to the second group G2, the discharge time tSEN of the sense node SEN is set to a time tSEN2. For the read voltages FR to JR belonging to the third group G3, the discharge time tSEN of the sense node SEN is set to a time tSEN3.

The time tSEN2 is longer than the time tSEN3, and the time tSEN1 is longer than the time tSEN2. That is, the voltages tSEN1, tSEN2, and tSEN3 satisfy the following magnitude relationship: tSEN1>tSEN2>tSEN3.

Figure 19:
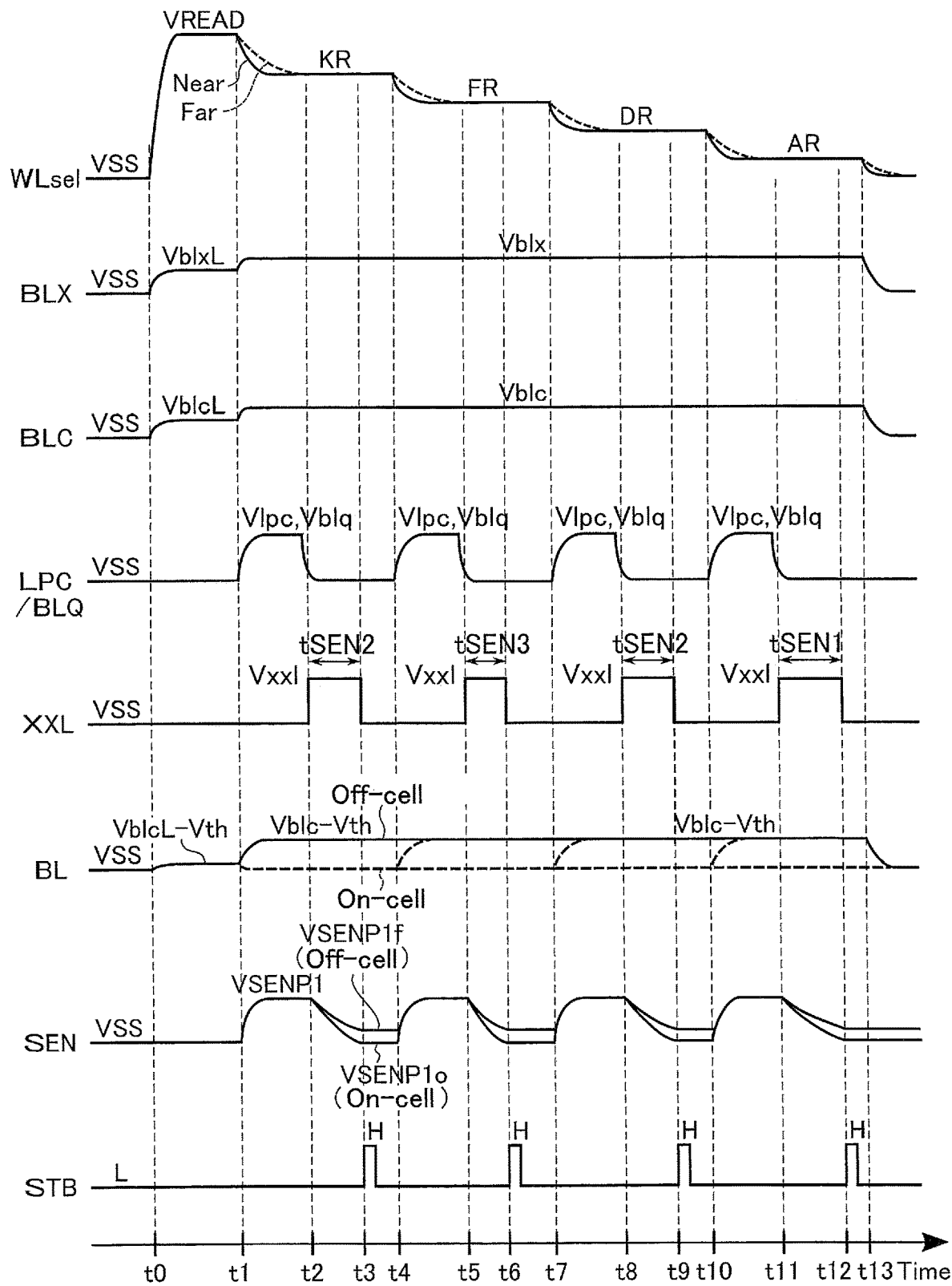
FIG. 19 is a diagram showing an example of a timing chart in a read operation of lower-page data according to the second embodiment.

Hereinafter, a concrete example of a read operation according to the second embodiment will be described by taking a read operation of the lower-page data and the uppermost-page data as an example. A read operation of the lower-page data will be described. FIG. 19 is a diagram showing an example of a timing chart in a read operation of the lower-page data according to the second embodiment.

In this example, the read voltages AR, DR, FR, and KR are used in a read operation of the lower-page data, and the read voltages are applied to the selected word line in the order of KR, FR, DR, and AR, similarly to the first embodiment.

The read voltages KR and DR correspond to the second group G2. Accordingly, in a read operation using the read voltages KR and DR, the discharge time tSEN of the sense node SEN is set to the time tSEN2. The read voltage FR corresponds to the third group G3. Accordingly, in a read operation using the read voltage FR, the discharge time tSEN of the sense node SEN is set to the time tSEN3. Similarly, since the read voltage AR corresponds to the first group G1, the discharge time tSEN of the sense node SEN is set to the time tSEN1 in a read operation using the read voltage AR. As described above, tSEN1>tSEN2>tSEN3 is satisfied.

As shown in FIG. 19, in a read operation, the sequencer (control circuit) 13 performs, for example, an operation of removing residual electrons in the channel during the period from time t0 to time t1. Moreover, the sequencer 13 performs a read process using the read voltage KR during the period from time t1 to time t4, performs a read process using the read voltage FR during the period from time t4 to time t7, performs a read process using the read voltage DR during the period from time t7 to time t10, and performs a read process using the read voltage AR during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage KR to the selected word line WLsel. This causes the voltage at the near end of the selected word line WLsel to drop to the read voltage KR, and causes the voltage at the far end of the selected word line WLsel to drop to the read voltage KR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage KR is applied to the selected word line WLsel. Specifically, when the selected memory cell is in an on state, the voltage of the bit line BL coupled to the memory cell drops (on-cell of the bit line BL in FIG. 19). When the selected memory cell is in an off state, the voltage of the bit line BL coupled to the memory cell is maintained at the voltage based on Vblc-Vth (off-cell of the bit line BL in FIG. 19).

At time t1, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

The sequencer 13 increases the voltage of the control signal XXL from VSS to Vxxl, and sets the period of time during which the voltage is dropped to VSS to the discharge time tSEN2. That is, the period of time during which the control signal XXL is asserted is set to tSEN2. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage KR, and stores the determination result in a latch circuit provided inside. This is the end of the read process using the read voltage KR.

Subsequently, at time t4, the row decoder module 15 applies the read voltage FR to the selected word line WLsel. This causes the voltage at the near end of the selected word line WLsel to drop to the read voltage FR, and causes the voltage at the far end of the selected word line WLsel to drop to the read voltage FR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage FR is applied to the selected word line WLsel. Specifically, when the selected memory cell is in an on state, the voltage of the bit line BL coupled to the memory cell drops (on-cell in FIG. 19). When the selected memory cell is in an off state, the voltage of the bit line BL coupled to the memory cell is maintained at the voltage based on Vblc-Vth (off-cell in FIG. 19).

At time t4, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

The sequencer 13 increases the voltage of the control signal XXL from VSS to Vxxl, and sets the period of time during which the voltage is dropped to VSS to the discharge time tSEN3. That is, the period of time during which the control signal XXL is asserted is set to tSEN3. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage FR, and stores the determination result in a latch circuit provided inside. This is the end of the read process using the read voltage FR.

Subsequently, at time t7, the row decoder module 15 applies the read voltage DR to the selected word line WLsel. This causes the voltage at the near end of the selected word line WLsel to drop to the read voltage DR, and causes the voltage at the far end of the selected word line WLsel to drop to the read voltage DR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage DR is applied to the selected word line WLsel. Specifically, when the selected memory cell is in an on state, the voltage of the bit line BL coupled to the memory cell drops (on-cell in FIG. 19). When the selected memory cell is in an off state, the voltage of the bit line BL coupled to the memory cell is maintained at the voltage based on Vblc-Vth (off-cell in FIG. 19).

At time t7, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

The sequencer 13 increases the voltage of the control signal XXL from VSS to Vxxl, and sets the period of time during which the voltage is dropped to VSS to the discharge time tSEN2. That is, the period of time during which the control signal XXL is asserted is set to tSEN2. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage DR, and stores the determination result in a latch circuit provided inside. This is the end of the read process using the read voltage DR.

Subsequently, at time t10, the row decoder module 15 applies the read voltage AR to the selected word line WLsel. This causes the voltage at the near end of the selected word line WLsel to drop to the read voltage AR, and causes the voltage at the far end of the selected word line WLsel to drop to the read voltage AR with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage AR is applied to the selected word line WLsel. Specifically, when the selected memory cell is in an on state, the voltage of the bit line BL coupled to the memory cell drops (on-cell in FIG. 19). When the selected memory cell is in an off state, the voltage of the bit line BL coupled to the memory cell is maintained at the voltage based on Vblc-Vth (off-cell in FIG. 19).

At time t10, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

The sequencer 13 increases the voltage of the control signal XXL from VSS to Vxxl, and sets the period of time during which the voltage is dropped to VSS to the discharge time tSEN1. That is, the period of time during which the control signal XXL is asserted is set to tSEN1. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage AR, and stores the determination result in a latch circuit provided inside. This is the end of the read process using the read voltage AR.

Subsequently, at time t13, the sequencer 13 confirms the lower-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

Figure 20:
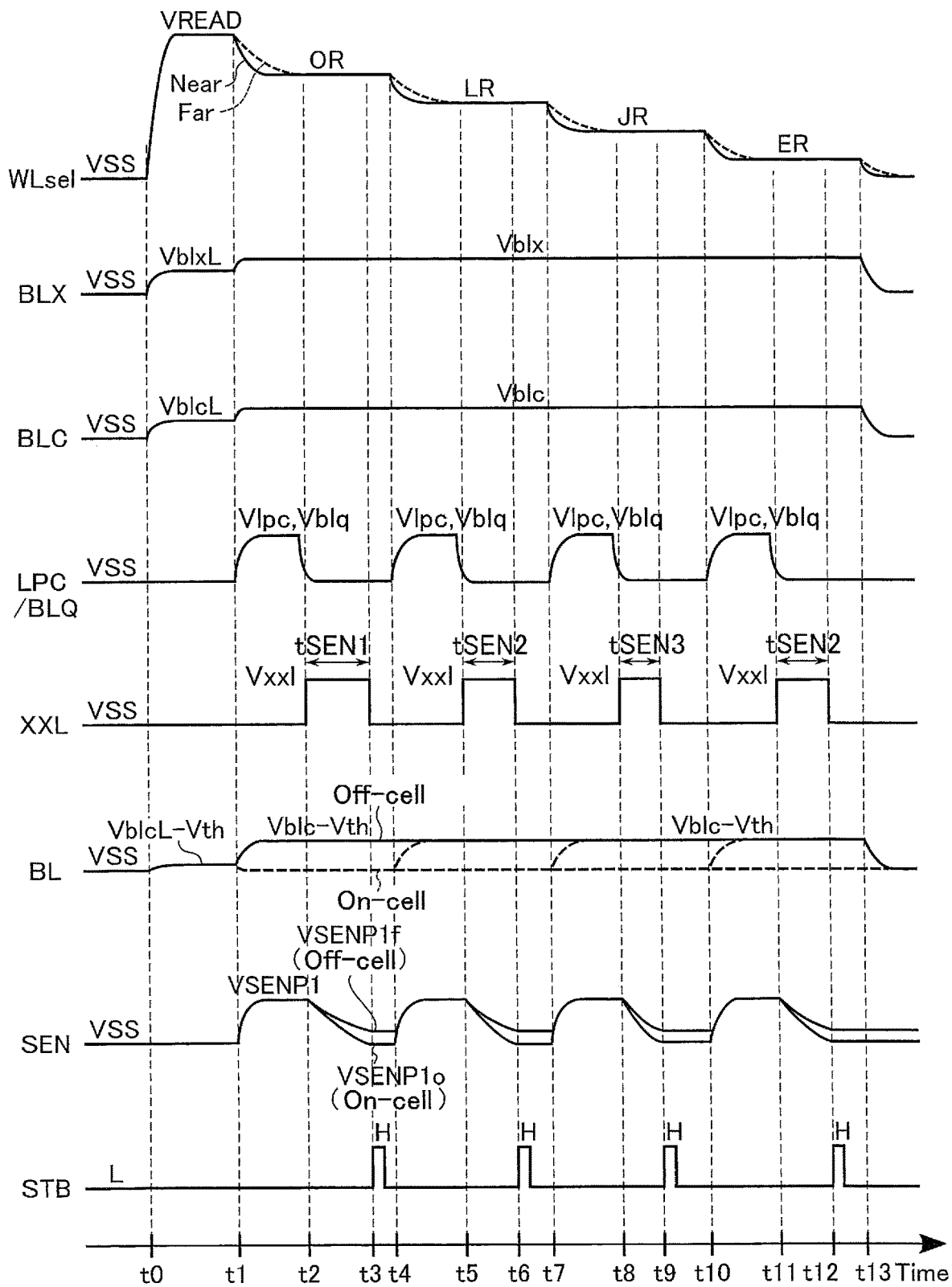
FIG. 20 is a diagram showing an example of a timing chart in a read operation of uppermost-page data according to the second embodiment.

Next, a read operation of the uppermost-page data will be described. FIG. 20 is a diagram showing an example of a timing chart in a read operation of the uppermost-page data according to the second embodiment.

In this example, the read voltages ER, JR, LR, and OR are used in a read operation of the uppermost-page data, and the read voltages are applied to the selected word line in the order of OR, LR, JR, and ER, similarly to the first embodiment.

The read voltage OR corresponds to the first group G1. Accordingly, in a read operation using the read voltage OR, the discharge time tSEN of the sense node SEN is set to the time tSEN1 The read voltages LR and ER correspond to the second group G2. Accordingly, in a read operation using the read voltages LR and ER, the discharge time tSEN of the sense node SEN is set to the time tSEN2. Similarly, since the read voltage JR corresponds to the third group G3, the discharge time tSEN of the sense node SEN is set to the time tSEN3 in a read operation using the read voltage JR.

As shown in FIG. 20, in a read operation, the sequencer 13 performs, for example, an operation of removing residual electrons in the channel during the period from time t0 to time t1. Moreover, the sequencer 13 performs a read process using the read voltage OR during the period from time t1 to time t4, performs a read process using the read voltage LR during the period from time t4 to time t7, performs a read process using the read voltage JR during the period from time t7 to time t10, and performs a read process using the read voltage ER during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage OR to the selected word line WLsel. This causes the voltage at the near end of the selected word line WLsel to drop to the read voltage OR, and causes the voltage at the far end of the selected word line WLsel to drop to the read voltage OR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage OR is applied to the selected word line WLsel. Specifically, when the selected memory cell is in an on state, the voltage of the bit line BL coupled to the memory cell drops (on-cell of the bit line BL in FIG. 20). When the selected memory cell is in an off state, the voltage of the bit line BL coupled to the memory cell is maintained at the voltage based on Vblc-Vth (off-cell of the bit line BL in FIG. 20)

At time t1, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

The sequencer 13 increases the voltage of the control signal XXL from VSS to Vxxl, and sets the period of time during which the voltage is dropped to VSS to the discharge time tSEN1. That is, the period of time during which the control signal XXL is asserted is set to tSEN1. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage OR, and stores the determination result in a latch circuit provided inside. This is the end of the read process using the read voltage OR.

Subsequently, at time t4, the row decoder module 15 applies the read voltage LR to the selected word line WLsel. This causes the voltage at the near end of the selected word line WLsel to drop to the read voltage LR, and causes the voltage at the far end of the selected word line WLsel to drop to the read voltage LR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage LR is applied to the selected word line WLsel. Specifically, when the selected memory cell is in an on state, the voltage of the bit line BL coupled to the memory cell drops (on-cell in FIG. 20). When the selected memory cell is in an off state, the voltage of the bit line BL coupled to the memory cell is maintained at the voltage based on Vblc-Vth (off-cell in FIG. 20).

At time t4, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

The sequencer 13 increases the voltage of the control signal XXL from VSS to Vxxl, and sets the period of time during which the voltage is dropped to VSS to the discharge time tSEN2. That is, the period of time during which the control signal XXL is asserted is set to tSEN2. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage LR, and stores the determination result in a latch circuit provided inside. This is the end of the read process using the read voltage LR.

Subsequently, at time t7, the row decoder module 15 applies the read voltage JR to the selected word line WLsel. This causes the voltage at the near end of the selected word line WLsel to drop to the read voltage JR, and causes the voltage at the far end of the selected word line WLsel to drop to the read voltage JR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage JR is applied to the selected word line WLsel. Specifically, when the selected memory cell is in an on state, the voltage of the bit line BL coupled to the memory cell drops (on-cell in FIG. 20). When the selected memory cell is in an off state, the voltage of the bit line BL coupled to the memory cell is maintained at the voltage based on Vblc-Vth (off-cell in FIG. 20)

At time t7, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

The sequencer 13 increases the voltage of the control signal XXL from VSS to Vxxl, and sets the period of time during which the voltage is dropped to VSS to the discharge time tSEN3. That is, the period of time during which the control signal XXL is asserted is set to tSEN3. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage JR, and stores the determination result in a latch circuit provided inside. This is the end of the read process using the read voltage JR.

Subsequently, at time t10, the row decoder module 15 applies the read voltage ER to the selected word line WLsel. This causes the voltage at the near end of the selected word line WLsel to drop to the read voltage ER, and causes the voltage at the far end of the selected word line WLsel to drop to the read voltage ER with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage ER is applied to the selected word line WLsel. Specifically, when the selected memory cell is in an on state, the voltage of the bit line BL coupled to the memory cell drops (on-cell in FIG. 20). When the selected memory cell is in an off state, the voltage of the bit line BL coupled to the memory cell is maintained at the voltage based on Vblc-Vth (off-cell in FIG. 20).

At time t10, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

The sequencer 13 increases the voltage of the control signal XXL from VSS to Vxxl, and sets the period of time during which the voltage is dropped to VSS to the discharge time tSEN2. That is, the period of time during which the control signal XXL is asserted is set to tSEN2. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage ER, and stores the determination result in a latch circuit provided inside. This is the end of the read process using the read voltage ER.

Subsequently, at time t13, the sequencer 13 confirms the uppermost-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

As described above, the semiconductor memory device 1 of the second embodiment is capable of performing a read operation of the lower-page data and the uppermost-page data. In a read operation of each of the middle-page data and the upper-page data, the semiconductor memory device 1 of the second embodiment is capable of performing a read operation by varying the discharge time tSEN (sense time) of the sense node SEN according to the grouping shown in FIG. 21, similarly to the read operation of the lower-page data and the uppermost-page data.

2. 2 Advantageous Effect of Second Embodiment

The semiconductor memory device 1 according to the second embodiment is capable of improving reliability in a read operation of the semiconductor memory device 1. Hereinafter, a description will be given of an advantageous effect of the semiconductor memory device 1 according to the second embodiment.

In a read operation, the semiconductor memory device 1 according to the second embodiment varies the discharge time tSEN of the sense node SEN in the sense amplifier unit SAU according to the group with which the read voltage is associated or the group to which the state distribution belongs. In other words, the discharge time tSEN of the sense node SEN is optimized according to the state of overlap of the threshold voltage distributions of two neighboring states, namely, the magnitude of the failed bit count.

Specifically, in the semiconductor memory device 1 according to the second embodiment, when, for example, a read voltage corresponding to a state distribution belonging to the first group G1 is used, the discharge time tSEN of the sense node SEN is set to tSEN1. When a read voltage corresponding to a state distribution belonging to the second group G2 is used, the discharge time tSEN of the sense node SEN is set to tSEN2. Furthermore, when a read voltage corresponding to a state distribution belonging to the third group G3 is used, the discharge time tSEN of the sense node SEN is set to tSEN3.

It is thereby possible to suppress the upper-tail failed bit count TFBC or the lower-tail failed bit count BFBC in a read operation. Consequently, the semiconductor memory device 1 according to the second embodiment is capable of improving reliability in a read operation.

In the above-described second embodiment, the threshold voltage distributions of the states that the memory cell transistors MT are in are divided into three groups: first, second, and third groups; however, the configuration is not limited thereto, and the threshold voltage distributions may be divided into two groups or four or more groups, allowing the discharge time tSEN of the sense node SEN to be varied according to the group. For example, the discharge time tSEN of the sense node SEN may be varied according to the group by dividing the threshold voltage distributions into five groups, with the J-state to M-state distributions belonging to a fourth group instead of the second group G2, and the O-state and N-state distributions belonging to a fifth group instead of the first group G1.

A memory cell transistor MT included in the semiconductor memory device 1 may take either a fresh state in which neither a write operation nor an erase operation is performed (or a state in which the number of performances is equal to or smaller than a first number), or a run state in which a write operation and an erase operation are performed multiple times (or a state in which the number of performances is greater than the first number). The memory cell transistor MT may be configured in such a manner, for example, that, in the fresh state, the discharge time tSEN of the sense node SEN is set to the time tSEN1, and, in the run state, the discharge time tSEN of the sense node SEN is set to a time different from the time tSEN1. The memory cell transistor MT may be configured in such a manner, for example, that, in the fresh state, the discharge time tSEN of the sense node SEN is set to the time tSEN1, and, in the run state, the discharge time tSEN of the sense node SEN is set to a time longer or shorter than the time tSEN1.

3. THIRD EMBODIMENT

Next, a semiconductor memory device according to the third embodiment will be described. In a read operation, the semiconductor memory device 1 according to the third embodiment varies a voltage LOP of a source of a sense transistor Tsen based on the read voltage or the state of a read target.

In the third embodiment, the description will focus mainly on features that are different from those of the first embodiment. Configurations that will not be described below, such as the overall configuration, the circuit configuration, and the structure of the semiconductor memory device 1 are the same as those of the first embodiment.

3. 1 Operation of Semiconductor Memory Device 1

The read voltages AR, BR, CR, DR, ER, FR, GR, HR, IR, JR, KR, LR, MR, NR, and OR, which are used in a read operation, are classified into a plurality of groups, and a source voltage LOP of the sense transistor Tsen is set for each group.

FIG. 21 is a diagram showing a setting example of a source voltage LOP of the sense transistor Tsen in a read operation of the third embodiment. As shown in FIG. 21, the read voltages are categorized into, for example, three groups: a first group G1; a second group G2; and a third group G3, and the source voltage LOP of the sense transistor Tsen is set for each group. For the read voltages AR and OR belonging to the first group G1, the source voltage LOP of the sense transistor Tsen is set to the voltage LOP1 For the read voltages BR to ER and KR to NR belonging to the second group G2, the source voltage LOP of the sense transistor Tsen is set to a voltage LOP2. For the read voltages FR to JR belonging to the third group G3, the source voltage LOP of the sense transistor Tsen is set to the voltage LOP3.

The voltage LOP3 is higher than the voltage LOP2, and the voltage LOP1 is higher than the voltage LOP2. That is, the voltages LOP1, LOP2, and LOP3 satisfy the following magnitude relationship: LOP1>LOP2>LOP3.

Figure 22:
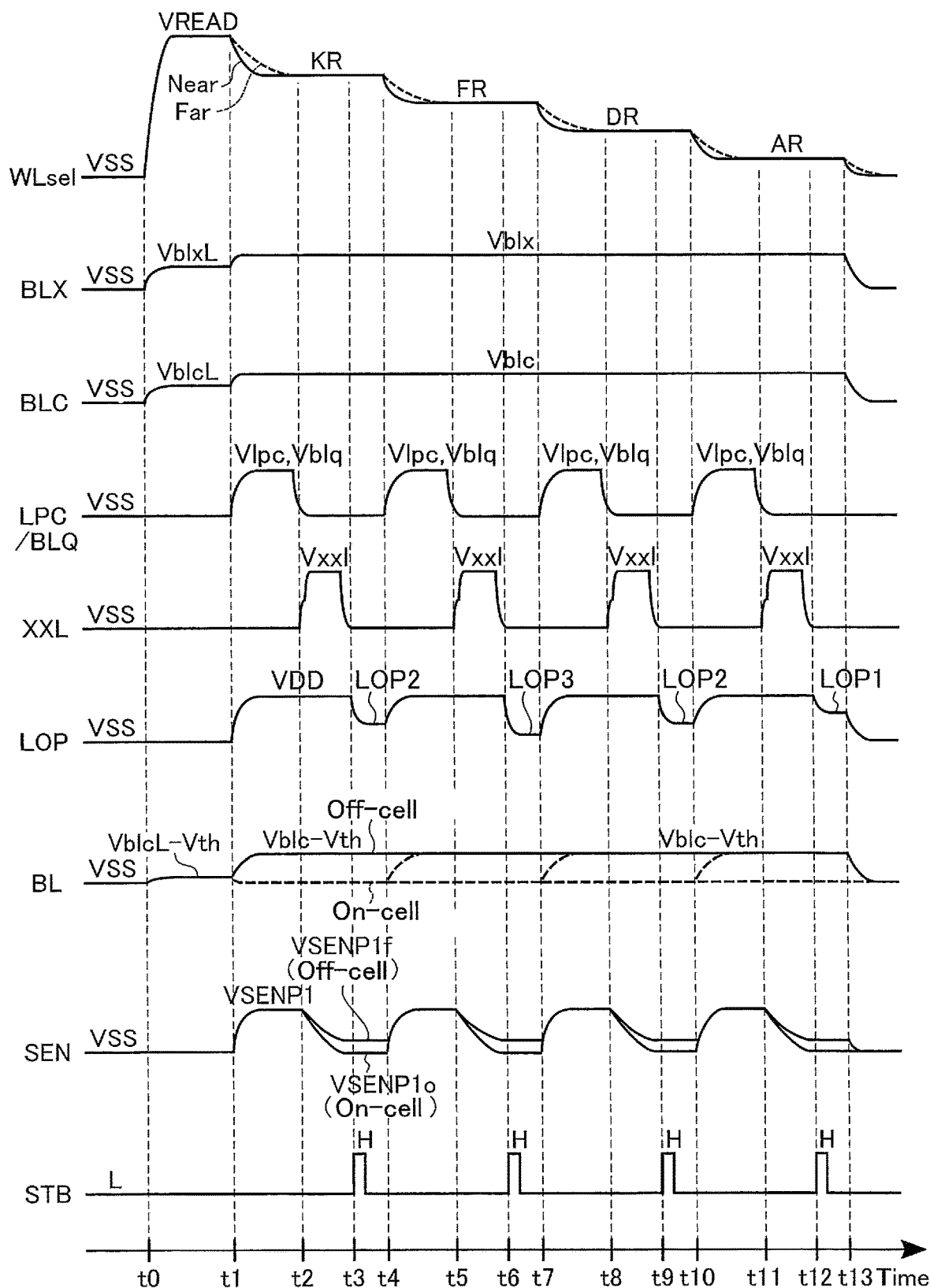
FIG. 22 is a diagram showing an example of a timing chart in a read operation of lower-page data according to the third embodiment.

Hereinafter, a concrete example of a read operation according to the third embodiment will be described by taking a read operation of the lower-page data and the uppermost-page data as an example. A read operation of the lower-page data will be described. FIG. 22 is a diagram showing an example of a timing chart in a read operation of the lower-page data according to the third embodiment.

In this example, the read voltages AR, DR, FR, and KR are used in a read operation of the lower-page data, and the read voltages are applied to the selected word line in the order of KR, FR, DR, and AR, similarly to the first embodiment.

The read voltages KR and DR correspond to the second group G2. Accordingly, in a read operation using the read voltages KR and DR, the source voltage LOP of the sense transistor Tsen is set to the voltage LOP2. The read voltage FR corresponds to the third group G3. Accordingly, in a read operation using the read voltage FR, the source voltage LOP of the sense transistor Tsen is set to the voltage LOP3. Similarly, since the read voltage AR corresponds to the first group G1, the source voltage LOP of the sense transistor Tsen is set to the voltage LOP1 in a read operation using the read voltage AR. As described above, LOP1>LOP2>LOP3 is satisfied.

As shown in FIG. 22, in a read operation, the sequencer 13 performs, for example, an operation of removing residual electrons in the channel during the period from time t0 to time t1. Moreover, the sequencer 13 performs a read process using the read voltage KR during the period from time t1 to time t4, performs a read process using the read voltage FR during the period from time t4 to time t7, performs a read process using the read voltage DR during the period from time t7 to time t10, and performs a read process using the read voltage AR during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage KR to the selected word line WLsel. This causes the voltage at the near end of the selected word line WLsel to drop to the read voltage KR, and causes the voltage at the far end of the selected word line WLsel to drop to the read voltage KR with a delay from the voltage at the near end of the selected word line WLsel.

Also, at time t1, the sequencer 13 sets the voltage of the control signal BLX to Vblx, and sets the voltage of the control signal BLC to Vblc. This causes the voltage of the bit line BL to vary according to the state of the selected memory cell while the read voltage KR is applied to the selected word line WLsel. Specifically, when the selected memory cell is in an on state, the voltage of the bit line BL coupled to the memory cell drops (on-cell of the bit line BL in FIG. 22). When the selected memory cell is in an off state, the voltage of the bit line BL coupled to the memory cell is maintained at the voltage based on Vblc-Vth (off-cell of the bit line BL in FIG. 22).

Also, at time t1, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL.

Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage KR, and stores the determination result in a latch circuit provided inside.

In the data determination of the selected memory cell, the sequencer 13 sets the source voltage LOP of the sense transistor Tsen to LOP2. Thereby, the precision in determination of data stored in the selected memory cell by the sense amplifier unit SAU is improved. Specifically, the sequencer 13 supplies a voltage LOP2 generated by the column driver 14b to the node of the voltage LOP, and applies a voltage LOP2 to the source of the sense transistor Tsen. Thereby, the threshold voltage of the sense transistor Tsen is adjusted according to the source voltage LOP2, namely, the conditions for transition to the on state or the off state of the sense transistor Tsen are adjusted, thus improving the precision in determining whether or not the threshold voltage of the selected memory cell is equal to or greater than the read voltage KR. This is the end of the read process using the read voltage KR.

Subsequently, at time t4, the row decoder module 15 applies the read voltage FR to the selected word line WLsel. This causes the voltage at the near end of the selected word line WLsel to drop to the read voltage FR, and causes the voltage at the far end of the selected word line WLsel to drop to the read voltage FR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage FR is applied to the selected word line WLsel. Specifically, when the selected memory cell is in an on state, the voltage of the bit line BL coupled to the memory cell drops (on-cell in FIG. 22) When the selected memory cell is in an off state, the voltage of the bit line BL coupled to the memory cell is maintained at the voltage based on Vblc-Vth (off-cell in FIG. 22).

At time t4, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage FR, and stores the determination result in a latch circuit provided inside.

In the data determination of the selected memory cell, the sequencer 13 sets the source voltage LOP of the sense transistor Tsen to LOP3. Thereby, the precision in determination of data stored in the selected memory cell by the sense amplifier unit SAU is improved. Specifically, the sequencer 13 supplies a voltage LOP3 generated by the column driver 14b to the node of the voltage LOP, and applies a voltage LOP3 to the source of the sense transistor Tsen. Thereby, the threshold voltage of the sense transistor Tsen is adjusted according to the source voltage LOP3, namely, the conditions for transition to the on state or the off state of the sense transistor Tsen are adjusted, thus improving the precision in determining whether or not the threshold voltage of the selected memory cell is equal to or greater than the read voltage FR. This is the end of the read process using the read voltage FR.

Subsequently, at time t7, the row decoder module 15 applies the read voltage DR to the selected word line WLsel. This causes the voltage at the near end of the selected word line WLsel to drop to the read voltage DR, and causes the voltage at the far end of the selected word line WLsel to drop to the read voltage DR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage DR is applied to the selected word line WLsel. Specifically, when the selected memory cell is in an on state, the voltage of the bit line BL coupled to the memory cell drops (on-cell in FIG. 22). When the selected memory cell is in an off state, the voltage of the bit line BL coupled to the memory cell is maintained at the voltage based on Vblc-Vth (off-cell in FIG. 22).

At time t7, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage DR, and stores the determination result in a latch circuit provided inside.

In the data determination of the selected memory cell, the sequencer 13 sets the source voltage LOP of the sense transistor Tsen to LOP2. Thereby, the precision in determination of data stored in the selected memory cell by the sense amplifier unit SAU is improved. Specifically, the sequencer 13 supplies a voltage LOP2 generated by the column driver 14*b* to the node of the voltage LOP, and applies a voltage LOP2 to the source of the sense transistor Tsen. Thereby, the threshold voltage of the sense transistor Tsen is adjusted according to the source voltage LOP2, namely, the conditions for transition to the on state or the off state of the sense transistor Tsen are adjusted, thus improving the precision in determining whether or not the threshold voltage of the selected memory cell is equal to or greater than the read voltage DR. This is the end of the read process using the read voltage DR.

Subsequently, at time t10, the row decoder module 15 applies the read voltage AR to the selected word line WLsel. This causes the voltage at the near end of the selected word line WLsel to drop to the read voltage AR, and causes the voltage at the far end of the selected word line WLsel to drop to the read voltage AR with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage AR is applied to the selected word line WLsel. Specifically, when the selected memory cell is in an on state, the voltage of the bit line BL coupled to the memory cell drops (on-cell in FIG. 22). When the selected memory cell is in an off state, the voltage of the bit line BL coupled to the memory cell is maintained at the voltage based on Vblc-Vth (off-cell in FIG. 22).

At time t10, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage AR, and stores the determination result in a latch circuit provided inside.

In the data determination of the selected memory cell, the sequencer 13 sets the source voltage LOP of the sense transistor Tsen to LOP1. Thereby, the precision in determination of data stored in the selected memory cell by the sense amplifier unit SAU is improved. Specifically, the sequencer 13 supplies a voltage LOP1 generated by the column driver 14*b* to the node of the voltage LOP, and applies a voltage LOP1 to the source of the sense transistor Tsen. Thereby, the threshold voltage of the sense transistor Tsen is adjusted according to the source voltage LOP1, namely, the conditions for transition to the on state or the off state of the sense transistor Tsen are adjusted, thus improving the precision in determining whether or not the threshold voltage of the selected memory cell is equal to or greater than the read voltage AR. This is the end of the read process using the read voltage AR.

Subsequently, at time t13, the sequencer 13 confirms the lower-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

Next, a read operation of the uppermost-page data will be described. FIG. 23 is a diagram showing an example of a timing chart in a read operation of the uppermost-page data according to the third embodiment.

In this example, the read voltages ER, JR, LR, and OR are used in a read operation of the uppermost-page data, and the read voltages are applied to the selected word line in the order of OR, LR, JR, and ER, similarly to the first embodiment.

The read voltage OR corresponds to the first group G1. Accordingly, in a read operation using the read voltage OR, the source voltage LOP of the sense transistor Tsen is set to the voltage LOP1. The read voltages LR and ER correspond to the second group G2. Accordingly, in a read operation using the read voltages LR and ER, the source voltage LOP of the sense transistor Tsen is set to the voltage LOP2. Similarly, since the read voltage JR corresponds to the third group G3, the source voltage LOP of the sense transistor Tsen is set to the voltage LOP3 in a read operation using the read voltage JR.

As shown in FIG. 23, in a read operation, the sequencer 13 performs, for example, an operation of removing residual electrons in the channel during the period from time t0 to time t1. Moreover, the sequencer 13 performs a read process using the read voltage OR during the period from time t1 to time t4, performs a read process using the read voltage LR during the period from time t4 to time t7, performs a read process using the read voltage JR during the period from time t7 to time t10, and performs a read process using the read voltage ER during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage OR to the selected word line WLsel. This causes the voltage at the near end of the selected word line WLsel to drop to the read voltage OR, and causes the voltage at the far end of the selected word line WLsel to drop to the read voltage OR with a delay from the voltage at the near end of the selected word line WLsel.

Also, at time t1, the sequencer 13 sets the voltage of the control signal BLX to Vblx, and sets the voltage of the control signal BLC to Vblc. This causes the voltage of the bit line BL to vary according to the state of the selected memory cell while the read voltage OR is applied to the selected word line WLsel. Specifically, when the selected memory cell is in an on state, the voltage of the bit line BL coupled to the memory cell drops (on-cell of the bit line BL in FIG. 23). When the selected memory cell is in an off state, the voltage of the bit line BL coupled to the memory cell is maintained at the voltage based on Vblc-Vth (off-cell of the bit line BL in FIG. 23).

Also, at time t1, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage OR, and stores the determination result in a latch circuit provided inside.

In the data determination of the selected memory cell, the sequencer 13 sets the source voltage LOP of the sense transistor Tsen to LOP1. Thereby, the precision in determination of data stored in the selected memory cell by the sense amplifier unit SAU is improved. Specifically, the sequencer 13 supplies a voltage LOP1 generated by the column driver 14*b* to the node of the voltage LOP, and applies a voltage LOP1 to the source of the sense transistor Tsen. Thereby, the threshold voltage of the sense transistor Tsen is adjusted according to the source voltage LOP1, namely, the conditions for transition to the on state or the off state of the sense transistor Tsen are adjusted, thus improving the precision in determining whether or not the threshold voltage of the selected memory cell is equal to or greater than the read voltage OR. This is the end of the read process using the read voltage OR.

Subsequently, at time t4, the row decoder module 15 applies the read voltage LR to the selected word line WLsel. This causes the voltage at the near end of the selected word line WLsel to drop to the read voltage LR, and causes the voltage at the far end of the selected word line WLsel to drop to the read voltage LR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage LR is applied to the selected word line WLsel. Specifically, when the selected memory cell is in an on state, the voltage of the bit line BL coupled to the memory cell drops (on-cell in FIG. 23). When the selected memory cell is in an off state, the voltage of the bit line BL coupled to the memory cell is maintained at the voltage based on Vblc-Vth (off-cell in FIG. 23).

At time t4, the sequencer 13 sets the voltages of the control signals LPC and BLQ to Vlpc and Vblq, respectively. Also, the sequencer 13 supplies a voltage VSENP1 generated by the column driver 14*b* to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1*o*. When the voltage of the bit line BL is in an off-cell state, the voltage of the sense node SEN coupled to the bit line BL drops to VSENP1*f*, which is higher than VSENP1*o*.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage LR, and stores the determination result in a latch circuit provided inside.

In the data determination of the selected memory cell, the sequencer 13 sets the source voltage LOP of the sense transistor Tsen to LOP2. Thereby, the precision in determination of data stored in the selected memory cell by the sense amplifier unit SAU is improved. Specifically, the sequencer 13 supplies a voltage LOP2 generated by the column driver 14b to the node of the voltage LOP, and applies a voltage LOP2 to the source of the sense transistor Tsen. Thereby, the threshold voltage of the sense transistor Tsen is adjusted according to the source voltage LOP2, namely, the conditions for transition to the on state or the off state of the sense transistor Tsen are adjusted, thus improving the precision in determining whether or not the threshold voltage of the selected memory cell is equal to or greater than the read voltage LR. This is the end of the read process using the read voltage LR.

Subsequently, at time t7, the row decoder module 15 applies the read voltage JR to the selected word line WLsel. This causes the voltage at the near end of the selected word line WLsel to drop to the read voltage JR, and causes the voltage at the far end of the selected word line WLsel to drop to the read voltage JR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage JR is applied to the selected word line WLsel. Specifically, when the selected memory cell is in an on state, the voltage of the bit line BL coupled to the memory cell drops (on-cell in FIG. 26). When the selected memory cell is in an off state, the voltage of the bit line BL coupled to the memory cell is maintained at the voltage based on Vblc-Vth (off-cell in FIG. 26).

At time t7, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage JR, and stores the determination result in a latch circuit provided inside.

In the data determination of the selected memory cell, the sequencer 13 sets the source voltage LOP of the sense transistor Tsen to LOP3. Thereby, the precision in determination of data stored in the selected memory cell by the sense amplifier unit SAU is improved. Specifically, the sequencer 13 supplies a voltage LOP3 generated by the column driver 14b to the node of the voltage LOP, and applies a voltage LOP3 to the source of the sense transistor Tsen. Thereby, the threshold voltage of the sense transistor Tsen is adjusted according to the source voltage LOP3, namely, the conditions for transition to the on state or the off state of the sense transistor Tsen are adjusted, thus improving the precision in determining whether or not the threshold voltage of the selected memory cell is equal to or greater than the read voltage JR. This is the end of the read process using the read voltage JR.

Subsequently, at time t10, the row decoder module 15 applies the read voltage ER to the selected word line WLsel. This causes the voltage at the near end of the selected word line WLsel to drop to the read voltage ER, and causes the voltage at the far end of the selected word line WLsel to drop to the read voltage ER with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage ER is applied to the selected word line WLsel. Specifically, when the selected memory cell is in an on state, the voltage of the bit line BL coupled to the memory cell drops (on-cell in FIG. 23). When the selected memory cell is in an off state, the voltage of the bit line BL coupled to the memory cell is maintained at the voltage based on Vblc-Vth (off-cell in FIG. 23).

At time t10, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage ER, and stores the determination result in a latch circuit provided inside.

In the data determination of the selected memory cell, the sequencer 13 sets the source voltage LOP of the sense transistor Tsen to LOP2. Thereby, the precision in determination of data stored in the selected memory cell by the sense amplifier unit SAU is improved. Specifically, the sequencer 13 supplies a voltage LOP2 generated by the column driver 14b to the node of the voltage LOP, and applies a voltage LOP2 to the source of the sense transistor Tsen. Thereby, the threshold voltage of the sense transistor Tsen is adjusted according to the source voltage LOP2, namely, the conditions for transition to the on state or the off state of the sense transistor Tsen are adjusted, thus improving the precision in determining whether or not the threshold voltage of the selected memory cell is equal to or greater than the read voltage ER. This is the end of the read process using the read voltage ER.

Subsequently, at time t13, the sequencer 13 confirms the uppermost-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

As described above, the semiconductor memory device 1 of the third embodiment is capable of performing a read operation of the lower-page data and the uppermost-page data. In a read operation of each of the middle-page data and the upper-page data, the semiconductor memory device 1 of the third embodiment is capable of performing a read operation by varying the source voltage LOP of the sense transistor Tsen according to the grouping shown in FIG. 21, similarly to the read operation of the lower-page data and the uppermost-page data.

3. 2 Advantageous Effect of Third Embodiment

The semiconductor memory device 1 according to the third embodiment is capable of improving reliability of the semiconductor memory device 1 in a read operation. Hereinafter, a description will be given of an advantageous effect of the semiconductor memory device 1 according to the third embodiment.

In a read operation, the semiconductor memory device 1 according to the third embodiment varies the source voltage LOP of the sense transistor Tsen in the sense amplifier unit SAU according to the group with which the read voltage is associated or the group to which the state distribution belongs. In other words, the voltage LOP of the source of the sense transistor Tsen is optimized according to the state of overlap of the threshold voltage distributions of two neighboring states, namely, the magnitude of the failed bit count.

Specifically, in the semiconductor memory device 1 according to the third embodiment, when, for example, a read voltage corresponding to a state distribution belonging to the first group G1 is used, the source voltage LOP of the sense transistor Tsen is set to LOP1. When a read voltage corresponding to a state distribution belonging to the second group G2 is used, the source voltage LOP of the sense transistor Tsen is set to LOP2. When a read voltage corresponding to a state distribution belonging to the third group G3 is used, the source voltage LOP of the sense transistor Tsen is set to LOP3.

It is thereby possible to suppress the upper-tail failed bit count TFBC or the lower-tail failed bit count BFBC in a read operation. Consequently, the semiconductor memory device 1 according to the third embodiment is capable of improving reliability in a read operation.

In the above-described third embodiment, the threshold voltage distributions of the states that the memory cell transistors MT are in are divided into three groups: first, second, and third groups; however, the configuration is not limited thereto, and the threshold voltage distributions may be divided into two groups or four or more groups, allowing the source voltage LOP of the sense transistor Tsen to be varied according to the group. For example, the source voltage LOP of the sense transistor Tsen may be varied according to the group by dividing the threshold voltage distributions into five groups, with the J-state to M-state distributions belonging to a fourth group instead of the second group G2, and the O-state and N-state distributions belonging to a fifth group instead of the first group G1.

A memory cell transistor MT included in the semiconductor memory device 1 may take either a fresh state in which neither a write operation nor an erase operation is performed (or a state in which the number of performances is equal to or smaller than a first number), or a run state in which a write operation and an erase operation are performed multiple times (or a state in which the number of performances is greater than the first number). The memory cell transistor MT may be configured in such a manner, for example, that, in the fresh state, the source voltage LOP of the sense transistor Tsen is set to the voltage LOP1, and, in the run state, the source voltage LOP of the sense transistor Tsen is set to a voltage different from the voltage LOP1. The memory cell transistor MT may be configured in such a manner, for example, that, in the fresh state, the source voltage LOP of the sense transistor Tsen is set to the voltage LOP1, and, in the run state, the source voltage LOP of the sense transistor Tsen is set to a higher or lower voltage than the voltage LOP1.

4. FOURTH EMBODIMENT

Next, a semiconductor memory device according to the fourth embodiment will be described. In a read operation, the semiconductor memory device 1 according to the fourth embodiment varies a well voltage SENW of a sense transistor Tsen based on the read voltage or the state of a read target. The well voltage SENW is a voltage of a well region in which the sense transistor Tsen is formed, namely, a voltage of a well region in which a channel of the sense transistor Tsen is formed.

The explanation of the fourth embodiment will focus mainly on the points that differ from the first embodiment. Configurations that will not be described below, such as the overall configuration, the circuit configuration, and the structure of the semiconductor memory device 1 are the same as those of the first embodiment.

4. 1 Operation of Semiconductor Memory Device 1

The read voltages AR, BR, CR, DR, ER, FR, GR, HR, IR, JR, KR, LR, MR, NR, and OR, which are used in a read operation, are classified into a plurality of groups, and a well voltage SENW of the sense transistor Tsen is set for each group.

FIG. 24 is a diagram showing a setting example of a well voltage SENW of the sense transistor Tsen in a read operation of the fourth embodiment. As shown in FIG. 24, the read voltages are categorized into, for example, three groups: a first group G1; a second group G2; and a third group G3, and the well voltage SENW of the sense transistor Tsen is set for each group. For the read voltages AR and OR belonging to the first group G1, the well voltage SENW of the sense transistor Tsen is set to the voltage SENW1. For the read voltages BR to ER and KR to NR belonging to the second group G2, the well voltage SENW of the sense transistor Tsen is set to a voltage SENW2. For the read voltages FR to JR belonging to the third group G3, the well voltage SENW of the sense transistor Tsen is set to the voltage SENW3.

The voltage SENW2 is higher than the voltage SENW1, and the voltage SENW3 is higher than the voltage SENW2. That is, the voltages SENW1, SENW2, and SENW3 have the following magnitude relationship: SENW1<SENW2<SENW3. The voltages SENW1, SENW2, and SENW3 are lower than the voltage VSS, and are, for example, negative voltages.

Figure 25:
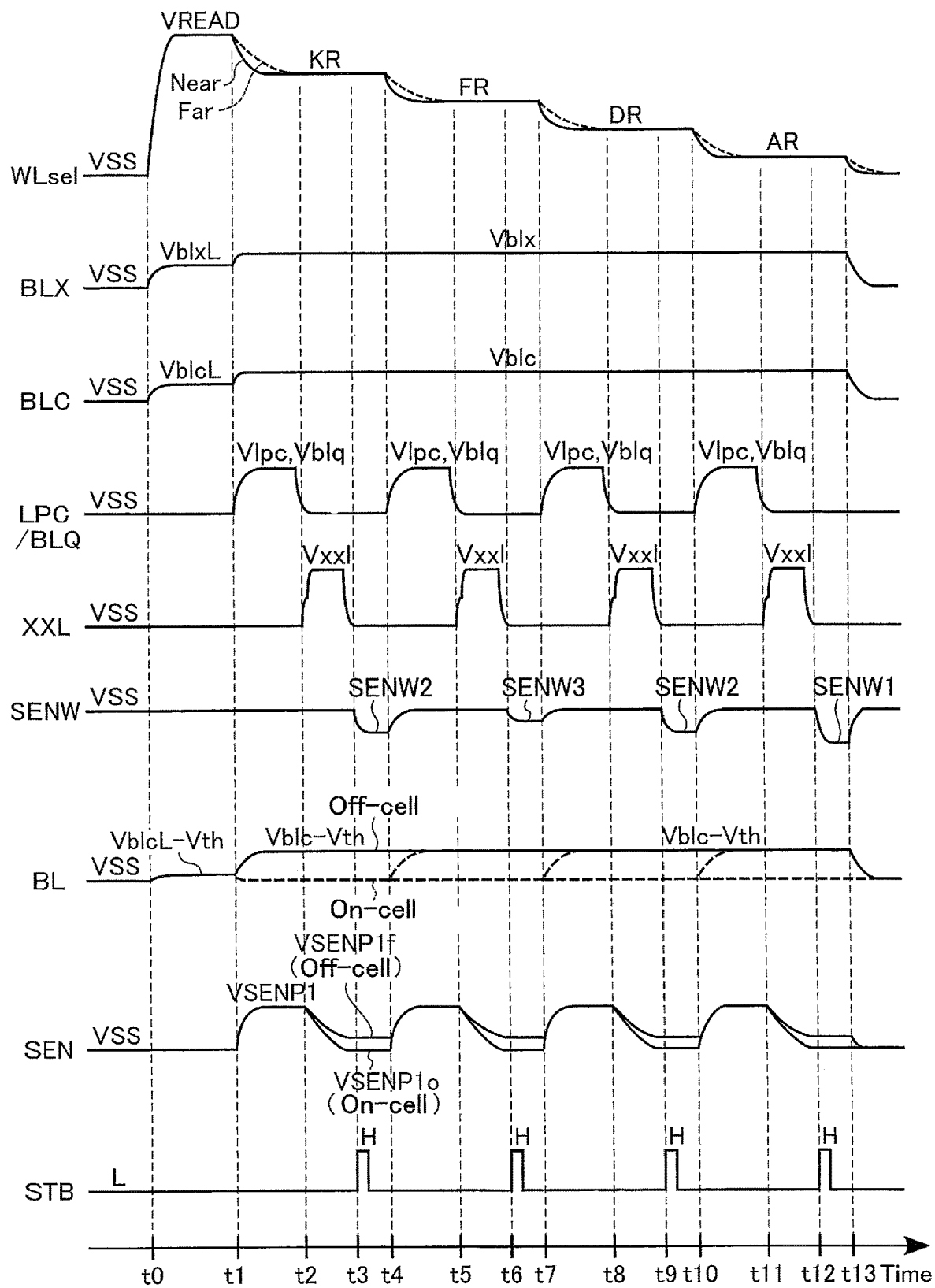
FIG. 25 is a diagram showing an example of a timing chart in a read operation of lower-page data according to the fourth embodiment.

Hereinafter, a concrete example of a read operation according to the fourth embodiment will be described by taking a read operation of the lower-page data and the uppermost-page data as an example. A read operation of the lower-page data will be described. FIG. 25 is a diagram showing an example of a timing chart in a read operation of the lower-page data according to the fourth embodiment.

In this example, the read voltages AR, DR, FR, and KR are used in a read operation of the lower-page data, and the read voltages are applied to the selected word line in the order of KR, FR, DR, and AR, similarly to the first embodiment.

The read voltages KR and DR correspond to the second group G2. Accordingly, in a read operation using the read voltages KR and DR, the well voltage SENW of the sense transistor Tsen is set to the voltage SENW2. The read voltage FR corresponds to the third group G3. Accordingly, in a read operation using the read voltage FR, the well voltage SENW of the sense transistor Tsen is set to the voltage SENW3. Similarly, since the read voltage AR corresponds to the first group G1, the well voltage SENW of the sense transistor Tsen is set to the voltage SENW1 in a read operation using the read voltage AR. As described above, SENW1<SENW2<SENW3 is satisfied.

As shown in FIG. 25, in a read operation, the sequencer 13 performs, for example, an operation of removing residual electrons in the channel during the period from time t0 to time t1. Moreover, the sequencer 13 performs a read process using the read voltage KR during the period from time t1 to time t4, performs a read process using the read voltage FR during the period from time t4 to time t7, performs a read process using the read voltage DR during the period from time t7 to time t10, and performs a read process using the read voltage AR during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage KR to the selected word line WLsel. This causes the voltage at the near end of the selected word line WLsel to drop to the read voltage KR, and causes the voltage at the far end of the selected word line WLsel to drop to the read voltage KR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage KR is applied to the selected word line WLsel. Specifically, when the selected memory cell is in an on state, the voltage of the bit line BL coupled to the memory cell drops (on-cell of the bit line BL in FIG. 25). When the selected memory cell is in an off state, the voltage of the bit line BL coupled to the memory cell is maintained at the voltage based on Vblc-Vth (off-cell of the bit line BL in FIG. 25).

At time t1, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node. SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage KR, and stores the determination result in a latch circuit provided inside.

In the data determination of the selected memory cell, the sequencer 13 sets the well voltage SENW of the sense transistor Tsen to SENW2. Thereby, the precision in determination of data stored in the selected memory cell by the sense amplifier unit SAU is improved. Specifically, the sequencer 13 applies a voltage SENW2 generated by the column driver 14b to the well region in which the sense transistor Tsen is formed. Thereby, the threshold voltage of the sense transistor Tsen is adjusted according to the well voltage SENW2 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage KR. This is the end of the read process using the read voltage KR.

Subsequently, at time t4, the row decoder module 15 applies a read voltage FR to the selected word line WLsel. This causes the voltage at the near end of the selected word line WLsel to drop to the read voltage FR, and causes the voltage at the far end of the selected word line WLsel to drop to the read voltage FR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage FR is applied to the selected word line WLsel. Specifically, when the selected memory cell is in an on state, the voltage of the bit line BL coupled to the memory cell drops (on-cell in FIG. 25). When the selected memory cell is in an off state, the voltage of the bit line BL coupled to the memory cell is maintained at the voltage based on Vblc-Vth (off-cell in FIG. 25)

At time t4, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage FR, and stores the determination result in a latch circuit provided inside.

In the data determination of the selected memory cell, the sequencer 13 sets the well voltage SENW of the sense transistor Tsen to SENW3. Thereby, the precision in determination of data stored in the selected memory cell by the sense amplifier unit SAU is improved. Specifically, the sequencer 13 applies a voltage SENW3 generated by the column driver 14b to the well region in which the sense transistor Tsen is formed. Thereby, the threshold voltage of the sense transistor Tsen is adjusted according to the well voltage SENW3 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage FR. This is the end of the read process using the read voltage FR.

Subsequently, at time t7, the row decoder module 15 applies a read voltage DR to the selected word line WLsel. This causes the voltage at the near end of the selected word line WLsel to drop to the read voltage DR, and causes the voltage at the far end of the selected word line WLsel to drop to the read voltage DR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage DR is applied to the selected word line WLsel. Specifically, when the selected memory cell is in an on state, the voltage of the bit line BL coupled to the memory cell drops (on-cell in FIG. 25). When the selected memory cell is in an off state, the voltage of the bit line BL coupled to the memory cell is maintained at the voltage based on Vblc-Vth (off-cell in FIG. 25).

At time t7, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage DR, and stores the determination result in a latch circuit provided inside.

In the data determination of the selected memory cell, the sequencer 13 sets the well voltage SENW of the sense transistor Tsen to SENW2. Thereby, the precision in determination of data stored in the selected memory cell by the sense amplifier unit SAU is improved. Specifically, the sequencer 13 applies a voltage SENW2 generated by the column driver 14b to the well region in which the sense transistor Tsen is formed. Thereby, the threshold voltage of the sense transistor Tsen is adjusted according to the well voltage SENW2 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage DR. This is the end of the read process using the read voltage DR.

Subsequently, at time t10, the row decoder module 15 applies a read voltage AR to the selected word line WLsel. This causes the voltage at the near end of the selected word line WLsel to drop to the read voltage AR, and causes the voltage at the far end of the selected word line WLsel to drop to the read voltage AR with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage AR is applied to the selected word line WLsel. Specifically, when the selected memory cell is in an on state, the voltage of the bit line BL coupled to the memory cell drops (on-cell in FIG. 25). When the selected memory cell is in an off state, the voltage of the bit line BL coupled to the memory cell is maintained at the voltage based on Vblc-Vth (off-cell in FIG. 25).

At time t10, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage AR, and stores the determination result in a latch circuit provided inside.

In the data determination of the selected memory cell, the sequencer 13 sets the well voltage SENW of the sense transistor Tsen to SENW1. Thereby, the precision in determination of data stored in the selected memory cell by the sense amplifier unit SAU is improved. Specifically, the sequencer 13 applies a voltage SENW1 generated by the column driver 14b to the well region in which the sense transistor Tsen is formed. Thereby, the threshold voltage of the sense transistor Tsen is adjusted according to the well voltage SENW1 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage AR. This is the end of the read process using the read voltage AR.

Subsequently, at time t13, the sequencer 13 confirms the lower-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

Figure 26:
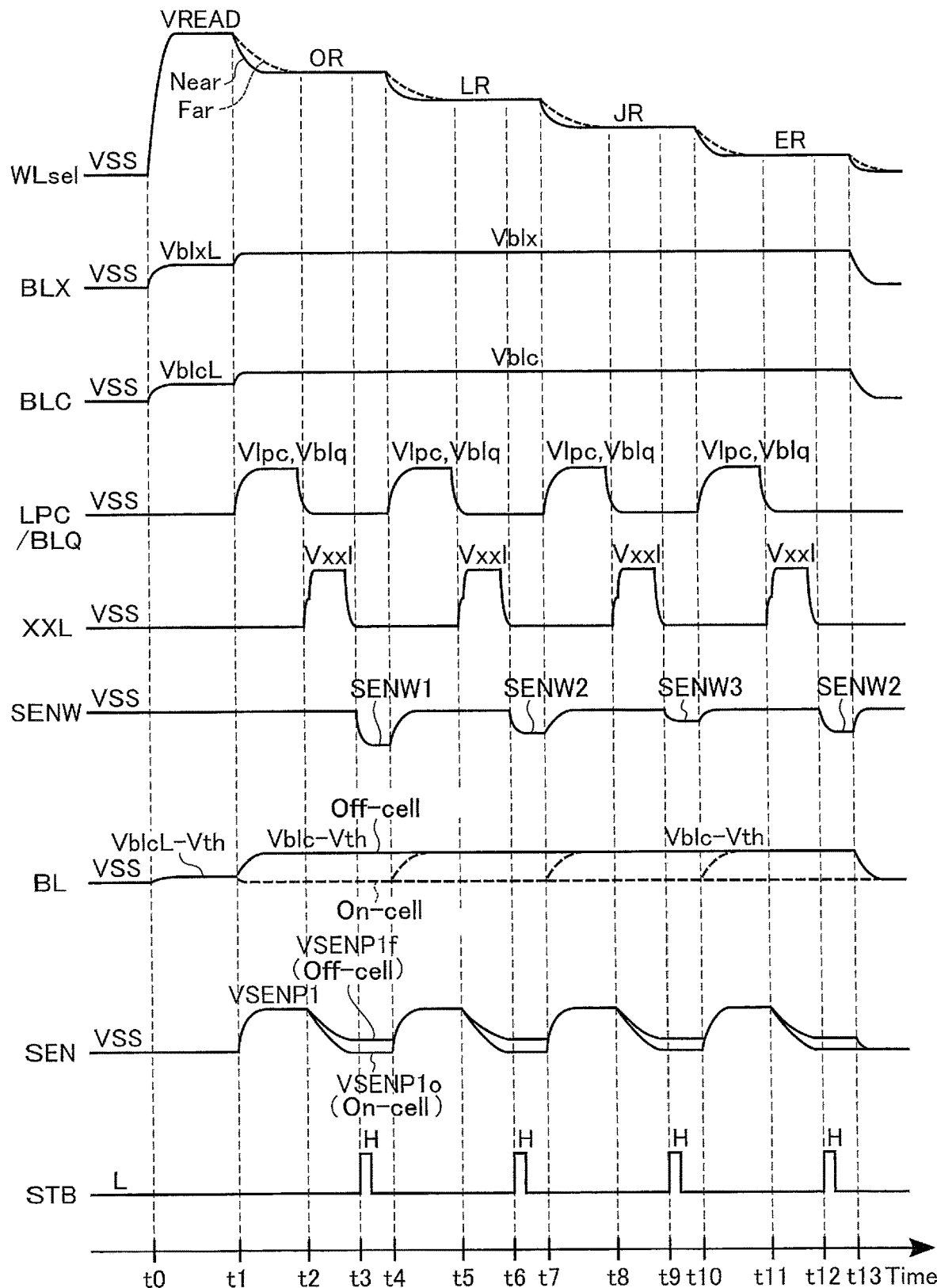
FIG. 26 is a diagram showing an example of a timing chart in a read operation of uppermost-page data according to the fourth embodiment.

Next, a read operation of the uppermost-page data will be described. FIG. 26 is a diagram showing an example of a timing chart in a read operation of the uppermost-page data according to the fourth embodiment.

In this example, the read voltages ER, JR, LR, and OR are used in a read operation of the uppermost-page data, and the read voltages are applied to the selected word line in the order of OR, LR, JR, and ER, similarly to the first embodiment.

The read voltage OR corresponds to the first group G1. Accordingly, in a read operation using the read voltage OR, the well voltage SENW of the sense transistor Tsen is set to the voltage SENW1. The read voltages LR and ER correspond to the second group G2. Accordingly, in a read operation using the read voltages LR and ER, the well voltage SENW of the sense transistor Tsen is set to the voltage SENW2. Similarly, since the read voltage JR corresponds to the third group G3, the well voltage SENW of the sense transistor Tsen is set to the voltage SENW3 in a read operation using the read voltage JR.

As shown in FIG. 26, in a read operation, the sequencer 13 performs, for example, an operation of removing residual electrons in the channel during the period from time t0 to time t1. Moreover, the sequencer 13 performs a read process using the read voltage OR during the period from time t1 to time t4, performs a read process using the read voltage LR during the period from time t4 to time t7, performs a read process using the read voltage JR during the period from time t7 to time t10, and performs a read process using the read voltage ER during the period from time t10 to time t13. Hereinafter, details of these operations will be described below.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage OR to the selected word line WLsel. This causes the voltage at the near end of the selected word line WLsel to drop to the read voltage OR, and causes the voltage at the far end of the selected word line WLsel to drop to the read voltage OR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage OR is applied to the selected word line WLsel. Specifically, when the selected memory cell is in an on state, the voltage of the bit line BL coupled to the memory cell drops (on-cell of the bit line BL in FIG. 26). When the selected memory cell is in an off state, the voltage of the bit line BL coupled to the memory cell is maintained at the voltage based on Vblc-Vth (off-cell of the bit line BL in FIG. 26).

At time t1, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether or not the threshold voltage of the selected memory cell is equal to or greater than the read voltage OR, and stores the determination result in a latch circuit provided inside.

In the data determination of the selected memory cell, the sequencer 13 sets the well voltage SENW of the sense transistor Tsen to SENW1. Thereby, the precision in determination of data stored in the selected memory cell by the sense amplifier unit SAU is improved. Specifically, the sequencer 13 applies a voltage SENW1 generated by the column driver 14b to the well region in which the sense transistor Tsen is formed. Thereby, the threshold voltage of the sense transistor Tsen is adjusted according to the well voltage SENW1 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage OR. This is the end of the read process using the read voltage OR.

Subsequently, at time t4, the row decoder module 15 applies a read voltage LR to the selected word line WLsel. This causes the voltage at the near end of the selected word line WLsel to drop to the read voltage LR, and causes the voltage at the far end of the selected word line WLsel to drop to the read voltage LR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage LR is applied to the selected word line WLsel. Specifically, when the selected memory cell is in an on state, the voltage of the bit line BL coupled to the memory cell drops (on-cell in FIG. 26). When the selected memory cell is in an off state, the voltage of the bit line BL coupled to the memory cell is maintained at the voltage based on Vblc-Vth (off-cell in FIG. 26).

At time t4, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether or not the threshold voltage of the selected memory cell is equal to or greater than the read voltage LR, and stores the determination result in a latch circuit provided inside.

In the data determination of the selected memory cell, the sequencer 13 sets the well voltage SENW of the sense transistor Tsen to SENW2. Thereby, the precision in determination of data stored in the selected memory cell by the sense amplifier unit SAU is improved. Specifically, the sequencer 13 applies a voltage SENW2 generated by the column driver 14b to the well region in which the sense transistor Tsen is formed. Thereby, the threshold voltage of the sense transistor Tsen is adjusted according to the well voltage SENW2 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage LR. This is the end of the read process using the read voltage LR.

Subsequently, at time t7, the row decoder module 15 applies a read voltage JR to the selected word line WLsel. This causes the voltage at the near end of the selected word line WLsel to drop to the read voltage JR, and causes the voltage at the far end of the selected word line WLsel to drop to the read voltage JR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage JR is applied to the selected word line WLsel. Specifically, when the selected memory cell is in an on state, the voltage of the bit line BL coupled to the memory cell drops (on-cell in FIG. 26). When the selected memory cell is in an off state, the voltage of the bit line BL coupled to the memory cell is maintained at the voltage based on Vblc-Vth (off-cell in FIG. 26).

At time t7, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether or not the threshold voltage of the selected memory cell is equal to or greater than the read voltage JR, and stores the determination result in a latch circuit provided inside.

In the data determination of the selected memory cell, the sequencer 13 sets the well voltage SENW of the sense transistor Tsen to SENW3. Thereby, the precision in determination of data stored in the selected memory cell by the sense amplifier unit SAU is improved. Specifically, the sequencer 13 applies a voltage SENW3 generated by the column driver 14b to the well region in which the sense transistor Tsen is formed. Thereby, the threshold voltage of the sense transistor Tsen is adjusted according to the well voltage SENW3 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage JR. This is the end of the read process using the read voltage JR.

Subsequently, at time t10, the row decoder module 15 applies a read voltage ER to the selected word line WLsel. This causes the voltage at the near end of the selected word line WLsel to drop to the read voltage ER, and causes the voltage at the far end of the selected word line WLsel to drop to the read voltage ER with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage ER is applied to the selected word line WLsel. Specifically, when the selected memory cell is in an on state, the voltage of the bit line BL coupled to the memory cell drops (on-cell in FIG. 26). When the selected memory cell is in an off state, the voltage of the bit line BL coupled to the memory cell is maintained at the voltage based on Vblc-Vth (off-cell in FIG. 26).

At time t10, the sequencer 13 sets the voltages of the control signals LPC and BLQ to Vlpc and Vblq, respectively. Also, the sequencer 13 supplies a voltage VSENP1 generated by the column driver 14b to a node of the power-supply voltage VDD. When the voltages of the control signals LPC and BLQ reach Vlpc and Vblq, respectively, the transistors 33 and Tblq are turned on, and the sense node SEN is charged to the voltage VSENP1. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VSENP1o. When the voltage of the bit line BL is in an off-cell state, the voltage of the sense node SEN coupled to the bit line BL drops to VSENP1f, which is higher than VSENP1o.

After the voltage of the bit line. BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether or not the threshold voltage of the selected memory cell is equal to or greater than the read voltage ER, and stores the determination result in a latch circuit provided inside.

In the data determination of the selected memory cell, the sequencer 13 sets the well voltage SENW of the sense transistor Tsen to SENW2. Thereby, the precision in determination of data stored in the selected memory cell by the sense amplifier unit SAU is improved. Specifically, the sequencer 13 applies a voltage SENW2 generated by the column driver 14b to the well region in which the sense transistor Tsen is formed. Thereby, the threshold voltage of the sense transistor Tsen is adjusted according to the well voltage SENW2 of the sense transistor Tsen, namely, the conditions for transition to the on state or the off state of the sense transistor Tsen are adjusted, thus improving the precision in determining whether or not the threshold voltage of the selected memory cell is equal to or greater than the read voltage ER. This is the end of the read process using the read voltage ER.

Subsequently, at time t13, the sequencer 13 confirms the uppermost-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

As described above, the semiconductor memory device 1 of the fourth embodiment is capable of performing a read operation of the lower-page data and the uppermost-page data. In a read operation of each of the middle-page data and the upper-page data, the semiconductor memory device 1 of the fourth embodiment is capable of performing a read operation by varying the well voltage SENW of the sense transistor Tsen according to the grouping shown in FIG. 24, similarly to the read operation of the lower-page data and the uppermost-page data.

4. 2 Advantageous Effect of Fourth Embodiment

The semiconductor memory device 1 according to the fourth embodiment is capable of improving reliability of the semiconductor memory device 1 in a read operation. Hereinafter, a description will be given of an advantageous effect of the semiconductor memory device 1 according to the fourth embodiment.

In a read operation, the semiconductor memory device 1 according to the fourth embodiment varies the well voltage SENW of the sense transistor Tsen in the sense amplifier unit SAU according to the group with which the read voltage is associated or the group to which the state distribution belongs. In other words, the well voltage SENW of the source of the sense transistor Tsen is optimized according to the state of overlap of the threshold voltage distributions of two neighboring states, namely, the magnitude of the failed bit count.

Specifically, in the semiconductor memory device 1 according to the fourth embodiment, when, for example, a read voltage corresponding to a state distribution belonging to the first group G1 is used, the well voltage SENW of the sense transistor Tsen is set to SENW1. When a read voltage corresponding to a state distribution belonging to the second group G2 is used, the well voltage SENW of the sense transistor Tsen is set to SENW2. When a read voltage corresponding to a state distribution belonging to the third group G3 is used, the well voltage SENW of the sense transistor Tsen is set to SENW3.

It is thereby possible to suppress the upper-tail failed bit count TFBC or the lower-tail failed bit count BFBC in a read operation. Consequently, the semiconductor memory device 1 according to the fourth embodiment is capable of improving reliability in a read operation.

In the above-described fourth embodiment, the threshold voltage distributions of the states that the memory cell transistors MT are in are divided into three groups: first, second, and third groups; however, the configuration is not limited thereto, and the threshold voltage distributions may be divided into two groups or four or more groups, allowing the well voltage SENW of the sense transistor Tsen to be varied according to the group. For example, the well voltage SENW of the sense transistor Tsen may be varied according to the group by dividing the threshold voltage distributions into five groups, with the J-state to M-state distributions belonging to a fourth group instead of the second group G2, and the O-state and N-state distributions belonging to a fifth group instead of the first group G1.

A memory cell transistor MT included in the semiconductor memory device 1 may take either a fresh state in which neither a write operation nor an erase operation is performed (or a state in which the number of performances is equal to or smaller than a first number), or a run state in which a write operation and an erase operation are performed multiple times (or a state in which the number of performances is greater than the first number). The memory cell transistor MT may be configured in such a manner, for example, that, in the fresh state, the well voltage SENW of the sense transistor Tsen is set to the voltage SENW1, and, in the run state, the well voltage SENW of the sense transistor Tsen is set to a voltage different from the voltage SENW1. The memory cell transistor MT may be configured in such a manner, for example, that, in the fresh state, the well voltage SENW of the sense transistor Tsen is set to the voltage SENW1, and, in the run state, the well voltage SENW of the sense transistor Tsen is set to a higher or lower voltage than the voltage SENW1.

5. FIFTH EMBODIMENT

Next, a description will be given of a semiconductor memory device according to a fifth embodiment. The fifth embodiment is a modification of the above-described first embodiment. In a read operation, the semiconductor memory device 1 according to the fifth embodiment varies an initial voltage VSENP of a sense node SEN in the sense amplifier unit SAU based on the read voltage or the state of a read target.

In the fifth embodiment, the description will focus mainly on features that are different from those of the first embodiment. Configurations that will not be described below, such as the overall configuration, the circuit configuration, and the structure of the semiconductor memory device 1 are the same as those of the first embodiment.

5.1 Operation of Semiconductor Memory Device 1

Figure 27:
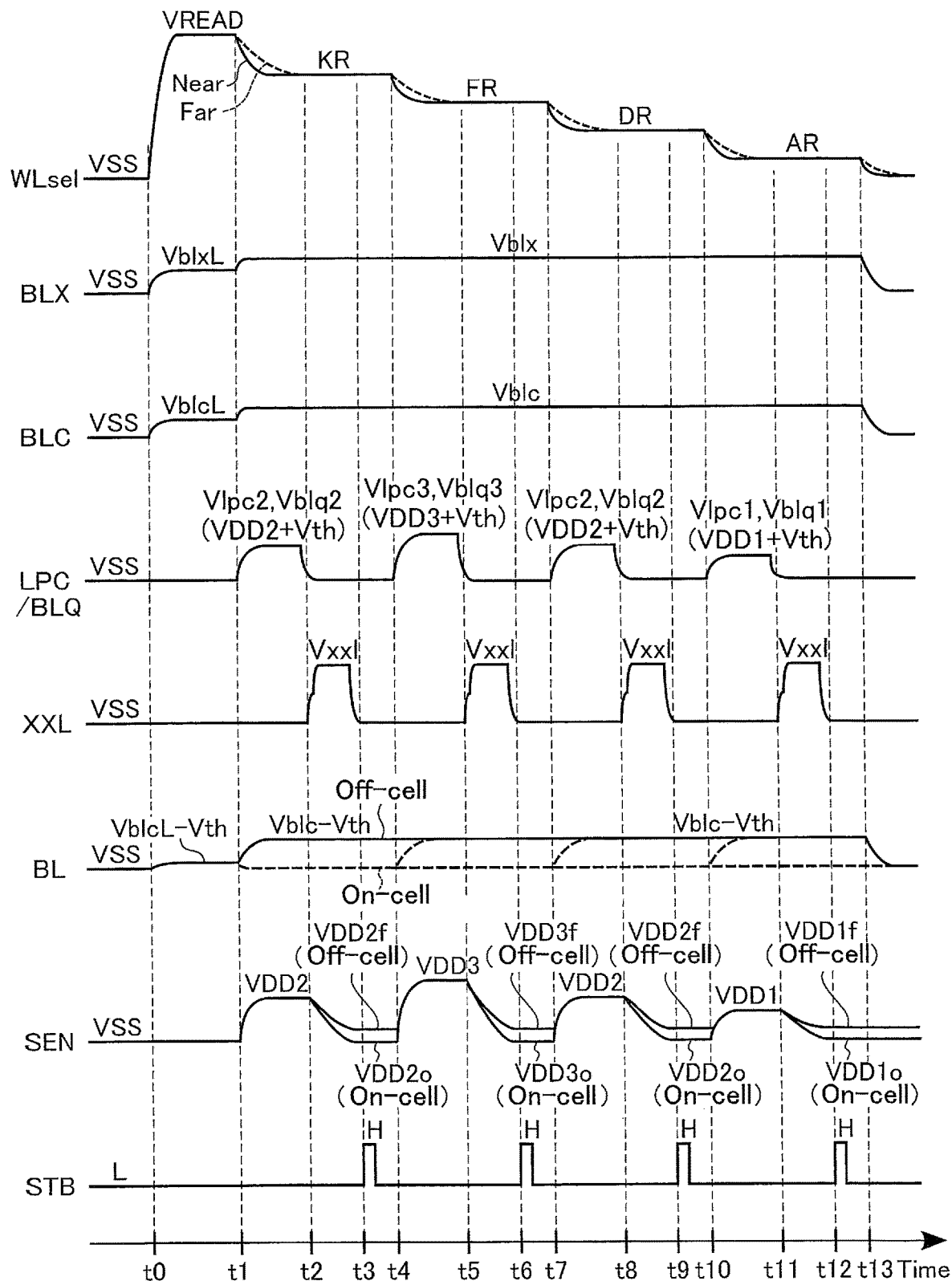
FIG. 27 is a diagram showing an example of a timing chart in a read operation of lower-page data according to a fifth embodiment.

A concrete example of a read operation according to the fifth embodiment will be described by taking a read operation of the lower-page data and the uppermost-page data as an example. A read operation of the lower-page data will be described. FIG. 27 is a diagram showing an example of a timing chart in a read operation of lower-page data according to the fifth embodiment.

In this example, the read voltages AR, DR, FR, and KR are used in a read operation of the lower-page data, and the read voltages are applied to the selected word line in the order of KR, FR, DR, and AR, similarly to the first embodiment.

Since the operation from the initial state prior to time t0 to time t1 is similar to the operation of the lower-page data shown in FIG. 14, the description thereof will be omitted, and the description will be given of the operation from time t1.

At time t1, the row decoder module 15 applies a read voltage KR to the selected word line WLsel. This causes the voltage at the near end of the selected word line WLsel to drop to the read voltage KR, and causes the voltage at the far end of the selected word line WLsel to drop to the read voltage KR with a delay from the voltage at the near end of the selected word line WLsel.

At time t1, the sequencer 13 sets the voltage of the control signal BLX to Vblx, and sets the voltage of the control signal BLC to Vblc. The voltage value of Vblc is lower than, for example, Vblx. This causes the voltage of the bit line BL to vary according to the state of the selected memory cell while the read voltage KR is applied to the selected word line WLsel. Specifically, when the selected memory cell is in an on state, the voltage of the bit line BL coupled to the memory cell drops (on-cell of the bit line BL in FIG. 27). When the selected memory cell is in an off state, the voltage of the bit line BL coupled to the memory cell is maintained at the voltage based on Vblc-Vth (off-cell of the bit line BL in FIG. 27).

At time t1, the sequencer 13 sets the voltages of the control signals LPC and BLQ to Vlpc2 and Vblq2, respectively. Vlpc2 corresponds to a sum of the voltage VDD2 and the threshold voltage Vth of the transistor 33. Vblq2 corresponds to a sum of the voltage VDD2 and the threshold voltage Vth of the transistor Tblq. Also, the sequencer 13 supplies a voltage VDD2 generated by the column driver 14b to a node of the power-supply voltage VDD. When the voltages of the control signals LPC and BLQ reach Vlpc2 and Vblq2, respectively, the transistors 33 and Tblq are turned on, and the sense node SEN is charged to the voltage VDD2. When charging of the sense node SEN is completed, the sequencer 13 drops the voltages of the control signals LPC and BLQ to VSS. To charge the sense node SEN to a voltage VDD2, the voltage of the control signal LPC may be set to Vlpc2, and the voltage of the control signal BLQ may be set to VDD. Reversely, the voltage of the control signal LPC may be set to VDD, and the voltage of the control signal BLQ may be set to Vblq2.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2$o$. When the voltage of the bit line BL is in an off-cell state, the voltage of the sense node SEN coupled to the bit line BL drops to VDD2$f$, which is higher than VDD2$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether the threshold voltage of the selected memory cell is equal to or greater than the read voltage KR, and stores the determination result in a latch circuit provided inside. This is the end of the read process using the read voltage KR.

Subsequently, at time t4, the row decoder module 15 applies the read voltage FR to the selected word line WLsel. This causes the voltage at the near end of the selected word line WLsel to drop to the read voltage FR, and causes the voltage at the far end of the selected word line WLsel to drop to the read voltage FR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage FR is applied to the selected word line WLsel. Specifically, when the selected memory cell is in an on state, the voltage of the bit line BL coupled to the memory cell drops (on-cell in FIG. 27). When the selected memory cell is in an off state, the voltage of the bit line BL coupled to the memory cell is maintained at the voltage based on Vblc-Vth (off-cell in FIG. 27).

At time t4, the sequencer 13 sets the voltages of the control signals LPC and BLQ to Vlpc3 and Vblq3, respectively. Vlpc3 corresponds to a sum of the voltage VDD3 and the threshold voltage Vth of the transistor 33. Vblq3 corresponds to a sum of the voltage VDD3 and the threshold voltage Vth of the transistor Tblq. Also, the sequencer 13 supplies a voltage VDD3 generated by the column driver 14$b$ to a node of the power-supply voltage VDD. When the voltages of the control signals LPC and BLQ reach Vlpc3 and Vblq3, respectively, the transistors 33 and Tblq are turned on, and the sense node SEN is charged to the voltage VDD3. When charging of the sense node SEN is completed, the sequencer 13 drops the voltages of the control signals LPC and BLQ to VSS. To charge the sense node SEN to a voltage VDD3, the voltage of the control signal LPC may be set to Vlpc3, and the voltage of the control signal BLQ may be set to VDD. Reversely, the voltage of the control signal LPC may be set to VDD, and the voltage of the control signal BLQ may be set to Vblq3.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD3$o$. When the voltage of the bit line BL is in an off-cell state, the voltage of the sense node SEN coupled to the bit line BL drops to VDD3$f$, which is higher than VDD3$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether the threshold voltage of the selected memory cell is equal to or greater than the read voltage FR, and stores the determination result in a latch circuit provided inside. This is the end of the read process using the read voltage FR.

Subsequently, at time t7, the row decoder module 15 applies the read voltage DR to the selected word line WLsel. This causes the voltage at the near end of the selected word line WLsel to drop to the read voltage DR, and causes the voltage at the far end of the selected word line WLsel to drop to the read voltage DR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage DR is applied to the selected word line WLsel. Specifically, when the selected memory cell is in an on state, the voltage of the bit line BL coupled to the memory cell drops (on-cell in FIG. 27). When the selected memory cell is in an off state, the voltage of the bit line BL coupled to the memory cell is maintained at the voltage based on Vblc-Vth (off-cell in FIG. 27).

At time t7, the sequencer 13 sets the voltages of the control signals LPC and BLQ to Vlpc2 and Vblq2, respectively. Also, the sequencer 13 supplies a voltage VDD2 generated by the column driver 14$b$ to a node of the power-supply voltage VDD. When the voltages of the control signals LPC and BLQ reach Vlpc2 and Vblq2, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2$o$. When the voltage of the bit line BL is in an off-cell state, the voltage of the sense node SEN coupled to the bit line BL drops to VDD2$f$, which is higher than VDD2$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether the threshold voltage of the selected memory cell is equal to or greater than the read voltage DR, and stores the determination result in a latch circuit provided inside. This is the end of the read process using the read voltage DR.

Subsequently, at time t10, the row decoder module 15 applies the read voltage AR to the selected word line WLsel. This causes the voltage at the near end of the selected word line WLsel to drop to the read voltage AR, and causes the voltage at the far end of the selected word line WLsel to drop to the read voltage AR with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage AR is applied to the selected word line WLsel. Specifically, when the selected memory cell is in an on state, the voltage of the bit line BL coupled to the memory cell drops (on-cell in FIG. 27). When the selected memory cell is in an off state, the voltage of the bit line BL coupled to the memory cell is maintained at the voltage based on Vblc-Vth (off-cell in FIG. 27).

At time t10, the sequencer 13 sets the voltages of the control signals LPC and BLQ to Vlpc1 and Vblq1, respectively. Vlpc1 corresponds to a sum of the voltage VDD1 and the threshold voltage Vth of the transistor 33. Vblq1 corresponds to a sum of the voltage VDD1 and the threshold voltage Vth of the transistor Tblq. Also, the sequencer 13 supplies a voltage VDD1 generated by the column driver 14b to a node of the power-supply voltage VDD. When the voltages of the control signals LPC and BLQ reach Vlpc1 and Vblq1, respectively, the transistors 33 and Tblq are turned on, and the sense node SEN is charged to the voltage VDD1. When charging of the sense node SEN is completed, the sequencer 13 drops the voltages of the control signals LPC and BLQ to VSS. To charge the sense node SEN to a voltage VDD1, the voltage of the control signal LPC may be set to Vlpc1, and the voltage of the control signal BLQ may be set to VDD. Reversely, the voltage of the control signal LPC may be set to VDD, and the voltage of the control signal BLQ may be set to Vblq1.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD1o. When the voltage of the bit line BL is in an off-cell state, the voltage of the sense node SEN coupled to the bit line BL drops to VDD1f, which is higher than VDD1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether the threshold voltage of the selected memory cell is equal to or greater than the read voltage AR, and stores the determination result in a latch circuit provided inside. This is the end of the read process using the read voltage AR.

Subsequently, at time t13, the sequencer 13 confirms the lower-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

Figure 28:
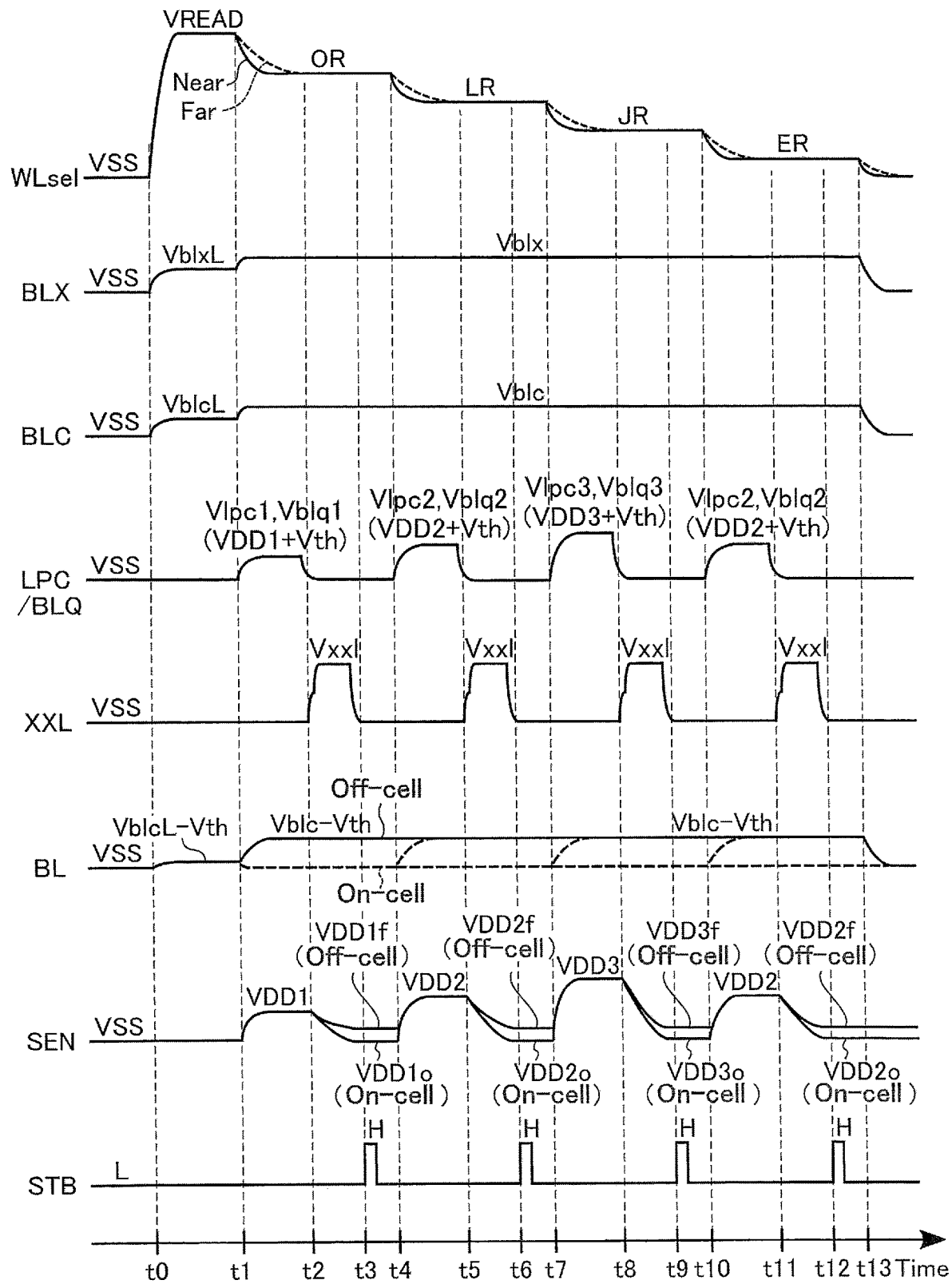
FIG. 28 is a diagram showing an example of a timing chart in a read operation of uppermost-page data according to the fifth embodiment.

Next, a read operation of the uppermost-page data will be described. FIG. 28 is a diagram showing an example of a timing chart in a read operation of the uppermost-page data according to the fifth embodiment.

Since the operation from the initial state prior to time t0 to time t1 is similar to the above-described operation of the lower-page data, the description thereof will be omitted, and the description will be given of the operation from time t1.

At time t1, the row decoder module 15 applies a read voltage OR to the selected word line WLsel. This causes the voltage at the near end of the selected word line WLsel to drop to the read voltage OR, and causes the voltage at the far end of the selected word line WLsel to drop to the read voltage OR with a delay from the voltage at the near end of the selected word line WLsel.

At time t1, the sequencer 13 sets the voltage of the control signal BLX to Vblx, and sets the voltage of the control signal BLC to Vblc. This causes the voltage of the bit line BL to vary according to the state of the selected memory cell while the read voltage OR is applied to the selected word line WLsel. Specifically, when the selected memory cell is in an on state, the voltage of the bit line BL coupled to the memory cell drops (on-cell of the bit line BL in FIG. 28). When the selected memory cell is in an off state, the voltage of the bit line BL coupled to the memory cell is maintained at the voltage based on Vblc-Vth (off-cell of the bit line BL in FIG. 28).

At time t1, the sequencer 13 sets the voltages of the control signals LPC and BLQ to Vlpc1 and Vblq1, respectively. Also, the sequencer 13 supplies a voltage VDD1 generated by the column driver 14b to a node of the power-supply voltage VDD. When the voltages of the control signals LPC and BLQ reach Vlpc1 and Vblq1, respectively, the transistors 33 and Tblq are turned on, and the sense node SEN is charged to the voltage VDD1. When charging of the sense node SEN is completed, the sequencer 13 drops the voltages of the control signals LPC and BLQ to VSS.

Subsequently, at time t2, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD1o. When the voltage of the bit line BL is in an off-cell state, the voltage of the sense node SEN coupled to the bit line BL drops to VDD1f, which is higher than VDD1o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t3, the sequencer 13 asserts a control signal STB, and determines data stored in the selected memory cell. Specifically, the sense amplifier unit SAU determines whether the threshold voltage of the selected memory cell is equal to or greater than the read voltage OR, and stores the determination result in a latch circuit provided inside. This is the end of the read process using the read voltage OR.

Subsequently, at time t4, the row decoder module 15 applies the read voltage LR to the selected word line WLsel. This causes the voltage at the near end of the selected word line WLsel to drop to the read voltage LR, and causes the voltage at the far end of the selected word line WLsel to drop to the read voltage LR with a delay from the voltage at the near end of the selected word line WLsel.

At time t4, the sequencer 13 maintains the voltage of the control signal BLX at Vblx, and maintains the voltage of the control signal BLC at Vblc. This causes the voltage of the bit line BL to vary according to the state of the selected memory cell while the read voltage LR is applied to the selected word line WLsel. Specifically, when the selected memory cell is in an on state, the voltage of the bit line BL coupled to the memory cell drops (on-cell in FIG. 28). When the selected memory cell is in an off state, the voltage of the bit line BL coupled to the memory cell is maintained at the voltage based on Vblc-Vth (off-cell in FIG. 28).

At time t4, the sequencer 13 sets the voltages of the control signals LPC and BLQ to Vlpc2 and Vblq2, respectively. Also, the sequencer 13 supplies a voltage VDD2 generated by the column driver 14b to a node of the power-supply voltage VDD. When the voltages of the control signals LPC and BLQ reach Vlpc2 and Vblq2, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t5, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2o. When the voltage of the bit line BL is in an off-cell state, the voltage of the sense node SEN coupled to the bit line BL drops to VDD2f, which is higher than VDD2o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t6, the sequencer 13 asserts a control signal STB, and determines data stored in the selected memory cell. Specifically, the sense amplifier unit SAU determines whether the threshold voltage of the selected memory cell is equal to or greater than the read voltage LR, and stores the determination result in a latch circuit provided inside. This is the end of the read process using the read voltage LR.

Subsequently, at time t7, the row decoder module 15 applies the read voltage JR to the selected word line WLsel. This causes the voltage at the near end of the selected word line WLsel to drop to the read voltage JR, and causes the voltage at the far end of the selected word line WLsel to drop to the read voltage JR with a delay from the voltage at the near end of the selected word line WLsel.

At time t7, the sequencer 13 maintains the voltage of the control signal BLX at Vblx, and maintains the voltage of the control signal BLC at Vblc. This causes the voltage of the bit line BL to vary according to the state of the selected memory cell while the read voltage JR is applied to the selected word line WLsel. Specifically, when the selected memory cell is in an on state, the voltage of the bit line BL coupled to the memory cell drops (on-cell in FIG. 28). When the selected memory cell is in an off state, the voltage of the bit line BL coupled to the memory cell is maintained at the voltage based on Vblc-Vth (off-cell in FIG. 28).

At time t7, the sequencer 13 sets the voltages of the control signals LPC and BLQ to Vlpc3 and Vblq3, respectively. Also, the sequencer 13 supplies a voltage VDD3 generated by the column driver 14b to a node of the power-supply voltage VDD. When the voltages of the control signals LPC and BLQ reach Vlpc3 and Vblq3, respectively, the transistors 33 and Tblq are turned on, and the sense node SEN is charged to the voltage VDD3. When charging of the sense node SEN is completed, the sequencer 13 drops the voltages of the control signals LPC and BLQ to VSS.

Subsequently, at time t8, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD3o. When the voltage of the bit line BL is in an off-cell state, the voltage of the sense node SEN coupled to the bit line BL drops to VDD3f, which is higher than VDD3o.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t9, the sequencer 13 asserts a control signal STB, and determines data stored in the selected memory cell. Specifically, the sense amplifier unit SAU determines whether the threshold voltage of the selected memory cell is equal to or greater than the read voltage JR, and stores the determination result in a latch circuit provided inside. This is the end of the read process using the read voltage JR.

Subsequently, at time t10, the row decoder module 15 applies the read voltage ER to the selected word line WLsel. This causes the voltage at the near end of the selected word line WLsel to drop to the read voltage ER, and causes the voltage at the far end of the selected word line WLsel to drop to the read voltage ER with a delay from the voltage at the near end of the selected word line WLsel.

At time t10, the sequencer 13 maintains the voltage of the control signal BLX at Vblx, and maintains the voltage of the control signal BLC at Vblc. This causes the voltage of the bit line BL to vary according to the state of the selected memory cell while the read voltage ER is applied to the selected word line WLsel. Specifically, when the selected memory cell is in an on state, the voltage of the bit line BL coupled to the memory cell drops (on-cell in FIG. 28). When the selected memory cell is in an off state, the voltage of the bit line BL coupled to the memory cell is maintained at the voltage based on Vblc-Vth (off-cell in FIG. 28)

At time t10, the sequencer 13 sets the voltages of the control signals LPC and BLQ to Vlpc2 and Vblq2, respectively. Also, the sequencer 13 supplies a voltage VDD2 generated by the column driver 14b to a node of the power-supply voltage VDD. When the voltages of the control signals LPC and BLQ reach Vlpc2 and Vblq2, respectively, the transistors 33 and Tblq are turned on, and the sense node SEN is charged to the voltage VDD2. When charging of the sense node SEN is completed, the sequencer 13 drops the voltages of the control signals LPC and BLQ to VSS.

Subsequently, at time t11, the sequencer 13 increases the voltage of the control signal XXL from VSS to Vxxl. When the voltage of the control signal XXL increases to Vxxl, the transistor Txxl is turned on, and the voltage of the sense node SEN varies according to the voltage of the bit line BL. Specifically, when the voltage of the bit line BL is in an on-cell state, the voltage of the sense node SEN coupled to the bit line BL drops to VDD2$o$. When the voltage of the bit line BL is in an off-cell state, the voltage of the sense node SEN coupled to the bit line BL drops to VDD2$f$, which is higher than VDD2$o$.

After the voltage of the bit line BL is reflected in the sense node SEN, the sequencer 13 drops the voltage of the control signal XXL from Vxxl to VSS. When the voltage of the control signal XXL drops to VSS, the transistor Txxl is turned off, and the voltage of the sense node SEN is fixed.

Thereafter, at time t12, the sequencer 13 asserts a control signal STB, and determines data stored in the selected memory cell. Specifically, the sense amplifier unit SAU determines whether the threshold voltage of the selected memory cell is equal to or greater than the read voltage ER, and stores the determination result in a latch circuit provided inside. This is the end of the read process using the read voltage ER.

Subsequently, at time t13, the sequencer 13 confirms the uppermost-page data based on data stored in a latch circuit in each sense amplifier unit SAU. Thereafter, the sequencer 13 returns the voltages of the selected word line WLsel and the control signals BLX, BLC, LPC, BLQ, and XXL to a state prior to a read operation, and ends the read operation.

As described above, the semiconductor memory device 1 of the fifth embodiment is capable of performing a read operation of the lower-page data and the uppermost-page data. In a read operation of each of the middle-page data and the upper-page data, the semiconductor memory device 1 of the fifth embodiment is capable of performing a read operation by varying the initial voltage VSENP of the sense node SEN according to the grouping shown in FIG. 13, similarly to the read operation of the lower-page data and the uppermost-page data.

5. 2. Advantageous Effects of Fifth Embodiment

The semiconductor memory device 1 according to the fifth embodiment is capable of improving reliability of the semiconductor memory device 1 in a read operation. The details of the advantageous effects of the semiconductor memory device 1 of the fifth embodiment are the same as those of the first embodiment.

6. OTHER MODIFICATIONS, ETC

The configurations described in the above-described first to fifth embodiments may be suitably combined. That is, the configuration of the first embodiment may be combined with one or more configurations of the second to fifth embodiments. For example, the configuration of varying the initial voltage VSENP of the sense node SEN according to the first or fifth embodiment may be combined with one or more of: the configuration of varying the discharge time tSEN of the sense node SEN according to the second embodiment; the configuration of varying the voltage LOP of the source of the sense transistor Tsen according to the third embodiment; and the configuration of varying the well voltage SENW of the sense transistor Tsen according to the fourth embodiment.

Moreover, in the above-described embodiment, an example has been described of a NAND flash memory as a semiconductor memory device; however, the embodiment is not limited to a NAND flash memory, and is applicable to other semiconductor memories in general. Furthermore, the present embodiment is applicable to various memory devices other than a semiconductor memory. The above-described overall configuration, circuit configuration, structures, voltages, etc. are merely examples; the configurations, structures, and voltages are not limited to those described above, and may be suitably varied.

The embodiments described above are presented merely as examples and are not intended to restrict the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

What is claimed is:

1. A semiconductor memory device comprising:
a memory cell;
a word line electrically coupled to a gate of the memory cell;
a bit line electrically coupled to one end of the memory cell;
a sense amplifier coupled to the bit line, the sense amplifier including a first transistor and a second transistor, the first transistor including a first gate electrically coupled to the bit line and the second transistor coupled to a first end of the first transistor; and
a driver configured to apply a voltage to the first gate of the first transistor,
wherein, in a read operation, the driver varies a voltage to be applied to the first gate of the first transistor based on a read voltage applied to the word line.

2. The semiconductor memory device according to claim 1, wherein
the memory cell belongs to one of a plurality of states corresponding to different threshold voltages, and
the driver varies a voltage to be applied to the first gate of the first transistor based on the state to which the memory cell belongs.

3. The semiconductor memory device according to claim 1, wherein
the memory cell belongs to one of a plurality of states corresponding to different threshold voltages, and the states are divided into a first group and a second group, and
the driver varies a voltage to be applied to the first gate of the first transistor based on which of the first group and the second group the memory cell belongs to.

4. The semiconductor memory device according to claim 1, wherein
the memory cell takes either (i) a first state in which a number of performances of a write operation and an erase operation is equal to or less than a first number, or (ii) a second state in which a number of performances of the write operation and the erase operation is greater than the first number,
when the memory cell is in the first state, the driver applies a first voltage to the first gate of the first transistor, and
when the memory cell is in the second state, the driver applies a second voltage different from the first voltage to the first gate of the first transistor.

5. The semiconductor memory device according to claim 4, wherein the second voltage is either a higher voltage than the first voltage or a lower voltage than the first voltage.

6. A semiconductor memory device comprising:
a memory cell;
a word line electrically coupled to a gate of the memory cell;
a bit line electrically coupled to one end of the memory cell;
a sense amplifier coupled to the bit line, the sense amplifier including a first transistor, a second transistor, and a third transistor, the first transistor including a first end electrically coupled to the bit line, the second transistor including a gate electrically coupled to a second end of the first transistor, and the third transistor coupled to a first end of the second transistor; and
a control circuit configured to supply a control signal to a first gate of the first transistor,
wherein, in a read operation, the control circuit varies a period during which the control signal supplied to the first gate of the first transistor is asserted based on a read voltage applied to the word line.

7. The semiconductor memory device according to claim 1, further comprising
a memory string including the memory cell and a select transistor,
wherein the select transistor is coupled between the memory cell and the bit line.

8. The semiconductor memory device according to claim 1, wherein
the sense amplifier includes a third transistor, a fourth transistor, and a fifth transistor,
the first gate of the first transistor is electrically coupled to the bit line via the third transistor, the fourth transistor, and the fifth transistor.

9. The semiconductor memory device according to claim 8, wherein the driver does not vary voltages to be applied to gates of the second transistor, the third transistor, and the fourth transistor in the read operation.

10. The semiconductor memory device according to claim 6, wherein
the memory cell belongs to one of a plurality of states corresponding to different threshold voltages, and
the control circuit varies a period during which the control signal to be supplied to the first transistor is asserted based on the state to which the memory cell belongs.

11. The semiconductor memory device according to claim 6, wherein
the memory cell belongs to one of a plurality of states corresponding to different threshold voltages, and the states are divided into a first group and a second group, and
the driver varies a period during which the control signal to be supplied to the first gate of the first transistor is asserted based on which of the first group and the second group the memory cell belongs to.

12. The semiconductor memory device according to claim 6, wherein
the memory cell takes either (i) a first state in which a number of performances of a write operation and an erase operation is equal to or less than a first number, or (ii) a second state in which a number of performances of the write operation and the erase operation is greater than the first number,
when the memory cell is in the first state, the driver sets the period during which the control signal to be supplied to the first gate of the first transistor is asserted to a first period, and
when the memory cell is in the second state, the driver sets the period during which the control signal to be supplied to the first gate of the first transistor is asserted to a second period different from the first period.

13. The semiconductor memory device according to claim 12, wherein the second period is either a longer period than the first period or a shorter period than the first period.

14. A semiconductor memory device comprising:
a memory cell;
a word line electrically coupled to a gate of the memory cell;
a bit line electrically coupled to one end of the memory cell;
a sense amplifier coupled to the bit line, the sense amplifier including a first transistor and a second transistor, the first transistor including a gate electrically coupled to the bit line and the second transistor coupled to a first end of the first transistor; and
a driver configured to apply a voltage to a second end of the first transistor,
wherein, in a read operation, the driver varies a voltage to be applied to the second end of the first transistor based on a read voltage applied to the word line.

15. The semiconductor memory device according to claim 14, wherein
the memory cell belongs to one of a plurality of states corresponding to different threshold voltages, and
the driver varies a voltage to be applied to the second end of the first transistor based on the state to which the memory cell belongs.

16. The semiconductor memory device according to claim 14, wherein
the memory cell belongs to one of a plurality of states corresponding to different threshold voltages, and the states are divided into a first group and a second group, and
the driver varies a voltage to be applied to the second end of the first transistor based on which of the first group and the second group the memory cell belongs to.

17. The semiconductor memory device according to claim 14, wherein
the memory cell takes either (i) a first state in which a number of performances of a write operation and an erase operation is equal to or less than a first number, or (ii) a second state in which a number of performances of the write operation and the erase operation is greater than the first number,
when the memory cell is in the first state, the driver applies a first voltage to the second end of the first transistor, and
when the memory cell is in the second state, the driver applies a second voltage different from the first voltage to the second end of the first transistor.

18. The semiconductor memory device according to claim 17, wherein the second voltage is either a higher voltage than the first voltage or a lower voltage than the first voltage.

19. A semiconductor memory device comprising:
a memory cell;
a word line electrically coupled to a gate of the memory cell;
a bit line electrically coupled to one end of the memory cell;

a sense amplifier coupled to the bit line, the sense amplifier including a first transistor and a second transistor, the first transistor including a gate electrically coupled to the bit line and the second transistor coupled to a first end of the first transistor; and a driver configured to apply a voltage to a region in which a channel of the first transistor is to be formed, wherein, in a read operation, the driver varies a voltage to be applied to the region in which the channel of the first transistor is to be formed based on a read voltage applied to the word line.

20. The semiconductor memory device according to claim 19, wherein the memory cell belongs to one of a plurality of states corresponding to different threshold voltages, and the driver varies a voltage to be applied to the region in which the channel of the first transistor is to be formed based on the state to which the memory cell belongs.

21. The semiconductor memory device according to claim 19, wherein the memory cell belongs to one of a plurality of states corresponding to different threshold voltages, and the states are divided into a first group and a second group, and the driver varies a voltage to be applied to the region in which a channel of the first transistor is to be formed based on which of the first group and the second group the memory cell belongs to.

22. The semiconductor memory device according to claim 19, wherein the memory cell takes either (i) a first state in which a number of performances of a write operation and an erase operation is equal to or less than a first number, or (ii) a second state in which a number of performances of the write operation and the erase operation is greater than the first number, when the memory cell is in the first state, the driver applies a first voltage to the region in which a channel of the first transistor is to be formed, and when the memory cell is in the second state, the driver applies a second voltage different from the first voltage to the region in which a channel of the first transistor is to be formed.

23. The semiconductor memory device according to claim 22, wherein the second voltage is either a higher voltage than the first voltage or a lower voltage than the first voltage.

* * * * *